US006919579B2

(12) United States Patent
Amin et al.

(10) Patent No.: US 6,919,579 B2
(45) Date of Patent: Jul. 19, 2005

(54) QUANTUM BIT WITH A MULTI-TERMINAL JUNCTION AND LOOP WITH A PHASE SHIFT

(75) Inventors: Mohammad H. S. Amin, Vancouver (CA); Timothy Duty, Vancouver (CA); Alexander Omelyanchouk, Khaira (UA); Geordie Rose, Vancouver (CA); Alexandre Zagoskin, Vancouver (CA); Alexandre Blais, Sherbrooke (CA)

(73) Assignee: D-Wave Systems, Inc., Vancouver (CA)

( * ) Notice: Subject to any disclaimer, the term of this patent is extended or adjusted under 35 U.S.C. 154(b) by 715 days.

(21) Appl. No.: 09/839,637

(22) Filed: Apr. 20, 2001

(65) Prior Publication Data

US 2002/0117656 A1 Aug. 29, 2002

(51) Int. Cl.⁷ ............................................. H01L 39/22
(52) U.S. Cl. .................... 257/31; 257/9; 257/34; 257/32; 257/33; 257/200; 257/663
(58) Field of Search ............................ 257/9, 31, 34, 257/663, 200, 32, 33

(56) References Cited

U.S. PATENT DOCUMENTS

| | | | |
|---|---|---|---|
| 5,153,171 A | * 10/1992 | Smith et al. ................. | 505/210 |
| 5,917,322 A | 6/1999 | Gershenfeld et al. ....... | 324/307 |
| 6,459,097 B1 | 10/2002 | Zagoskin | |
| 6,495,854 B1 | 12/2002 | Newns | |
| 6,504,172 B2 | 1/2003 | Zagoskin et al. | |
| 6,690,162 B1 | * 2/2004 | Schopohl et al. ........... | 324/248 |
| 2002/0117738 A1 | 8/2002 | Amin et al. | |
| 2002/0121636 A1 | 9/2002 | Amin et al. | |
| 2003/0027724 A1 | 2/2003 | Rose et al. | |
| 2003/0098455 A1 | 5/2003 | Amin et al. | |

FOREIGN PATENT DOCUMENTS

WO    WO 02/086813 A2    10/2002

OTHER PUBLICATIONS

IDS Ref BF, de Bruyn Ouboter et al.*
IDS Ref A05, Makhlin et al.*
B.J. Vleeming, F.J.C. van Bemmelen, M.R. Berends, R. de Bruyn Ouboter, and A.N. Omelyanchouk, "Measurements of the flux, embraced by the ring of a four–terminal SQUID, as a function of the external magnetic flux and the applied transport current", *Physica B,* vol. 262, pp. 296–305 (1999).
Alexandre Blain and Alexandre M. Zagoskin, "Operation of Universal Gates in a Solid–State Quantum Computer Based on Clean Josephson Junctions Between D–Wave Superconductors", *Physical Review A,* vol. 61, pp. 042308-1–042308-4, 2000.

(Continued)

*Primary Examiner*—Nathan J. Flynn
*Assistant Examiner*—Scott R Wilson
(74) *Attorney, Agent, or Firm*—Jones Day; Brett Lovejoy

(57) ABSTRACT

A solid-state quantum computing qubit includes a multi-terminal junction coupled to a superconducting loop where the superconducting loop introduces a phase shift to the superconducting order parameter. The ground state of the supercurrent in the superconducting loop and multi-terminal junction is doubly degenerate, with two supercurrent ground states having distinct magnetic moments. These quantum states of the supercurrents in the superconducting loop create qubits for quantum computing. The quantum states can be initialized by applying transport currents to the external leads. Arbitrary single qubit operations may be performed by varying the transport current and/or an externally applied magnetic field. Read-out may be performed using direct measurement of the magnetic moment of the qubit state, or alternatively, radio-frequency single electron transistor electrometers can be used as read-out devices when determining a result of the quantum computing. Further, qubits as described above can form arrays of qubits for performing controlled quantum computing calculations. In one example, an array of qubits can be utilized as a random number generator.

93 Claims, 39 Drawing Sheets

OTHER PUBLICATIONS

Pieter Jonker ahd Jie Han, "On Quantum & Classical Computing with Arrays of Superconducting Persistent Current Qubits", *Proceedings Fifth IEEE International Workshop on Computer Architectures for Machine Perception*, Padova Italy, pp. 69–78, Sep. 11–13, 2000.

G. Blatter, V.B. Geshkenbein, A.L. Fauchère, M.V. Feigel'man, and L.B. Ioffe., "Quantum Computing with Superconducting Phase Qubits", Physica C, vol. 352, pp. 105–109.

Yuriy Makhlin, Gerd Schön, and Alexander Shnirman, "Nano–Electronic Circuits as Quantum.Bits", *IEEE International Symposium on Circuits and Systems*, May 28–31, 2000, Geneva Switzerland, pp. II–241–II–244.

Blatter, G. et al., "Design aspects of superconducting–phase quantum bits", *The American Physical Society* (2001) vol. 63, pp. 174511–1 to 174511–9.

Briegel, H.–J. et al., "Quantum repeaters for communication" (1998), pp. 1–8.

Bruder, C. et al., "Tunnel junctions of unconventional superconductors", *The American Physical Society* (1995) vol. 51, pp. 904–907.

Chrestin, A. et al., "Evidence for a proximity–induced energy gap in Nb/INAs/Nb junctions", *The American Physical Society* (1997) vol. 55, pp. 8457–8465.

Dana, A. et al., "Electrostatic force spectroscopy of a single InAs quantum dot" (2001), pp. 1–5.

Feynman, R., "Simulating Physics with Computers", *International Journal of Theoretical Physics* (1982) vol. 21, pp. 467–488.

Grover, L., "A fast quantum mechanical algorithm for database search", pp. 1–8.

Havel, T. et al., "Principles and demonstrations of quantum information processing by NMR spectroscopy" (1999), pp. 1–42.

Jacobs, A. et al., "Proximity Effect, Andreev Reflections, and Charge Transport in Mesoscopic Superconducting–Semiconducting Heterostructures" (1998) eight pages.

Jones, J. et al., "Implementation of a quantum search algorithm on a quantum computer", *Nature* (1998) vol. 393, pp. 344–346.

Joyez, P. et al., "Observation of Parity–Induced Suppression of Jospehson Tunneling in the Superconducting Single Electron Transistor", *The American Physical Society* (1994) vol. 72, pp. 2458–2461.

Kitaev, A., "Quantum measurements and the Abelian Stabilizer Problem" (1995) pp. 1–22.

Knill, E. et al., "Resilient Quantum Computation", *Science* (1998) vol. 279, pp. 342–345.

Korotkov, A. et al., "Charge sensitivity of radio frequency single–electron transistor", *American Institute of Physics* (1999) vol. 74, pp. 4052–4054.

Lachenmann, S. et al., "Charge transport in superconductor/semiconductor/normal–conductor step junctions", *The American Physical Society* (1997) vol. 56, pp. 108–115.

Mooij, J. et al., "Josephson Persistent–Current Qubit", *Science* (1999) vol. 285, pp. 1036–1039.

Nakamura, Y. et al., "Coherent control of macroscopic quantum states in a single–Cooper–pair box", *Nature* (1999), vol. 398, pp. 786–788.

Omelyanchouk, A. et al., "Ballistic Four–Terminal Josephson Junction: Bistable States and Magnetic Flux Transfer" (1999) pp. 1–11 with six pages of drawings.

Ouboter, R. et al., "Macroscopic quantum interference effects in superconducting multiterminal microstructures", *Academic Press* (1999) vol. 25, pp. 1005–1017.

Ryazanov, V. et al., "Coupling of Two superconductors through a ferromagnet: evidence for a η junction"(2000) pp. 1–6.

Schoelkopf, R. et al., "The Radio–Frequency Single–Electron Transistor (RF–SET): A Fast and Ultrasensitive Electrometer", *Science* (1998), vol. 280, pp. 1238–1242.

Schulz, R. et al., "Design and realization of an all d–wave dc η–superconducting quantum interference device",*American Institute of Physics* (2000), vol. 76, pp. 912–914.

Shor, P., "Introduction to Quantum Algorithms" (2000) pp. 1–23.

Shor, P., "Polynomial–Time Algorithms For Prime Factorization and Discrete Logarithms On A Quantum Computer", pp. 1–26.

Shor, P., "Polynomial–Time Algorithms For Prime Factorization And Discrete Logarithms On A Quantum Computer", *Society for Industrial and Applied Mathematics* (1997) vol. 26, pp. 1484–1509.

Tafuri, F. et al., "Feasibility of biepitaxial $YBa_2Cu_3O_{7-x}$Josephson junctions for fundamental studies and potential circuit implementation", *The American Physical Society* (2000) vol. 62, pp. 431–438.

Vandersypen, L. et al., "Experimental Realization of an Order–Finding Algorithm with an NMR Quantum Computer", *The American Physical Society* (2000) vol. 25, pp. 5452–5455.

Vleeming, B., "The Four–terminal SQUID", pp. 1–100.

Volkov, A. et al., "Phase–coherent effects in multiterminal superconductor/normal metal mesoscopic structures" (2000), pp. 1–6.

Ye, P. et al., "High Magnetic Field Microwave Conductivity of 2D Electrons in an Array of Antidots" (2001), pp. 1–4.

R. de Bruyn Ouboter, A.N. Omelyanchouk, and E.D. Vol, "Multi–terminal SQUID controlled by the transport current", *Physica* B, vol. 205, pp. 153–162 (1995).

R. de Bruyn Ouboter and A.N. Omelyanchouk, "Four–terminal SQUID: Magnetic Flux Switching in Bistable State and Noise", *Physica* B, vol. 254, pp. 134–140 (1998).

R. de Bruyn Ouboter, A.N. Omelyanchouk, and E.D. Vol, "Dynamical properties of the Josephson multiterminals in an applied magnetic field", *Physica* B, vol. 239, pp. 203–215 (1997).

R.de Bruyn Ouboter, A.N. Omelyanchouk, and E.D. Vol. "Magnetic flux locking in two weakly coupled superconducting rings", ArXiv.org: cond–mat/9805174, pp. 1–10 (1998), website last accessed on Jan. 16, 2002.

Gianni Blatter, Vadim B. Geshkenbein, and Lev B. Ioffe, "Design aspects of superconducting–phase quantum bits", *Physial Review* B, vol. 63, 174511, pp. 1–9 (2001).

H.–J. Briegel, W. DüR. J.I. Cirac, and P. Zoller, "Quantum repeaters for communication", ArXiv.org: quant–ph/9803056, pp. 1–8 (1998).

C. Bruder, A. van Otterlo, and G. T. Zimanyi "Tunnel junctions of uncoventional superconductors", *Physical Review* B, vol. 51, pp. 12904–12907 (1995).

A. Chrestin, T. Matsuyama, and U. Merkt, "Evidence for a proximity–induced energy gap in Nb/InAs/Nb junctions", *Physical Review* B, vol. 55, pp. 8457–8465 (1997).

Aykutlu Dâna, Charles, Santori, and Yoshihisa Yamamoto, "Electrostatic force spectroscopy of a single InAs quantum dot", ArXiv.org: cond–mat/0103125, pp. 1–5 (2001).

R. Feynman, "Simulating Physics with Computers", *International Journal of Theoretical Physics*, vol. 21, pp. 467–488 (1982).

Lov K. Grover, "A fast quantum mechanical algorithm for database search", ArXiv.org: quant–ph/9605043, pp. 1–8 (1996).

T.F. Havel. S.S. Somaroo, C.–H. Tseng, and D. G. Cory, "Principles and demonstrations of quantum information processing by NMR spectroscopy", ArXiv.org: quant–ph/9812086, pp. 1–42 (1998).

Arne Jacobs, Reiner Kümel, and Hartmut Plehn, "Proximity Effect, Andreev Reflections, and Charge Transport in Mesoscopic Superconducting–Semiconducting Heterostructures", ArXiv.org: cond–mat/9810343, pp. 1–8, (1998).

Jonathan A. Jones, Michele Mosca, and Rasmus H. Hansen, "Implementation of a quantum scarch algorithm on a quantum computer", *Nature*, vol. 393, pp. 344–346 (1998).

P. Joyez, P. Lafarge, A. Filipe, D. Esteve, and M.H. Devoret, "Observation of Parity–Induced Suppression of Jospehson Tunneling in the superconducting Single Electron Transistor", *Physical Review Letters*, vol. 72, pp. 2458–2461 (1994).

A. Yu.Kitaev, "Quantum measurements and the Abelian Stabilizer Problem", ArXiv.org: quant–ph/9511026, pp. 1–22 (1995).

Emanuel Knill, Raymond Laflamme, and Wojciech H. Zurek, "Resilient Quantum Computation", *Science*, vol. 279, pp. 342–345 (1998).

Alexander N. Korotkov and Mikko A. Paalanen, "Charge sensitivity of radio frequency single–electron transistor", *Applied Physics Letters*, vol. 74, pp. 4052–4054 (1999).

S. G Lachenmann, I. Freidrich, A. Förster, D. Uhlisch, and A. A. Golubov, "Charge transport in superconductor/semiconductor/normal–conductor step junctions", *Physical Review* B, vol. 56, pp. 108–115 (1997).

J.E. Mooij, T.P. Orlando, L. Levitov, L. Tian, C.H. van der Wal, and S. Lloyd, "Josephson Persistent–Current Qubit", *Science*, vol. 285, pp. 1036–1039 (1999).

Y. Nakamura, Yu. A. Pashkin, and J.S. Tsai, "Coherent control of macroscopic quantum states in a single–Cooper–pair box,", *Nature*, vol. 398, pp. 786–788 (1999).

A.N. Omelyanchouk and Malek Zareyan, "Ballistic Four–Terminal Josephson Junction: Bistable States and Magnetic Flux Transfer", ArXiv.org: cond–mat/9905139, pp. 1–17 (1999).

R. de Bruyn Ouboter and A. N. Omelyanchouk "Macroscopic quantum interference effects in superconducting multiterminal microstructures", *Superlattices and Microstructures*, vol. 25, pp. 1005–1017 (1999).

V. V. Ryazanov, V.A. Oboznov, A. Yu. Rusanov, A. V. Veretennikov, A.A. Golubov, and J. Aarts, "Coupling of two superconductors through a ferromagnet: evidence for a π–junction", ArXiv.org:cond–mat/0008364, pp. 1–6 (2000).

R.J. Schelkopf, P. Wahlgren, A. A. Kozhevnikov, P. Delsing, and D. E. Prober, "The Radio–Frequencey Single–Electron Transitor (RF–SET): A Fast and Ultrasensitive Electrometer", *Science*, vol. 280, pp. 1238–1242 (1998).

R. R. Schulz, B. Chesca, B. Goetz, C. W. Schneider, A. Schmehl, H. Bielefeldt, H. Hilgenkamp, J. Mannhart, and C. C. Tsuei, "Design and realization of an all d–wave dc π–superconducting quantum interference device", *Applied Physics Letters*, vol. 76, pp. 912–914 (2000).

P. Shor, "Introduction to Quantum Algorithms" ArXiv.org: quant–ph/0005003, pp. 1–23 (2000).

P. Shor, "Polynomial–Time Algorithms For Prime Factorization And Discrete Logarithms On A Quantum Computer", ArXiv.org: quant–ph/9508027, pp. 1–26 (1995).

P. Shor, "Polynomial–Time Algorithms For Prime Factorization And Discrete Logarithms On A Quantum Computer", SIAM *Journal of Scientific and Statistical Computing*, vol. 26, pp. 1484–1509 (1997).

F. Tafuri, F. Carillo, F. Lombardi, F. Miletto Granozio, F. Ricci, U. Scotti di Uccio, A. Barone, G. Testa, E. Sarnelli, and J. R. Kirtley, "Feasibility of biepitaxial $YBa_2 Cu_3 O_{7-x}$ Josephson junctions for fundamental studies and potential circuit implementation", *Physical Review* B, vol. 62, pp. 431–438 (2000).

L. M. K. Vandersypen, M. Steffen, G. Breyta, C. S. Yannoni, R. Cleve, and I.L. Chuang, "Experimental Realization of an Order–finding algorithm with an NMR Quantum Computer", *Physical Review Letters*, vol. 25, pp. 5452–5455 (2000).

B. Vleeming, "The Four–terminal SQUID", PhD. Dissertation Leiden University, pp. 1–100 (1998).

A.F. Volkov, and R. Seviour, "Phase coherent effects in multiterminal superconductor/normal metal mesoscopic structures", ArXiv.org: cond–mat/0003370, pp. 1–6 (2000).

P. D. Ye, L. W. Engle, D. C. Tsui, J. A. Simmons, J. R. Wendt, G. A. Vawter, and J. L. Reno, "High Magnetic Field Microwave Conductivity of 2D Electrons in an Array of Antidots", ArXiv.org: cond–mat/0103127, pp. 1–4 (2001).

J.P Heide, B.J. van Wees, T.M. Klapwijk, and G. Borghs, "Nonlocal supercurrent in mesoscopic Josephson junctions", *Physical Review* B, vol. 57, pp. R5618–R5621 (1998).

J. P. Heida, B. J. van Wees, T. M. Klapwijk, and G. Borghs, "Critical currents in ballistic two–dimensional InAs–based superconducting weak links", *Physical Review* b, vol. 60, pp. 13135–13138 (1999).

Lev B. Ioffe, Vadim B. Geshkenbein, Mikhail V. Feigel'man, Alban L. Fauchère, and Gianni Blatter, "Environmentally decoupled sds–wave Josephson junctions for quantum computing", *Nature*, vol. 398, pp. 679–681 (1999).

Urs Ledermann, Alban L. Fauchère,and Gianni Blatter, "Nonlocality in mesoscopic Josephson junctions with strip geometry", *Physical Review* B, vol. 59, pp. R9027–R9030 (1999).

K.K. Likharev, "Superconducting weak links", *Reviews of Modern Physics*, vol. 51, pp. 101, 102, 146–147 (1979).

Y. Makhlin, G. Schön, and A. Shnirman, "Quantum–State Engineering with Josephson–Junction Devices", *Reviews of Modern Physics*, vol. 73, pp. 357–400 (2001).

P. Samuelsson, Å. Ingerman, V.S. Shumeiko, and G. Wendin, "Nonequilibrium Josephson current in ballistic multiterminal SNS–junctions", ArXiv.org: cond–mat/0005141, pp. 1–12 (2000), website last accessed Jan. 30, 2003.

Qing–feng Sun, Jian Wang, and Tsung–han Lin, "Control of the supercurrent in a mesoscopic four–terminal Josephson junction", *Physical Review* B, vol. 62, pp. 648–660 (2000).

D.A. Wollman, D.J. Van Harlingen, J. Giapintzakis, and D.M. Ginsberg, "Evidence for $d_{x^2-y^2}$ Pairing from the Magnetic Field Modulation of $YBA_2Cu_3O_7$–Pb Josephson Junctions", *Physical Review Letters,* vol. 74, pp. 797–800 (1995).

Malek Zareyan and A.N. Omelyanchouk, "Coherent Current States In Mesoscopic Four–Terminal Josephson Junction", ArXiv.org: cond–mat/9811113, pp. 1–17 (1998).

* cited by examiner

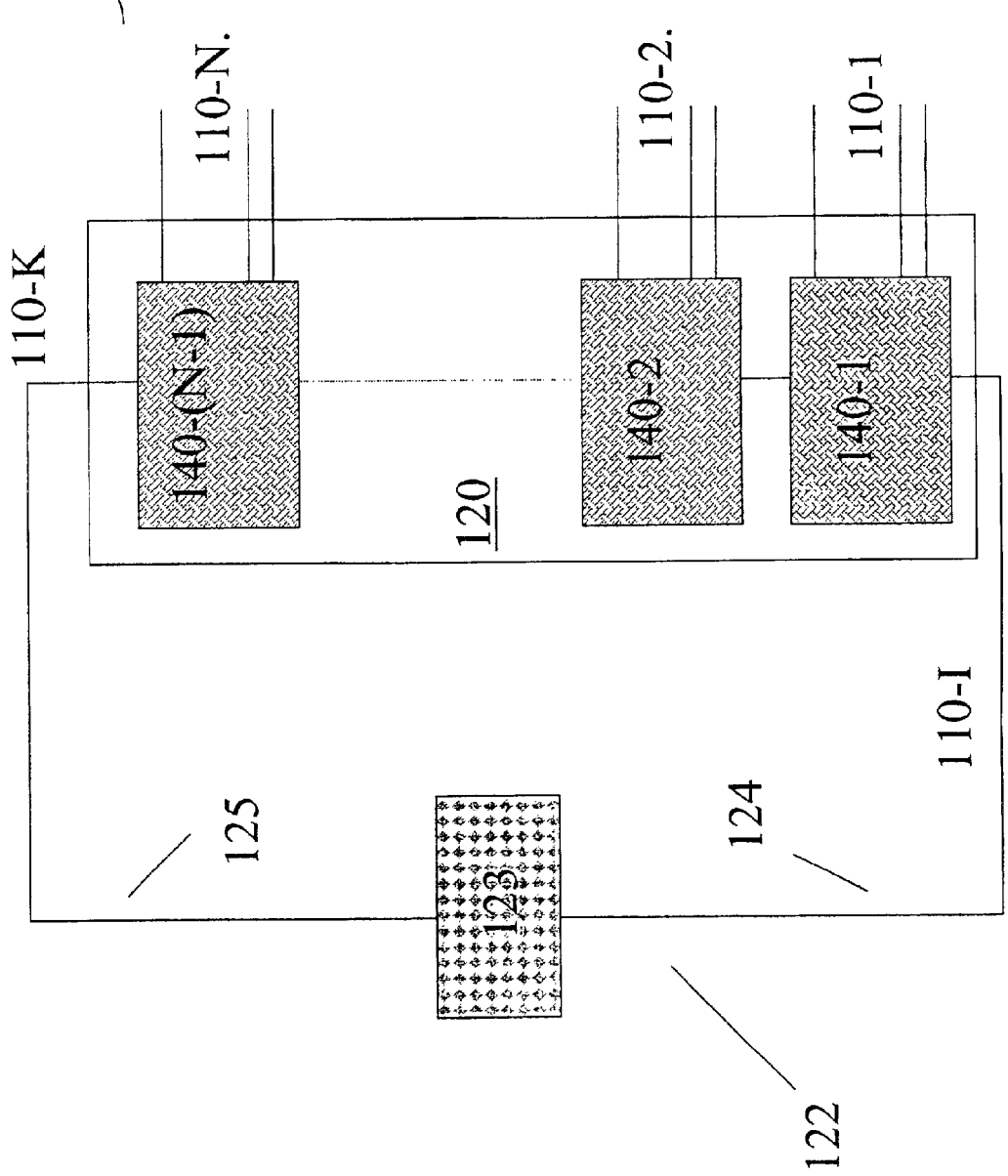

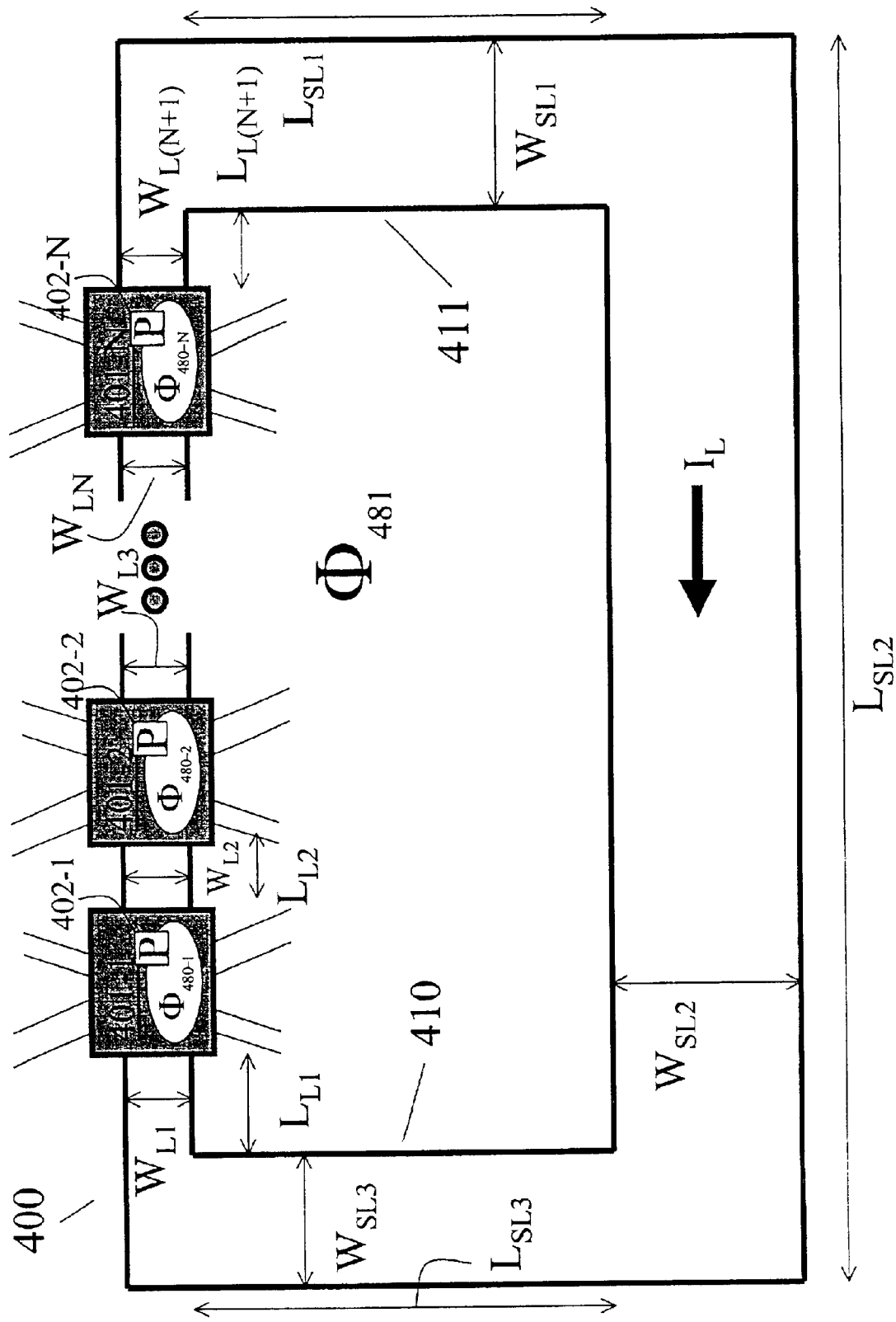

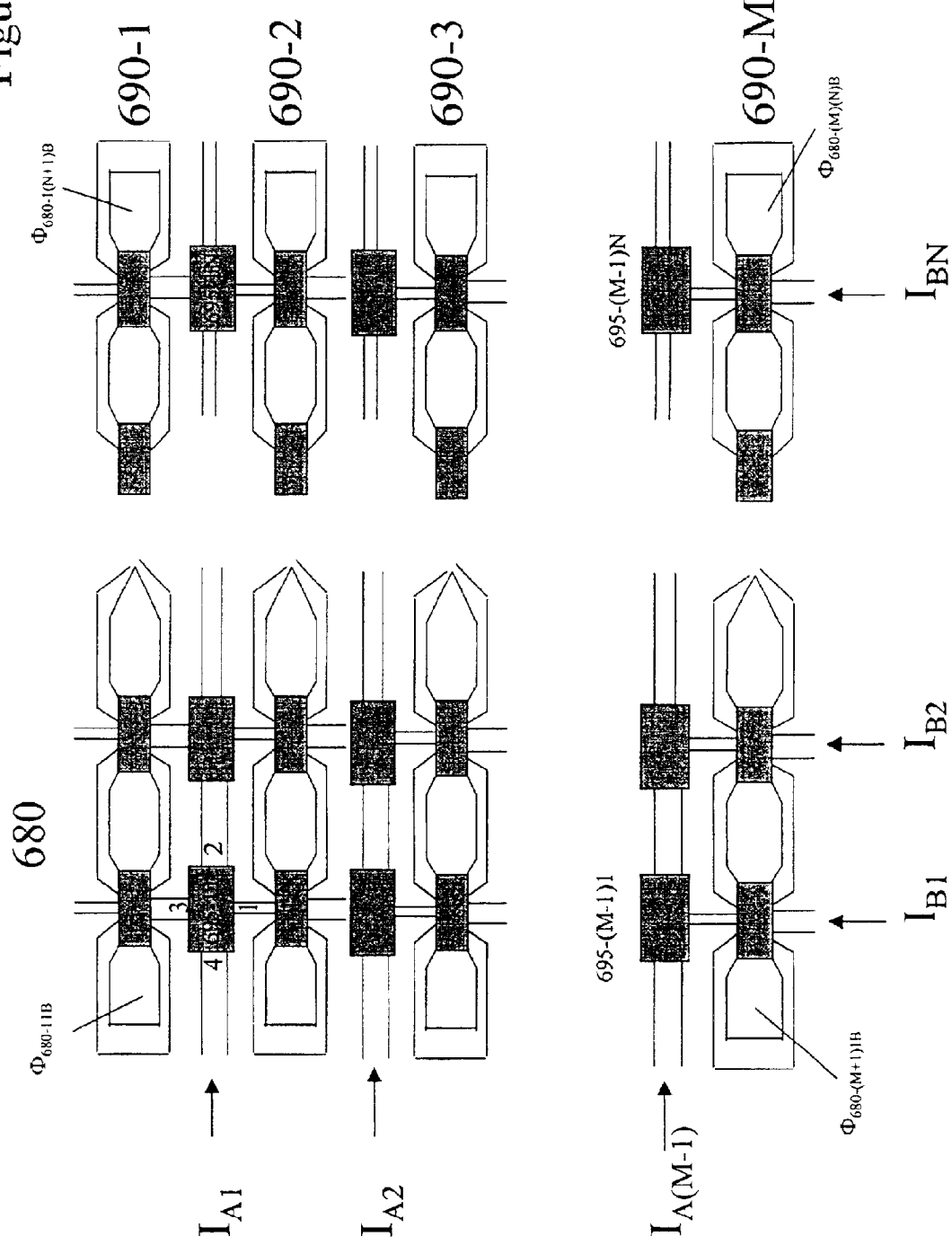

QUANTUM BIT WITH A MULTI-TERMINAL JUNCTION AND LOOP WITH A PHASE SHIFT

RELATED APPLICATIONS

This application is related to concurrently filed U.S. application Ser. No. 09/839,991 entitled "Quantum Bit with a Multi-Terminal Junction and Loop with a Phase Shift" and U.S. application Ser. No. 09/839,636 entitled "Quantum Bit with a Multi-Terminal Junction and Loop with a Phase Shift", both of which are herein incorporated by reference in their entireties.

BACKGROUND

1. Field of the Invention

This invention relates to quantum computing and, more specifically, to solid state quantum computing qubits with superconducting materials.

2. Discussion of Related Art

Research on what is now called quantum computing traces back to Richard Feynman, See, e.g., R. Feynman, *Int. J. Theor. Phys.*, 21, 467–488 (1982). Feynman noted that quantum systems are inherently difficult to simulate with conventional computers but that observing the evolution of a quantum system could provide a much faster way to solve some computational problems. In particular, solving a theory for the behavior of a quantum system commonly involves solving a differential equation related to the Hamiltonian of the quantum system. Observing the behavior of the quantum system provides information regarding the solutions to the equation.

Further efforts in quantum computing were initially concentrated on "software development" or building of the formal theory of quantum computing. Software development for quantum computing involves attempting to set the Hamiltonian of a quantum system to correspond to a problem requiring solution. Milestones in these efforts were the discoveries of the Shor and Grover algorithms. See, e.g., P. Shor, *SIAM J. of Comput.*, 26:5, 1484–1509 (1997); L. Grover, Proc. 28th STOC, 212–219 (1996); and A. Kitaev, LANL preprint quant-ph/9511026 (1995). In particular, the Shor algorithm permits a quantum computer to factorize natural numbers. Showing that fault-tolerant quantum computation is theoretically possible opened the way for attempts at practical realizations of quantum computers. See, e.g., E. Knill, R. Laflamme, and W. Zurek, *Science*, 279, p. 342 (1998).

One proposed application of a quantum computer is the factoring of large numbers. In such an application, a quantum computer could render obsolete all existing encryption schemes that use the "public key" method. In another application, quantum computers (or even a smaller scale device such as a quantum repeater) could enable absolutely safe communication channels where a message, in principle, cannot be intercepted without being destroyed in the process. See, e.g., H. J. Briegel et al., LANL preprint quant-ph/9803056 (1998) and the references therein.

Quantum computing generally involves initializing the states of N qubits (quantum bits), creating controlled entanglements among the N qubits, allowing the quantum states of the qubit quantum system to evolve under the influence of the entanglements, and reading the qubits after they have evolved. A qubit quantum system is conventionally a system having two degenerate quantum states, where the state of the qubit quantum system can have non-zero probability of being found in either degenerate state. Thus, N qubit quantum systems can define an initial state that is a combination of $2^N$ states. The entanglements between qubits and the interactions between the qubits and external influences control the evolution of the distinguishable quantum states and define calculations that the evolution of the quantum states perform. This evolution, in effect, can perform $2^N$ simultaneous calculations. Reading the qubits after evolution is complete determines the states of the qubit quantum systems and the results of the calculations.

Several physical systems have been proposed for the qubits in a quantum computer. One system uses chemicals having degenerate nuclear spin states, see U.S. Pat. No. 5,917,322, "Method and Apparatus for Quantum Information Processing", to N. Gershenfeld and I. Chuang. Nuclear magnetic resonance (NMR) techniques can read the spin states. These systems have successfully implemented a search algorithm, see, e.g., J. A. Jones, M. Mosca, and R. H. Hansen "Implementation of a Quantum Search Algorithm on a Quantum Computer," *Nature*, 393, 344–346 (1998) and the references therein, and a number ordering algorithm, see, e.g., Lieven M. K. Vandersypen, Matthias Steffen, Gregory Breyta, Costantino S. Yannoni, Richard Cleve and Isaac L. Chuang, "Experimental Realization of Order-Finding with a Quantum Computer," LANL preprint quant-ph/0007017 (2000), *Phys. Rev. Lett.*, Vol. 85, No. 25, 5452–55 (2000) and the references therein. The number ordering algorithm is related to the quantum Fourier transform, an essential element of both Shor's algorithm for factoring of a natural number and Grover's Search Algorithm for searching unsorted databases, see T. F. Havel, S. S. Somaroo, C.-H. Tseng, and D. G. Cory, "Principles and Demonstrations of Quantum Information Processing by NMR Spectroscopy, 2000," LANL preprint quant-ph/9812086 V2 (1999), and the references therein. However, efforts to expand such systems to a commercially useful number of qubits face difficult challenges.

Another physical system for implementing a qubit includes a superconducting reservoir, a superconducting island, and a dirty Josephson junction that can transmit a Cooper pair (of electrons) from the reservoir into the island. The island has two degenerate states. One state is electrically neutral, but the other state has an extra Cooper pair on the island. A problem with this system is that the charge of the island in the state having the extra Cooper pair causes long range electric interactions that interfere with the coherence of the state of the qubit. The electric interactions can force the island into a state that definitely has or lacks an extra Cooper pair. Accordingly, the electric interactions can end the evolution of the state before calculations are complete or qubits are read. This phenomenon is commonly referred to as collapsing the wavefunction, loss of coherence, or decoherence. See Y. Nakamura, Yu. A. Pashkin and J. S. Tsai "Coherent Control of Macroscopic Quantum States in a Single-Cooper-Pair Box," *Nature* V. 398 No. 6730, P. 786–788 (1999), and the references therein.

Another physical system for implementing a qubit includes a radio frequency superconducting quantum interference device (RF-SQUID). See J. E. Mooij, T. P. Orlando, L. Levitov, Lin Tian, Caspar H. van der Wal, and Seth Lloyd, "Josephson Persistent-Current Qubit," *Science* 285, 1036–39 (Aug. 13, 1999), and the references therein. The energy levels of the RF-SQUID correspond to differing amounts of magnetic flux threading the SQUID ring. Application of a static magnetic field normal to the SQUID ring may bring two of these energy levels, corresponding to different magnetic fluxes threading the ring, into resonance.

Typically, external AC magnetic fields are also applied to pump the system into excited states so as to maximize the tunneling frequency between qubit basis states. A problem with this system is that the basis states used are not naturally degenerate and the required biasing field has to be extremely precise. This biasing is possible for one qubit, but with several qubits, this bias field fine-tuning becomes extremely difficult. Another problem is that the basis states used are typically not the ground states of the system, but higher energy states populated by external pumping. This requires the addition of an AC field generating device, whose frequency will differ for each qubit as the individual qubit parameters vary.

The race to create the first scalable, practical, and powerful solid state quantum computer has existed for over ten years. Ever since the notion of a quantum computer first became evident with Feynman in 1982, scientists have been creating qubits of various forms. There are currently a number of disclosed qubits, where the quantum states are realized in the doubly degenerate ground states of the flux in a superconducting loop. Inevitably, these qubits are only useful when controlled by magnetic fields, or by some other means which couple the qubit to the environment or provide other potential sources of decoherence. In order to overcome these sources of decoherence, a large amount of overhead is required to control and harvest the quantum power available from the qubit. However, the means by which this can be accomplished has as yet eluded scientists. Thus, there is a need for a qubit which does not require the coupling magnetic fields, but which can be controlled by applying and reading currents and voltages.

There therefore exists a need for integrated solid state structures that can form the basic building blocks out of which integrated circuits using quantum effects can be built. The desired structures are such that they can be read from, written to and operated on in an efficient and scalable manner.

SUMMARY

In accordance with the present invention, a qubit is comprised of a multi-terminal junction, where two of the terminals of the junction are directly connected together, thus forming a superconducting loop. The superconducting loop introduces a phase shift so that the phase of the superconducting order parameter $\Psi$ is shifted by $\alpha\pi$ in transition through the structure, where $\alpha$ ranges from $-1$, through zero (no phase shift), to 1. A phase shift can be produced, for example, by the inclusion of a phase shifter in the superconducting loop or by external application of a magnetic field through the superconducting loop.

A qubit according to the present invention can be constructed from a multi-terminal Josephson junction in which at least two terminals of the junction are coupled to a superconducting loop to form a superconducting loop and at least two further terminals are open and can be coupled to external current sources. The multi-terminal junction can be made of superconducting leads coupled, for example, by any combination of constriction junctions (also referred to as micro-bridges), tunnel junctions, or semiconducting two dimensional electron gas structures within the physical location. In some embodiments of the qubit, the terminals of the multi-terminal junction are coupled in a physical location whose size is less than the size of the qubit.

In some embodiments of the invention, properties of both a symmetric junction and an asymmetric junction can be utilized. In a symmetric junction, a change in the direction of the transport current in the junction equally affects current in the terminals of the superconducting loop, thus having no overall affect on the current in the loop. In an asymmetric junction, a change in the direction of the transport current differentially affects the terminals that form the superconducting loop, thus changing the overall current in the loop.

A symmetric junction allows for the reduction of the potential energy barrier between the two nearly degenerate ground states of the quantum system of the qubit, thus providing a means of applying a $\sigma_x$ quantum gate operation. An asymmetric junction allows for biasing of one of the two ground states of the qubit, thus providing a means of applying a $\sigma_z$ quantum gate operation.

A phase shifter is any structure that shifts the phase of the superconducting order parameter $\Psi$ by $\alpha\pi$ in transition through the structure, where $\alpha$ is a constant such that $-1 \leq \alpha \leq 1$. The phase shift in the superconducting loop causes time-reversal symmetry breakdown in the qubit quantum system and thus causes a double degeneracy of the ground state without requiring an external magnetic flux or other influence. In some embodiments, the terminals in a multi-terminal junction can be physically asymmetric. This asymmetry affects the properties of a qubit according to the present invention by controlling the phase shift of the order parameter $\Psi$ in transition through a multi-terminal junction.

A qubit according to the present invention may be constructed out of any superconducting material. Embodiments of qubits having any desired number of terminals and a phase shifter can also be constructed in accordance with desired applications for the qubit. Embodiments of qubit structures include, for example, s-wave superconductor/normal metal/d-wave superconductor/normal metal/s-wave superconductor, referred to as S-N-D-N-S junctions, superconductor/ferromagnet/superconductor, referred to as S-F-S junctions, s-wave superconductor/two dimensional electron gas/s-wave superconductor, referred to as S-2DEG-S junctions, or multi-crystal d-wave superconductors patterned on an insulating substrate. The equilibrium ground state of the qubit quantum system is, in the absence of external magnetic fields, twice degenerate, with one of the energy levels corresponding to a magnetic flux threading the loop in one sense (corresponding to an equilibrium supercurrent flow, for example, in the clockwise direction around the superconducting loop), and the other energy level corresponding to a magnetic flux threading the loop in the opposite sense (corresponding to an equilibrium supercurrent flow, for example, in the counterclockwise direction around the superconducting loop).

Some embodiments of qubits according to the present invention include an s-wave (for example, niobium, aluminum, lead, mercury, or tin) superconducting structure that includes an asymmetric four-terminal junction with all terminals connected by constriction junctions. Two of the terminals can be joined to form a superconducting loop and the other two terminals can be coupled to a source of transport current. The superconducting loop includes a phase shifter, which may consist of a S-N-D-N-S (for example, niobium/gold/$YBa_2Cu_3O_{7-x}$/gold/niobium) junction. If the incoming current is parallel to the a (or b) crystallographic direction of the d-wave material, and the outgoing current is parallel to the b (or a) crystallographic direction of the d-wave material, this S-N-D-N-S junction can give a phase shift of $\pi$. Choosing the incoming and outgoing currents to be at any arbitrary angle to each other in the a-b plane in this embodiment allows a more general phase shift.

A magnetic field may also be applied to the superconducting loop. Both the transport current and the external magnetic field may be controlled so as to initialize the state of the qubit quantum system, allow control of the evolution of the qubit quantum system state and read the final state of the qubit quantum system after the evolution (and therefore the desired calculation) is complete. Further, qubits can be selectively entangled by coupling superconducting loops from different qubit structures with a switchable junction, allowing for control of entanglements in a qubit array.

A qubit according to the present invention can include a junction with any number of terminals. Some embodiments of the invention include a five terminal junction. A superconducting loop is formed between two terminals of the five terminal junction. The remaining three terminals, two terminals adjacent to the looping terminals, and one terminal centrally opposite the looping terminals, form a means by which to implement all desired quantum operations, including reading, writing, $\sigma_x$, gate operation, and a $\sigma_z$ gate operation.

Some embodiments, such as the five-terminal qubit, include both symmetric and asymmetric properties. Because the critical current in the junction depends on the state of the qubit, a read operation can be performed by applying a current asymmetrically across the junction, with a magnitude between the critical currents of the two states and determining if a resistance is created. Additionally, a $\sigma_z$ gate operation can be performed by applying a pulse of current asymmetrically across the junction while a $\sigma_x$ gate operation can be performed by applying a pulse of current symmetrically across the junction.

In accordance with some embodiments of the invention, a quantum computing method cools a structure containing at least one multi-terminal qubit to a temperature that makes the structure superconducting and suppresses decoherence processes in the system. The actual temperature will depend on the superconducting materials of the qubit. After the structure is at the appropriate temperature, a supercurrent can be established in each superconducting loop, the supercurrent being in a particular classical bit state corresponding to the information input for the quantum calculation. The quantum systems of each of the plurality of qubits is then allowed to evolve in the presence of externally applied magnetic fields and transport currents (whose details constitute the "software" or algorithm being followed by the structure). This allows each superconducting loop bit state to evolve into quantum states that are admixtures of a first state having a first magnetic moment and a second state having a second magnetic moment. These quantum states evolve under the action of the system's Hamiltonian in the manner prescribed by quantum mechanics. The evolution performs the quantum computation. Determining a measured magnetic moment or flux due to the supercurrent in each superconducting loop determines the result of the quantum computation.

In accordance with another aspect of the invention, determining the measured magnetic moments of the quantum state on the qubit can also include applying an alternating transport current and/or magnetic bias field to each qubit and then measuring the magnetic flux produced by the supercurrent flowing in each superconducting loop. In some embodiments, a static transport current and/or magnetic bias field can be applied to each qubit and the voltage across at least two of the terminals in the multi-terminal junction measured to determine the quantum state of the qubit. In some embodiments, the quantum states of the qubits can be read directly with, for example, a SQUID magnetometer.

In further aspects of the invention, quantum qubits can be selectively entangled with switchable junctions. In embodiments where qubits include a superconducting loop, an array of qubits can be entangled by switchably coupling the superconducting loops of the array. Additionally, a switchable junction can be included to decouple selected ones of the superconducting loops from other multi-terminal junctions.

These and other embodiments according to the present invention are further discussed below with respect to the following figures.

BRIEF DESCRIPTION OF THE FIGURES

FIG. 3C shows a plan view of a plurality of multi-terminal junctions connected in a superconducting loop with intrinsic phase shifter qubit horizontal architecture in accordance with embodiments of the present invention.

FIG. 4A shows a plan view of a plurality of multi-terminal qubits, each having a superconducting loop with an intrinsic phase shifter in accordance with embodiments of the present invention.

FIGS. 6A and 6B show plan views of a plurality of multi-terminal junctions coupling a plurality of superconducting loops with intrinsic phase shifters to form a plurality of qubits in accordance with embodiments of the present invention.

Use of the same reference symbols in different figures indicates elements having similar or identical functions.

DETAILED DESCRIPTION

In accordance with embodiments of the invention, a quantum computing operation can be performed on an array of quantum qubits where at least one of the qubits includes a qubit according to the present invention. A qubit according to the present invention includes a multi-terminal junction where two terminals of the multi-terminal junction are joined to form a superconducting loop. The superconducting loop introduces a phase shift to the superconducting order parameter. In some embodiments, the superconducting loop includes an intrinsic phase shifter.

Intrinsic phase shifters in superconducting phase quantum bits (qubits) are disclosed in M. H. S. Amin, T. Duty, A. Omelyanchouk, G. Rose and A. Zagoskin, U.S. Provisional Application Ser. No. 60/257624, "Intrinsic Phase Shifter as an Element of a Superconducting Phase Quantum Bit," filed Dec. 22, 2000, herein incorporated by reference in its entirety. A phase shifting structure with 0 and $\pi$-phase shifts in a two-terminal DC SQUID is described in R. R. Schulz, B. Chesca, B. Goetz, C. W. Schneider, A. Schmehl, H. Bielefeldt, H. Hilgenkamp, J. Mannhart and C. C. Tsuei, "Design and Realization of an all d-Wave dc $\pi$-Superconducting Quantum Interference Device," Appl. Phys. Lett. 76, 7 p. 912–14 (2000), herein incorporated by reference in its entirety.

Figure 13:
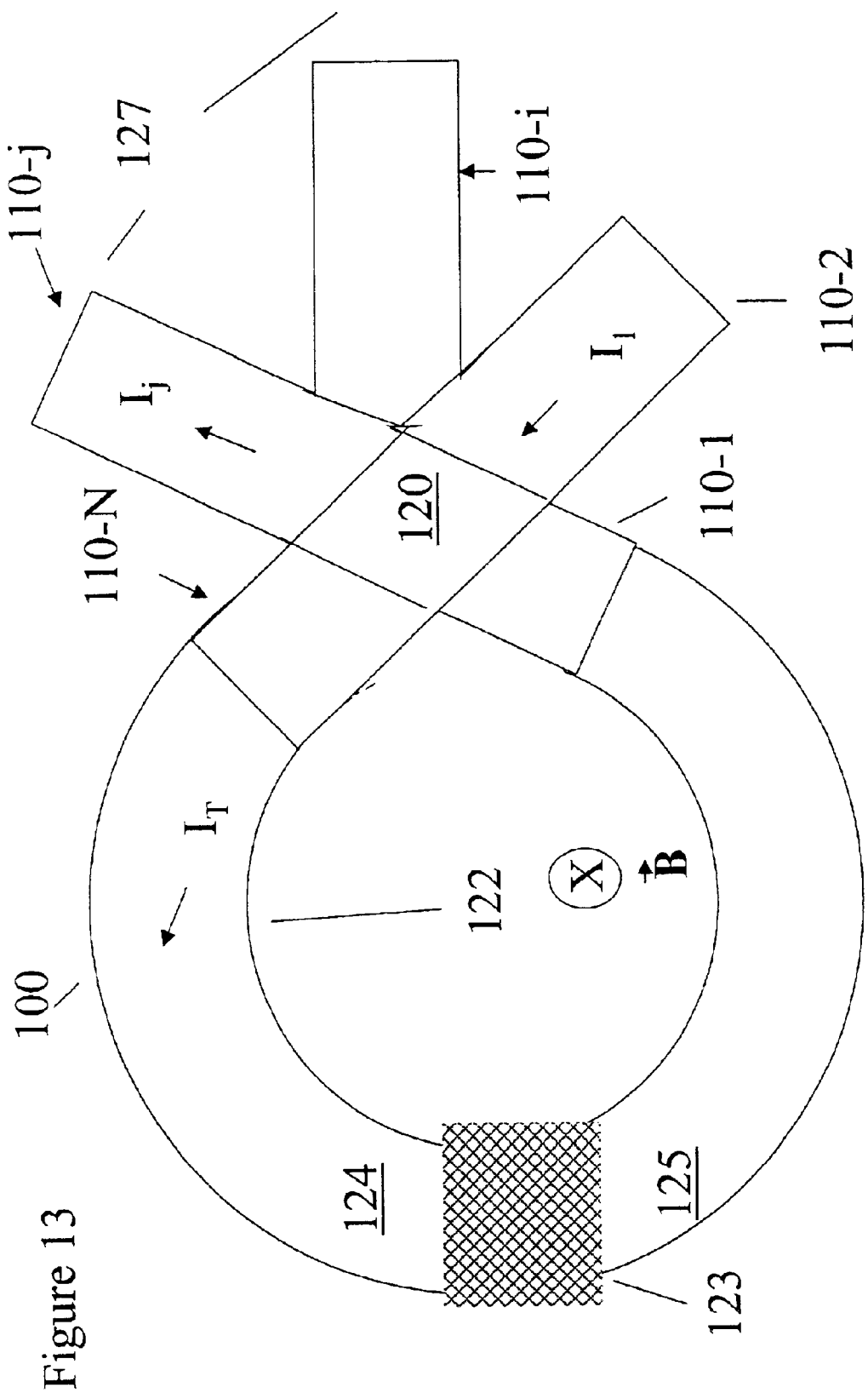
FIG. 13 shows a plan view of a quantum qubit according to the present invention.

FIG. 13 shows a block diagram of a qubit 100 according to the present invention. Qubit 100 includes multi-terminal junction 120 with terminals 110-1 through 110-N where N is an integer. At least two of terminals 110-1 through 110-N are coupled to portions 124 and 125 of a superconducting loop 122. In FIG. 13, terminals 110-1 and 110-N are coupled to superconducting loop 122, but in general any two of terminals 110-1 through 110-N can be coupled to superconducting loop 122. Superconducting loop 122 further includes a phase shifting structure 123 coupled into superconducting loop 122. In FIG. 13, terminals 110-$i$ and 110-$j$ refer to arbitrary ones of terminals 110-1 through 110-N. Although terminals 110-1 and 110-N are shown coupled to portions 124 and 125, respectively, of superconducting loop 122, in general any pair of terminals 110-1 through 110-N can be coupled to terminals 124 and 125 of superconducting loop 122.

Embodiments of qubits 100 according to the present invention can include phase shifter 123, which introduces an arbitrary phase shift inclusively between $-\pi$ and $\pi$. Phase shifters, such as phase shifter 123, that introduce arbitrary phase shifts can be more practical for the construction of qubits since the phase shifters with arbitrary phase shifts are more easily constructed. Further tuning of the phase shift accumulated through superconducting loop 122 in qubit 100 can be accomplished by the application of a magnetic field or adjustment of the transport current $I_T$ in superconducting loop 122.

Additionally, embodiments of the present invention include at least one terminal junction 120. Terminal junction 120 joins at least two terminals, terminals 110-1 through 110-N. In some embodiments, the physical size of junction 120 is much less than the size of superconduction loop 122.

Four-terminal SQUID devices are discussed in A. N. Omelyanchouk and Malek Zareyan, "Ballistic Four-Terminal Josephson Junction: Bistable States and Magnetic Flux Transfer", Los Alamos preprint cond-mat/9905139, and B. J. Vleeming, "The Four-Terminal SQUID", Ph.D. Dissertation, Leiden University, The Netherlands, 1998, both of which are herein incorporated by reference in their entirety. Four terminal SQUID devices are further discussed in R. de Bruyn Ouboter and A. N. Omelyanchouk, "Macroscopic Quantum Interference Effects in Superconducting Multiterminal Structures", *Superlattices and Microstructures*, Vol. 25 No 5/6 (1999), herein incorporated by reference in its entirety.

A quantum computation relies on qubit 100 including a qubit quantum system formed by supercurrents on superconducting loop 122 having degenerate ground states, designated |0> and |1>, of the supercurrent. An array of multi-terminal superconducting loops 122 having phase shifters 123 can be fabricated in useful numbers in a solid state structure. The ground state of the qubit quantum system includes two states that correspond to supercurrent flows that circulate clockwise and counterclockwise, respectively, in the plane of superconducting loop 122. The qubit quantum system of qubit 100 can be initialized by the introduction of supercurrents from an external source some of terminals 110-1 through 110-N not coupled to superconducting loop 122. The ground-state of the qubit quantum system in each superconducting loop 122 containing phase shifter 123 is doubly degenerate in the absence of externally applied magnetic fields and/or transport currents $I_T$ (each circulation direction has the same energy) and provides the basis for a qubit 100 for quantum computing in accordance with embodiments of the present invention.

The two degenerate states, corresponding to classical bit states, represented symbolically as |0> and |1>, are then the two basis states of the qubit quantum system of qubit 100. The magnitude of the flux threading superconducting loop 122 can be much less than half a flux quantum $\Phi_0$, both because of intrinsic phase shifter 123 and the presence of the terminals 110-1 through 110-N, which also introduces a phase shift. At least two external terminals, terminals 110-2 and 110-$j$ in FIG. 13, for example, of qubit 100 can be coupled to sources of transport current $I_1$ and $I_j$, respectively, in FIG. 13. Terminals 110-$i$ and 110-$j$ along with the current source creates a transport current loop 127. Additionally, an external magnetic flux, indicated by field $\vec{B}$, can be applied through superconducting loop 122 in order to control the physical parameters of the qubit quantum system of qubit 100. By changing the transport current $I_T$ and/or applying an external magnetic field $\vec{B}$, the magnitude of the flux threading superconducting loop 122, the potential barrier between the two basis states |0> and |1> of the qubit quantum system of qubit 100, and the tunneling matrix element $\Delta_T(I)$ between the basis states of the qubit quantum system can be adjusted.

The choice of the physical sizes of the constriction junctions of junction 120, tunnel junctions and/or semiconducting two-dimensional electron gas structures that couple the terminals, also affects the functioning of qubit 100. To achieve a small total flux in superconducting loop 122 (which is desirable for decreasing the decoherence rate) and maximum influence of the transport current $I_T$ on the properties of superconducting loop 122, in some embodiments the links in the transport loop (e.g., the current loop providing current to junction 120) are much wider than the ones in superconducting loop 122. A small residual flux exists because of spontaneous supercurrents, even in the absence of external fields. In those embodiments, the height of the potential energy barrier between the two degenerate quantum states of the qubit quantum system of qubit 100 will be affected most pronouncedly by the transport currents $I_T$.

Multi-terminal junction 120 includes two important regimes: symmetric and asymmetric. Further, multi-terminal junction 120 can display symmetric, asymmetric, or a combination of symmetric and asymmetric properties. In a symmetric junction, a change in the direction of the transport current in the junction equally affects current in the terminals of the superconducting loop, thus having no overall affect on the current in the loop. Whereas, in an asymmetric junction, a change in the direction of the transport current differentially affects the terminals that form the superconducting loop, thus changing the overall current in the loop.

A symmetric junction can be used to reduce the potential energy barrier between the two nearly degenerate ground states of qubit 100, thus providing a means of applying a $\sigma_x$ quantum gate operation. If a change in the direction of the transport current in terminals 110-2 through 110-$j$ has an equal effect on the current in terminals 110-1 and 110-N, then junction 120 is symmetric with respect to terminals 110-2 and 110-$j$. Qubit 100, under these circumstances, can then be referred to as a "symmetric qubit".

An asymmetric junction can be used to bias one of the two ground states of the qubit, thus providing a means of applying $\sigma_z$ quantum gate operation. If a change in the direction of the transport current in terminals 110-2 through 110-$j$ causes a differential change in the current in the loop terminals 110-1 and 110-N, then the junction is said to be asymmetric. Qubit 100, then, can be referred to as an "asymmetric qubit".

Therefore, a four-terminal junction 120 can be either a symmetric or asymmetric junction, and four-terminal qubit 100 can then be either a symmetric or asymmetric qubit. If qubit 100 includes a junction 120 with more than four terminals, for example a five-terminal qubit, then both symmetric and asymmetric properties can be realized.

An asymmetric qubit can be written to (i.e., the quantum states initialized) by applying a transport current $I_T$ when the magnitude of the transport current $I_T$ is larger than a threshold value which is determined by the specific implementation of qubit 100. The direction of transport current $I_T$ is chosen depending on which basis state (i.e., $|0\rangle$ or $|1\rangle$) is being written into the qubit quantum system. The application of transport current $I_T$, then, has the effect of biasing the qubit quantum system states into one of the degenerate basis states. In the biased state the qubit quantum system will decay to the most energetically favorable state (either $|0\rangle$ or $|1\rangle$ as required). In such systems, the time to decay typically is shorter than about 1 millisecond, depending on the particular embodiment of qubit 100. Depending on the particular embodiment of qubit 100, a magnetic field $\vec{B}$ can also be applied in one of two directions, which can alter the time to decay. The magnetic field can be applied opposing the transport current induced bias, thereby decreasing the time for decay, or supporting the transport current induced bias, thereby increasing the time to decay.

A symmetric qubit can be written to (i.e., biased) by applying a static magnetic field $\vec{B}$. As described above, this will cause the qubit quantum system of qubit 100 to decay into the energetically favorable state on a time-scale dependent upon the embodiment of qubit 100 and the magnitude of an externally applied magnetic field $\vec{B}$.

Single qubit operations on asymmetric qubits can be performed by modulating the transport current and/or the external magnetic field strength. Setting the transport current $I_T$ to zero sets the effective Hamiltonian describing the quantum system of qubit 100 proportional to $\hat{\sigma}_x$, which is referred to as a Pauli matrix. In the basis where the qubit basis states $|0\rangle$ and $|1\rangle$ are chosen so that the state $|0\rangle$ corresponds to the vector (1,0) and the state $|1\rangle$ corresponds to the vector (0,1), $$\hat{\sigma}_x = \begin{bmatrix} 0 & 1 \\ 1 & 0 \end{bmatrix}.$$

This basis can be called the Z-diagonal basis. In this basis the Pauli matrix $\hat{\sigma}_x$ rotates one of the basis states into the other basis state (i.e., $\hat{\sigma}_x|0\rangle=|1\rangle$ and $\hat{\sigma}_x|1\rangle=|0\rangle$).

Increasing the transport current $I_T$ past a threshold current, which can be an implementation dependent critical value, sets the Hamiltonian proportional to $\hat{\sigma}_z$, which is another Pauli matrix. The matrix $\hat{\sigma}_z$ is defined in the Z-diagonal basis to be $$\hat{\sigma}_z = \begin{bmatrix} 1 & 0 \\ 0 & -1 \end{bmatrix}.$$

The Pauli matrix $\hat{\sigma}_z$ biases the states, or in an alternative interpretation adds a phase to the second state (i.e. $\hat{\sigma}_z|0\rangle=|0\rangle$ and $\hat{\sigma}_z|1\rangle=-|1\rangle$). An arbitrary single qubit operation can be performed by performing combinations of the functions described by $\hat{\sigma}_x$ and $\hat{\sigma}_z$.

To keep the quantum system of qubit 100 in some specific state an alternating transport current $I_T(t)$ can be applied. The Hamiltonian representing the quantum system of qubit 100, then, is proportional to $I_T(t) \hat{\sigma}_z$. In some embodiments, for example, $I_T(t)$ can be a square wave. This method can be used in conjunction with a clock whose frequency is an integer multiple of the frequency of $I_T(t)$ so that, at every clock pulse, the quantum system of qubit 100 is in the same state in which it began. In addition, during the evolution of the qubit states external magnetic fields $\vec{B}$ may be applied in accordance with a specific usage of the qubit.

Single qubit operations on symmetric embodiments of qubit 100 can be performed by modulating the transport current $I_T(t)$ and/or the external magnetic field $\vec{B}$. In the symmetric qubit embodiments of qubit 100, changing the transport current $I_T(t)$ does not affect the bias (i.e., the initial quantum states of the qubit quantum system) but does affect the energy barrier between the qubit quantum system basis states. The effective Hamiltonian describing the quantum system of qubit 100, then, includes a term proportional to $\Delta_T(I)\hat{\sigma}_x$ where the tunneling matrix element $\Delta_T(I)$ can be varied over a large range dependent on the transport current $I_T(t)$. Applying a magnetic field $\vec{B}$ normal to the plane of the superconducting loop 122 provides another term of the Hamiltonian that is proportional to $\hat{\sigma}_z$. To keep the quantum system in some specific state, an alternating magnetic field normal to the superconducting loop 122, $\vec{B}(t)$, can be applied, adding a term proportional to $\vec{B}(t)\hat{\sigma}_z$ to the Hamiltonian. In some embodiments, for example, $\vec{B}(t)$ can be modulated in a square wave. This method can also be used in conjunction with a clock whose frequency is an integer multiple of the frequency of $\vec{B}(t)$ so that at every clock pulse the qubit quantum system of qubit 100 is in the same state in which it began.

In some embodiments, the state of the qubit quantum system of an asymmetric embodiment of qubit 100 begins with the application of an alternating transport current $I_T(t)$ as described above. The magnetic flux threading the superconducting loop 122 can then be measured using a suitable magnetic field measuring device, for example a SQUID magnetometer or a magnetic force microscope. The alternating transport current $I_T(t)$ causes the decay rate out of the desired final state to be minimized. Once the state of the qubit quantum system of qubit 100 is measured, the transport current $I_T(t)$ can be set to bias the states such that the measured state has a lower energy level, making the measured state's information stable so that it may be accessed at any later time.

In some embodiments, the state of the qubit quantum system of the asymmetric qubit can be measured by applying a transport current $I_T(t)$ in a fixed direction and then monitoring the voltage drop across pairs of external leads, for example 110-2, 110-$i$ and 110-$j$ of FIG. 13. If the measured voltage remains constant then the state of the qubit quantum system corresponds to the favored energy state indicated by the fixed direction of the transport current $I_T(t)$. If the measured voltage changes, then the state of the qubit quantum system corresponds to an excited state indicated by the biasing of the fixed direction of the transport current $I_T(t)$. The changing voltage indicates a decay of the qubit quantum system state from the excited state. This indicates that the qubit quantum system was in the excited state relative to the bias indicated by the fixed direction of the transport current at the end of the calculation.

In some embodiments, the state of the quantum system of a symmetric qubit can be read similarly to the state of the quantum system of an asymmetric qubit, except that biasing is performed by application of magnetic fields normal to superconducting loop 122 and not via application of transport currents.

Figure 1A:
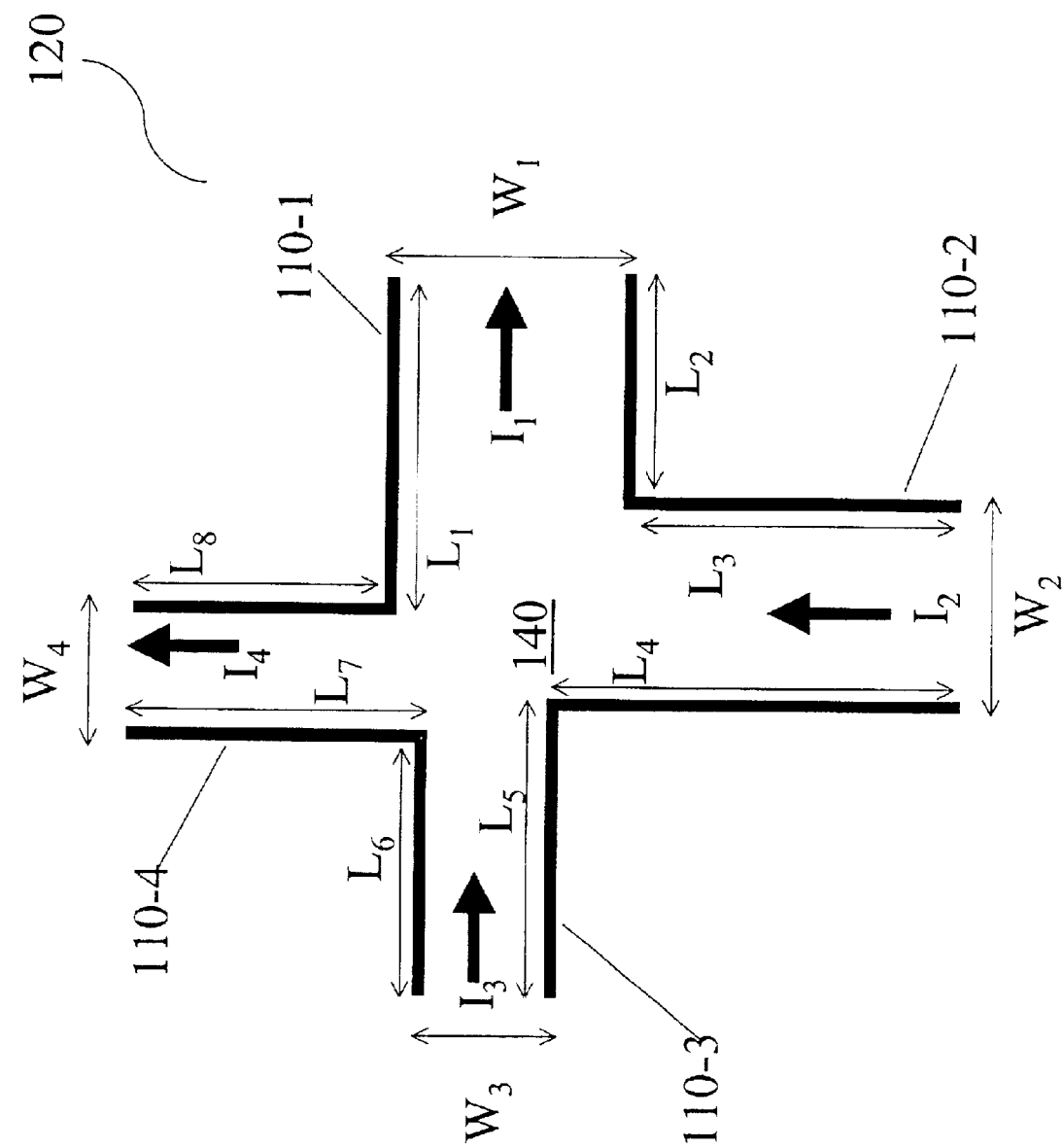
FIGS. 1A, 1B, 1D, and 1F through 1M show plan views of embodiments of multi-terminal junctions in accordance with embodiments of the present invention.

FIG. 1A shows a plan view of an embodiment of a four-terminal constriction junction 120 according to the present invention. Four-terminal junction 120 includes terminals 110-1, 110-2, 110-3, and 110-4 coupled at a constriction junction 140. Superconducting currents $I_1$, $I_2$, $I_3$ and $I_4$ can exist in terminals 110-1, 110-2, 110-3 and 110-4, respectively. The terminal lengths $L_1$ through $L_8$, which describe the linear dimensions of terminals 110-1, 110-2, 110-3, and 110-4 as indicated in FIG. 1A, can all be different and are typically chosen to be less than about 10 microns. The terminal widths $W_1$ through $W_4$, which describe the widths of terminals 110-1 through 110-4, respectively, can also all be different and are typically chosen to be less than the coherence length of the superconducting material of terminals 110-1 through 110-4. For example, if terminals 110-1 through 110-4 are of aluminum, the coherence length is 1.6 microns. Four-terminal constriction junction 120 can be fabricated of any superconducting material.

In an exemplary embodiment, four-terminal constriction junction 120 can be fabricated of aluminum. Widths $W_1$ and $W_2$ can each be approximately 0.5 microns; widths $W_3$ and $W_4$ can each be approximately 0.05 microns; lengths $L_1$, $L_4$, $L_5$, $L_6$, $L_7$, and $L_8$ can each be approximately 1 micron; and lengths $L_2$ and $L_3$ can each be approximately 0.55 microns.

In another exemplary embodiment, four-terminal constriction junction 120 can be fabricated of aluminum, with width $W_1$ approximately 0.5 microns, $W_2$ approximately 0.3 microns, $W_3$ approximately 0.08 microns, and $W_4$ approximately 0.05 microns, lengths $L_1$, $L_4$, $L_5$, $L_6$, and $L_7$ each approximately 1 micron, $L_2$ approximately 0.75 microns, $L_3$ approximately 0.68 microns, and $L_8$ approximately 0.9 microns.

Figure 1B:
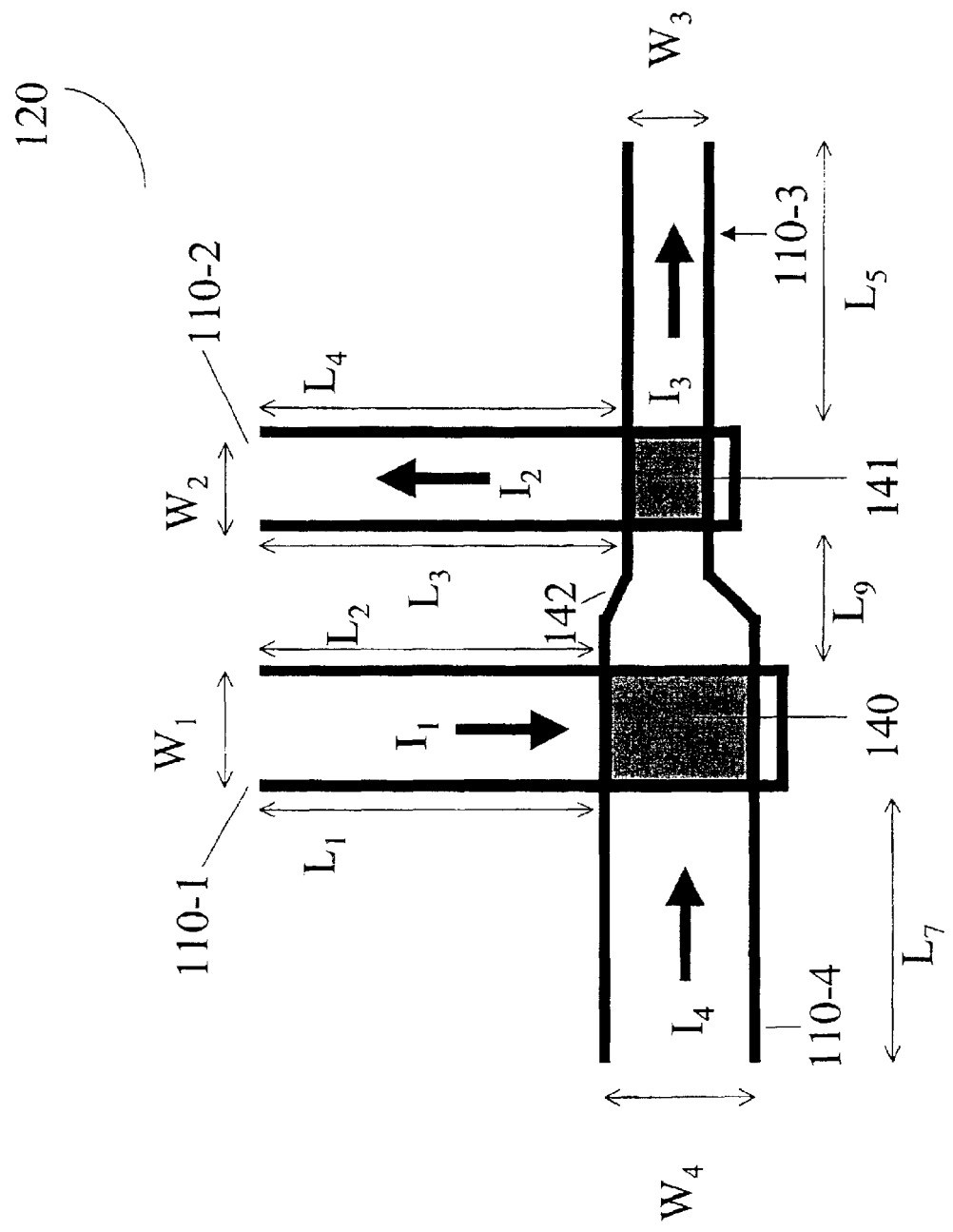

FIG. 1B shows a plan view of another embodiment of a four-terminal junction 120 with a constriction junction 142 coupling terminals 110-3 and 110-4 and two tunnel junctions 140 and 141. Four-terminal junction 120 of FIG. 1B further includes terminals 110-1 and 110-2. Tunnel junction 140 couples terminal 110-4 with terminal 110-1. Tunnel junction 141 couples terminal 110-3 with terminal 110-2. Superconducting currents $I_1$, $I_2$, $I_3$ and $I_4$ can exist in terminals 110-1, 110-2, 110-3 and 110-4, respectively. The terminal lengths $L_1$–$L_9$, which describe the linear dimensions of terminals 110-1 through 110-4 and the separation between junctions 140 and 141, can all be different and are typically chosen to be less than about 10 microns. The terminal widths $W_1$–$W_4$, which as before describe the widths of terminals 110-1 through 110-4, respectively, can also be different and are typically chosen to be less than the coherence length of the superconductor used. For example, in the case of aluminum, the coherence length is about 1.6 microns. Four-terminal junction 120 can be fabricated of any superconductor material. Tunnel junction 140 is typically fabricated using an insulating layer between terminals 110-4 and 110-1. Tunnel junction 141 is typically fabricated using an insulating layer between terminals 110-2 and 110-3.

Figure 1C:
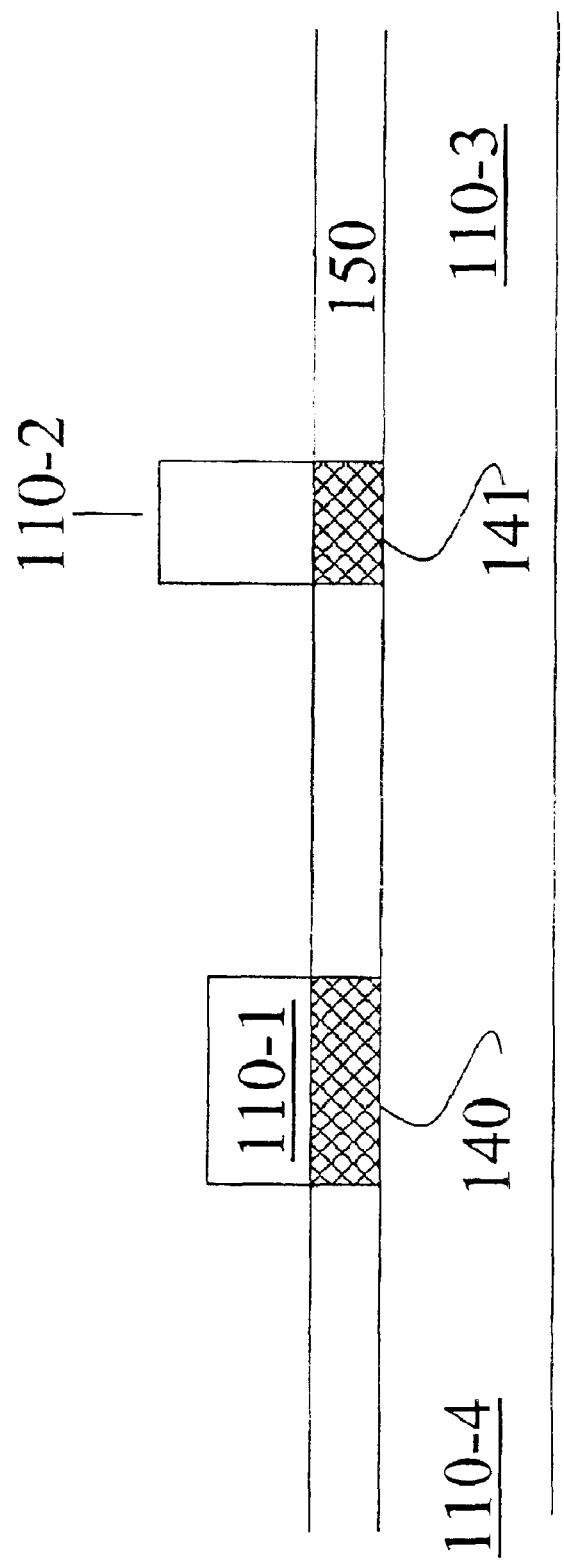
FIGS. 1C and 1E show cross-sectional views of embodiments of multi-terminal junctions in accordance with embodiments of aspects of the present invention.

FIG. 1C shows a cross-sectional diagram of the embodiment of four-terminal junction 120 shown in FIG. 1B. Terminals 110-4 and 110-1 are separated by insulator 150 at junction 140 and terminals 110-3 and 110-2 are separated by insulator 150 at junction 141.

In an exemplary embodiment, four-terminal junction 120 as shown in FIG. 1B can be fabricated of aluminum, with widths $W_1$ and $W_2$ being approximately 0.05 microns, widths $W_3$ and $W_4$ being approximately 0.5 microns, lengths $L_1$, $L_2$, $L_3$, $L_4$, $L_5$, and $L_7$ being approximately 1 micron, and $L_9$ being approximately 0.1 microns.

Tunnel junction 140 can be fabricated where insulation layer 150 (FIG. 1C) is an aluminum oxide layer of thickness approximately 0.05 microns. Insulating layer 150 can be deposited onto terminal 110-4. Terminal 110-1 is then deposited on insulating layer 150. The tunnel junction 141 can also be fabricated where insulating layer 150 (FIG. 1C) is an aluminum oxide layer of thickness approximately 0.05 microns which is deposited onto terminal 110-3, upon which is deposited terminal 110-2. Although in FIG. 1C, terminals 110-1 and 110-2 are shown above terminals 110-4 and 110-3, respectively, in general terminals 110-1 and 110-2 can be on either side of terminals 110-4 and 110-3, respectively.

In another exemplary embodiment, four-terminal junction 120 as shown in FIGS. 1B and 1C can be fabricated of aluminum with the following dimensions: width $W_1$ being approximately 0.05 microns; width $W_2$ being approximately 0.08 microns; width $W_3$ being approximately 0.3 microns; width $W_4$ being approximately 0.5 microns; lengths $L_2$, $L_3$, $L_4$, $L_5$, and $L_7$ being approximately 1 micron; length $L_1$ being approximately 0.8 microns; and length $L_9$ being approximately 0.1 microns. Again, junctions 140 and 141 can be fabricated with insulation layer 150 being an approximately 0.05 microns layer of aluminum oxide deposited onto terminals 110-4 and 110-3, respectively. Terminals 110-1 and 110-2 can then be deposited at junctions 140 and 141 on insulating layer 150.

Figure 1D:
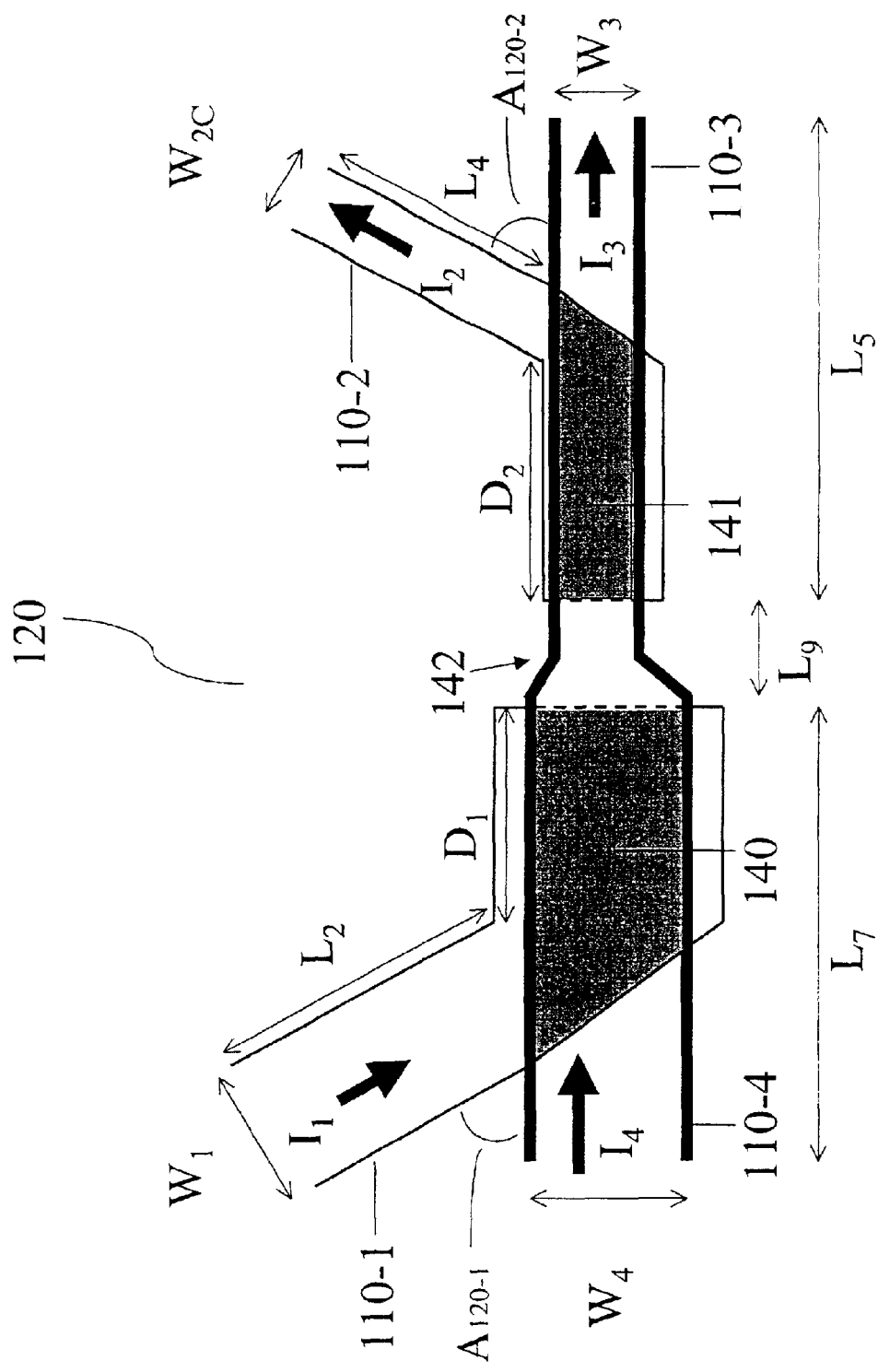
Figure 1E:
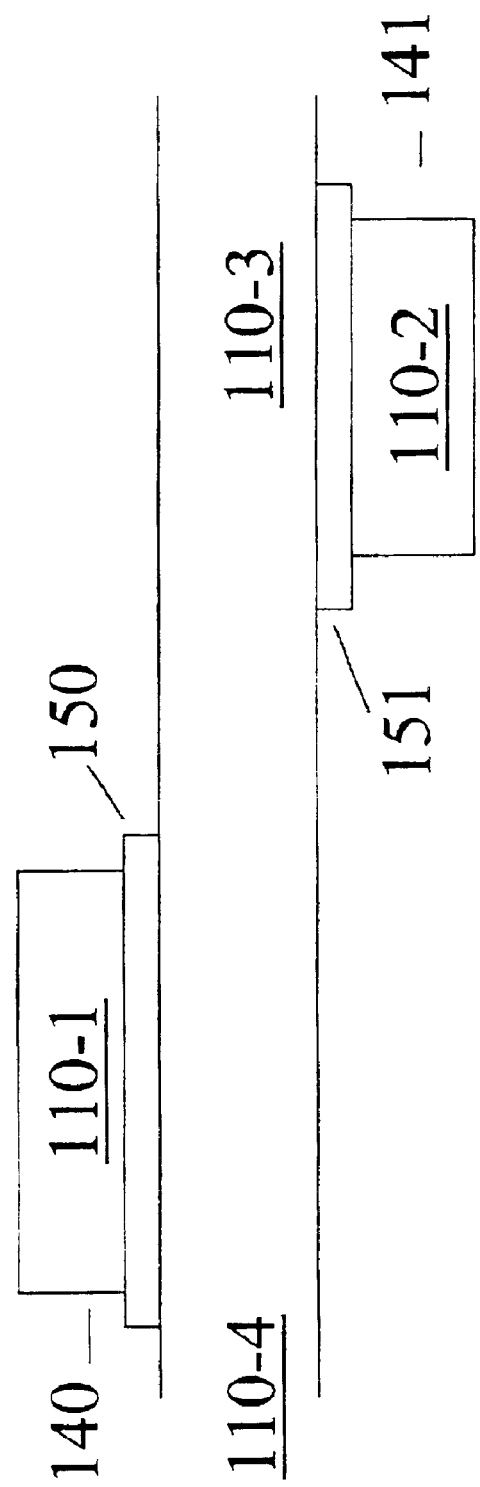

FIG. 1D shows a plan view of another embodiment of four-terminal junction 120 with one constriction junction 142 coupling terminals 110-3 and 110-4 and tunnel junctions 140 and 141, which are fabricated so as to run parallel to terminals 110-4 and 110-3 over distances $D_1$ and $D_2$, respectively. In some embodiments, $D_1$ and $D_2$ are each greater than approximately 0.2 microns. Tunnel junction 140 couples terminal 110-4 with terminal 110-1. Tunnel junction 141 couples terminal 110-2 with terminal 110-3. Superconducting currents $I_1$, $I_2$, $I_3$ and $I_4$ are the currents in terminals 110-1, 110-2, 110-3 and 110-4, respectively. The terminal lengths $L_2$, $L_4$, $L_5$ and $L_7$ can all be different and are typically chosen to be less than about 10 microns. Note that in some embodiments the length $L_9$ can be negative, which may result in overlapping tunnel junctions 140 and 141. Terminals 110-1 and 110-2 can extend at arbitrary angles $A_{120\text{-}1}$ and $A_{120\text{-}2}$ respectively. The terminal widths $W_1$–$W_4$ can all be different and are typically chosen to be less than the coherence length of the superconducting material used. For example, in the case of aluminum terminals, the coherence length is about 1.6 microns. Four-terminal junction 120 can, however, be fabricated of any superconducting material. As shown in FIG. 1E, tunnel junction 140 can be fabricated using an insulating layer 150 between terminals 110-4 and 110-1. Tunnel junction 141 can be fabricated using an insulating layer 151 between terminals 110-3 and 110-2.

In an exemplary embodiment, four-terminal junction 120 as shown in FIGS. 1D and 1E can be fabricated of aluminum with the following dimensions: widths $W_1$ and $W_2$ being approximately 0.05 microns; widths $W_3$ and $W_4$ being approximately 0.5 microns; lengths $L_2$ and $L_4$ being approximately 1 micron; lengths $D_1$ and $D_2$ being approximately 1 micron; lengths $L_5$ and $L_7$ being approximately 1.5 microns; and $L_9$ being approximately 0.1 microns. Tunnel junction 140 can be fabricated with insulating layer 150 being an aluminum oxide layer of thickness approximately 0.05 microns deposited onto terminal 110-4, upon which is deposited terminal 110-1. Tunnel junction 141 can be fabricated with insulating layer 151 being an aluminum oxide layer of thickness approximately 0.05 microns which is deposited onto terminal 110-3, upon which is deposited terminal 110-2.

In another exemplary embodiment of junction 120 as shown in FIGS. 1D and 1E, four-terminal junction can be fabricated of aluminum with the following dimensions: width $W_1$ being approximately 0.05 microns; width $W_2$ being approximately 0.08 microns; width $W_3$ being approximately 0.3 microns; width $W_4$ being approximately 0.5 microns; lengths $L_2$ and $L_4$ being approximately 1 micron; lengths D1 and D2 being approximately 1 micron; lengths $L_5$ and $L_7$ being approximately 1.5 microns; and length $L_9$ being approximately 0.1 microns. Again, insulating layer 150 forming part of tunnel junction 140 can be fabricated of aluminum oxide with thickness approximately 0.05 microns and insulating layer 151 forming part of tunnel junction 141 can be fabricated of aluminum oxide of thickness approximately 0.05 microns.

Figure 1F:
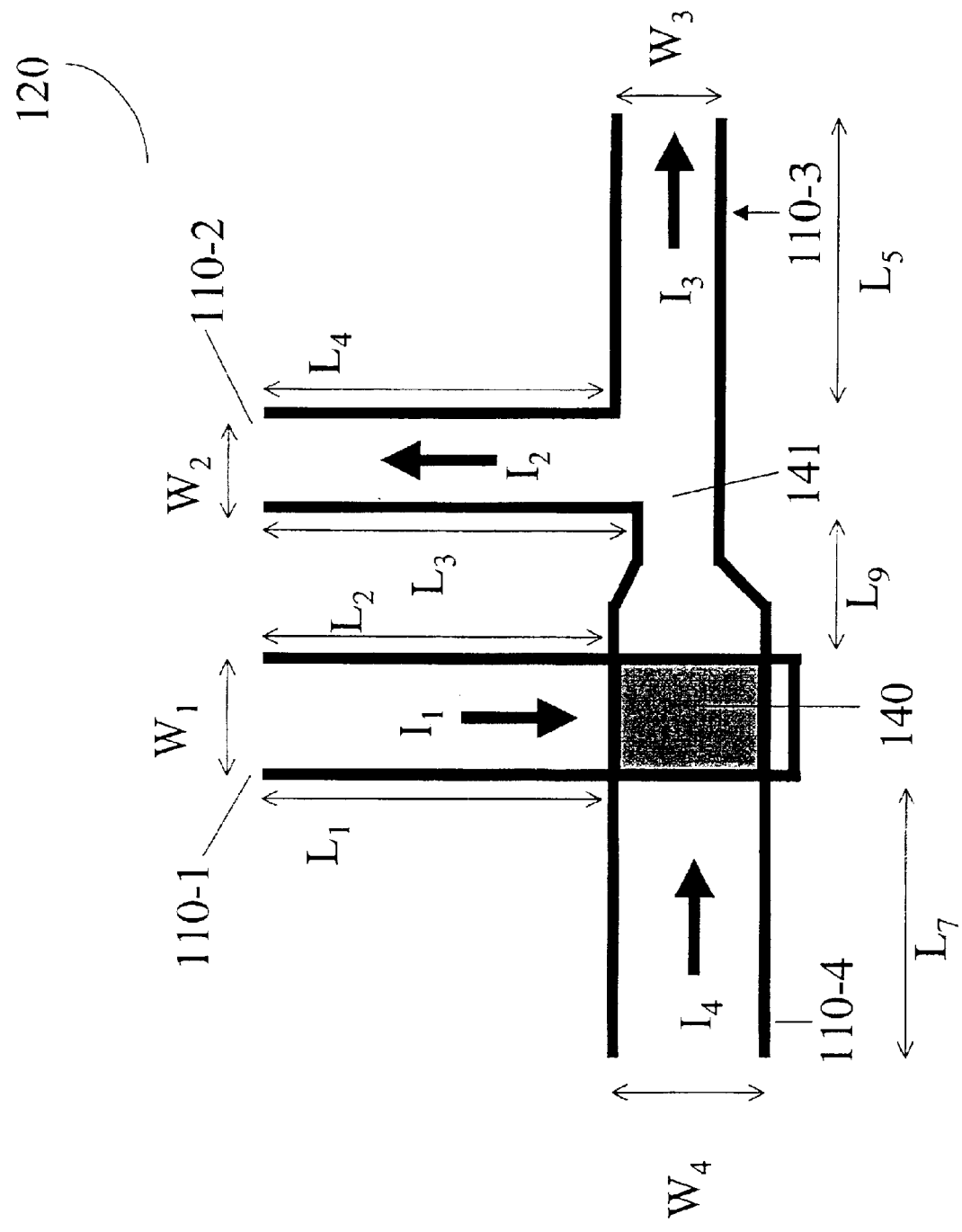

FIG. 1F shows a plan view of an embodiment of a four-terminal junction 120 with constriction junction 141 coupling terminals 110-2, 110-3 and 110-4 and tunnel junction 140 coupling junctions 110-4 with 110-1. Superconducting currents $I_1$, $I_2$, $I_3$ and $I_4$ can exist in terminals 110-1, 110-2, 110-3 and 110-4, respectively. The terminal lengths $L_1$, $L_2$, $L_3$, $L_4$, $L_5$ and $L_7$. which indicate the dimensions of terminals 110-1 through 110-4, can all be different and are typically chosen to be less than about 10 microns. The widths of terminals 110-1 through 110-4, $W_1$–$W_4$ respectively, can also be different and are typically chosen to be less than the coherence length of the superconductor used. Junction 120 can be fabricated of any superconducting material. Tunnel junction 140 can typically be fabricated using an insulating layer 150 between terminals 110-4 and 110-1, as was shown for junction 140 in FIG. 1C.

In an exemplary embodiment, four-terminal junction 120 as shown in FIG. 1F can be fabricated of aluminum with the following dimensions: widths $W_1$. and $W_4$ being approximately 0.5 microns; widths $W_2$ and $W_3$ being approximately 0.05 microns; lengths $L_1$. $L_2$. $L_3$. $L_4$. $L_5$. and $L_7$ being approximately 1 micron; and length $L_9$ being approximately 0.1 microns. Tunnel junction 140 can be fabricated with insulating layer 150 being an aluminum oxide layer of thickness approximately 0.05 microns.

In another exemplary embodiment of junction 120 as shown in FIG. 1F, four-terminal junction can be fabricated of aluminum with the following dimensions: width $W_1$ being approximately 0.05 microns; width $W_4$ being approximately 0.08 microns; width $W_2$ being approximately 0.3 microns; width $W_3$ being approximately 0.5 microns; lengths $L_1$. $L_2$. $L_3$. $L_4$. $L_5$. and $L_7$ being approximately 1 micron; and length $L_9$ being approximately 0.1 microns. Tunnel junction 140 can, as before, include insulating layer 150 fabricated using an aluminum oxide layer of thickness approximately 0.05 microns.

Figure 1G:
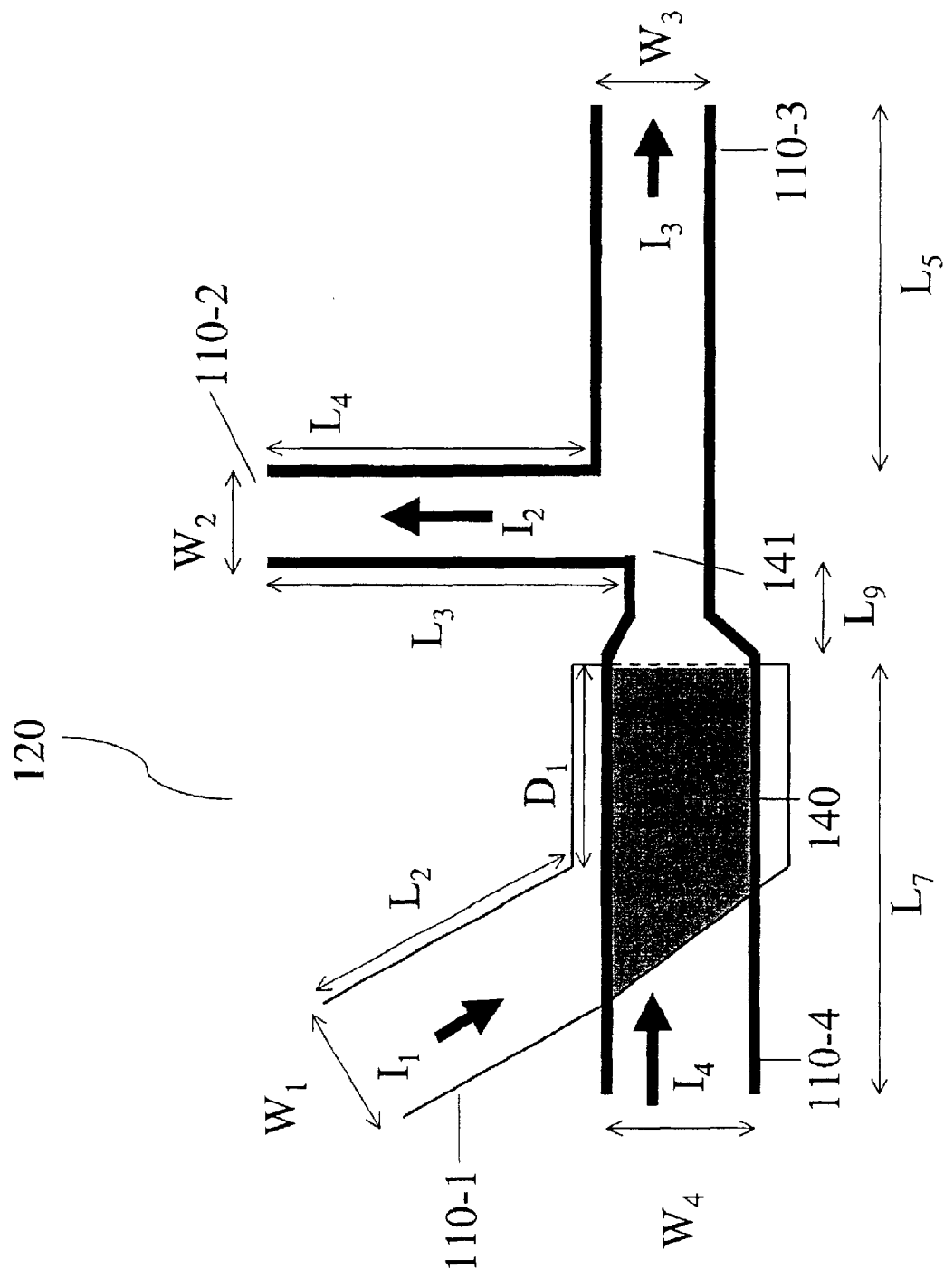

FIG. 1G shows a plan view of another embodiment of a four-terminal junction 120 having constriction junction 141 coupling terminals 110-2, 110-3 and 110-4 and tunnel junction 140, which is fabricated so as to run parallel to terminal 110-4 at least over distance $D_1$. coupling terminals 110-4 with 110-1. In some embodiments, distance $D_2$ is greater than approximately 0.2 microns. As before, terminals 110-1, 110-2, 110-3 and 110-4 can carry superconducting currents $I_1$. $I_2$. $I_3$ and $I_4$. respectively. Terminal lengths $L_2$. $L_3$. $L_4$. $L_5$ and $L_7$ can all be different and are typically chosen to be less than about 10 microns. The terminal widths $W_1$–$W_4$ of terminals 110-1 through 110-4, respectively, can all be different and are typically chosen to be less than the coherence length of the superconducting material used. Four-terminal junction 120 can be fabricated of any superconductor. As discussed before, tunnel junction 140 is typically fabricated with an insulating layer 150 between terminals 110-4 and 110-1, as shown in FIG. 1E.

In an exemplary embodiment of junction 120 as shown in FIG. 1G, four-terminal junction can be fabricated of aluminum with the following dimensions: widths $W_1$ and $W_4$ each being approximately 0.05 microns; widths $W_2$ and $W_3$ each being approximately 0.5 microns; lengths $L_2$. $L_3$. $L_4$. and $L_5$ each being approximately 1 micron; length $D_1$ being approximately 0.5 microns; length $L_9$ being approximately 0.1 microns; and length $L_7$ being approximately 1.5 microns. Tunnel junction 140 can include insulating layer 150 as shown in FIG. 1E which can be fabricated using an aluminum oxide layer of thickness approximately 0.05.

In another exemplary embodiment of junction 120 as shown in FIG. 1G, four-terminal junction can be fabricated of aluminum with the following dimensions: width $W_1$ being approximately 0.05 microns; width $W_4$ being approximately 0.08 microns; width $W_2$ being approximately 0.3 microns; width $W_3$ being approximately 0.5 microns; lengths $L_2$. $L_3$. $L_4$. and $L_5$ being approximately 1 micron, length $D_1$ being approximately 0.5 microns, length $L_9$ being approximately 0.1 microns; and length $L_7$ being approximately 1.5 microns. Again, tunnel junction 140 can include insulating layer 150 which can be fabricated using an aluminum oxide layer of thickness approximately 0.05 microns.

Figure 1H:
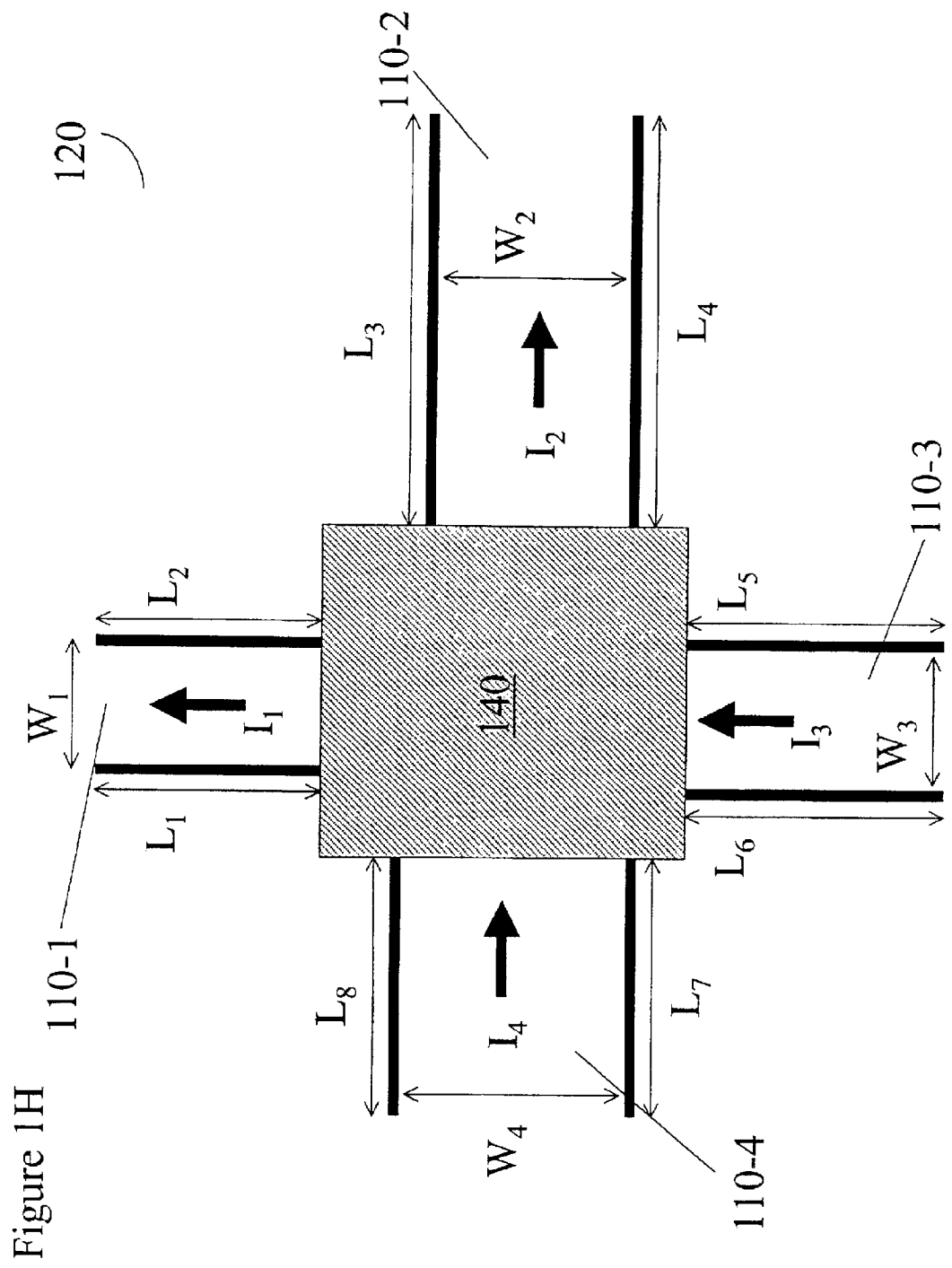

FIG. 1H shows a plan view of an embodiment of a four-terminal junction 120 where the four terminals 110-1, 110-2, 110-3, and 110-4 are all coupled by junction 140, which in this embodiment is a two dimensional electron gas structure. Again, terminals 110-1, 110-2, 110-3, and 110-4 can carry superconducting currents $I_1$, $I_2$, $I_3$ and $I_4$, respectively. The terminal lengths $L_1$–$L_8$ can all be different and are typically chosen to be less than about 10 microns. The terminal widths $W_1$–$W_4$ also can all be different and are typically chosen to be less than the coherence length of the superconductor used. Superconducting terminals 110-1, 110-2, 110-3 and 110-4 can be fabricated of any superconducting material which can be coupled to a two dimensional electron gas structure of junction 140. The two dimensional electron gas structure of junction 140 can be fabricated of any structure which allows electrons to be confined to a single two dimensional plane and allows coupling of these electrons to superconducting terminals 110-1, 110-2, 110-3 and 110-4.

An exemplary embodiment of four-terminal junction 120 as shown in FIG. 1H can be fabricated of niobium with the following dimensions: widths $W_1$ and $W_2$ being approximately 0.2 microns; widths $W_3$ and $W_4$ being approximately 0.05 microns; and lengths $L_1$, $L_2$, $L_3$, $L_4$, $L_5$, $L_6$, $L_7$ and $L_8$ each being approximately 0.5 microns. The two dimensional electron gas structure of junction 140 can be constructed of a semiconducting InAs heterostructure. The details of the fabrication and behavior of two dimensional electron gas junctions are well known, see e.g., A. Jacobs, R. Kümmel, and H. Plehn, "Proximity Effect, Andreev Reflections, and Charge Transport in Mesoscopic Superconducting-Semiconducting Heterostructures," Los Alamos Preprint cond.-mat/98 10343 v2 (1998), republished in Superlattices and Microstructures, Vol. 25. Nr. 5/6, 669–681 (1999), which is herein incorporated by reference in its entirety.

Another exemplary embodiment of four-terminal junction 120 as shown in FIG. 1H can be fabricated of niobium with the following dimensions: width $W_1$ being approximately 0.1 microns; width $W_2$ being approximately 0.08 microns; width $W_3$ being approximately 0.03 microns; width $W_4$ being approximately 0.01 microns; and lengths $L_1$, $L_2$, $L_3$, $L_4$, $L_5$, $L_6$, $L_7$ and $L_8$ each being approximately 0.5 microns. The two dimensional electron gas structure of junction 140 can be constructed of semiconducting InAs.

Figure 1I:
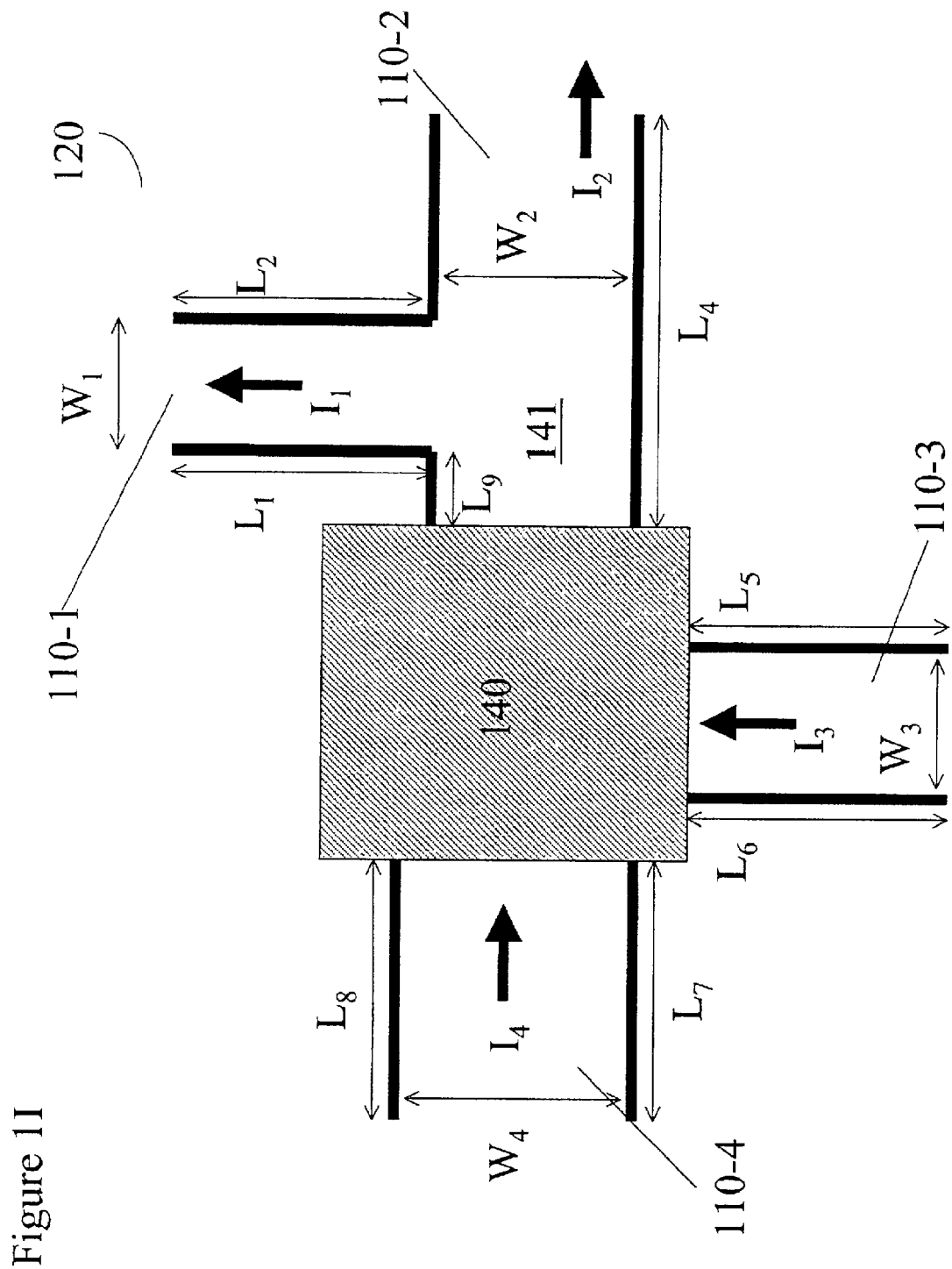

FIG. 1I shows a plan view of another embodiment of a four-terminal junction 120, with constriction junction 141 coupling terminals 110-1 and 110-2 and junction 140, which can be a two dimensional electron gas structure, coupling terminals 110-4 and 110-3 with constriction junction 141. Terminals 110-1, 110-2, 110-3, and 110-4 can carry superconducting currents $I_1$, $I_2$, $I_3$ and $I_4$, respectively. As before, all of the terminal lengths ($L_1$, $L_2$, $L_4$, $L_5$, $L_6$, $L_7$, $L_8$ and $L_9$) indicating the dimensions of terminals 110-1 through 110-4 can all be different and are typically chosen to be less than about 10 microns. The widths of terminals 110-1 through 110-4, $W_1$–$W_4$, can all be different and are typically chosen to be less than the coherence length of the superconducting material utilized in their fabrication. Terminals 110-1, 110-2, 110-3 and 110-4 can be fabricated of any superconducting material which can be coupled to a two dimensional electron gas junction 140.

In an exemplary embodiment, four-terminal junction 120 as shown in FIG. 1I can be fabricated of niobium with the following dimensions: widths $W_1$ and $W_2$ being approximately 0.5 microns; widths $W_3$ and $W_4$ being approximately 0.05 microns; lengths $L_1$, $L_2$, $L_4$, $L_5$, $L_6$, $L_7$, $L_9$, each being approximately 0.5 microns; and length $L_9$ being approximately 0.1 microns. The two dimensional electron gas structure of junction 140 can be formed of InAs.

In another exemplary embodiment, four-terminal junction 120 can be fabricated of niobium with the following dimensions: width $W_1$ being approximately 0.05 microns; width $W_4$ being approximately 0.08 microns; width $W_2$ being approximately 0.1 microns; width $W_3$ being approximately 0.15 microns; lengths $L_1$, $L_2$, $L_4$, $L_5$, $L_6$, $L_7$, and $L_9$ being approximately 0.5 microns; and length $L_{being\ approximately}$ 0.1 microns. The two dimensional electron gas structure of junction 140 can be formed of InAs.

Figure 1J:
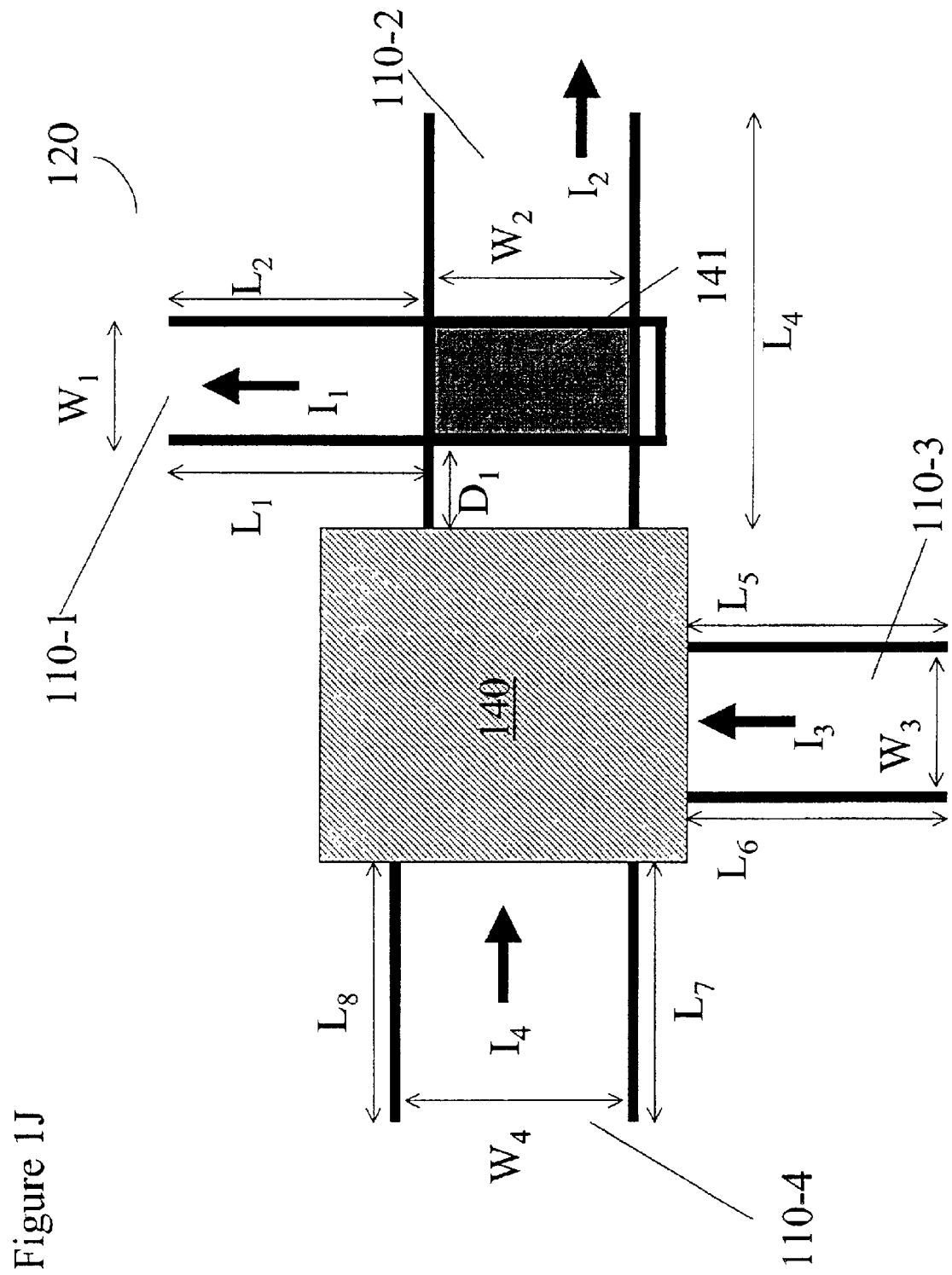

FIG. 1J shows a plan view of an embodiment of a four-terminal junction 120 having tunnel junction 141 coupling terminals 110-1 and 110-2 and two dimensional electron gas structure junction 140 coupling terminals 110-3 and 110-4 with junction 141. Superconducting currents $I_1$, $I_2$, $I_3$ and $I_4$ can exist in terminals 110-1, 110-2, 110-3 and 110-4, respectively. The terminal lengths indicating the dimensions of terminals 110-1 through 110-4, $L_1$, $L_2$, $L_4$, $L_5$, $L_6$, $L_7$, $L_8$, and $D_1$ in FIG. 1J, can all be different and are typically chosen to be less than 10 microns. The terminal widths $W_1$–$W_4$, indicating the widths of terminals 110-1 through 110-4, can all be different and are typically chosen to be less than the coherence length of the superconducting material of terminals 110-1 through 110-4. Terminals 110-1 through 110-4 can be fabricated of any superconducting material which can be coupled to the two dimensional electron gas structure of junction 140. Tunnel junction 141 is typically fabricated by introducing a layer of insulating material, such as aluminum oxide, between terminals 110-1 and 110-2, as was previously discussed with respect to FIGS. 1C and 1E.

An exemplary embodiment of four-terminal junction 120 can be fabricated of niobium with the following dimensions: widths $W_1$ and $W_2$ being approximately 0.5 microns; widths $W_3$ and $W_4$ being approximately 0.05 microns; lengths $L_1$, $L_2$, $L_4$, $L_5$, $L_6$, $L_7$, and $L_8$ each being approximately 0.5 microns; and length $D_1$ being approximately 0.1 microns. As previously discussed, the two dimensional electron gas structure of junction 140 can be formed of InAs. Additionally, tunnel junction 141 can be fabricated using a niobium oxide layer of thickness approximately 0.05 microns which is deposited onto terminal 110-2, upon which is deposited terminal 110-1.

Another exemplary embodiment of four-terminal junction 120 can be fabricated of niobium with the following dimensions: width $W_1$ being approximately 0.05 microns; width $W_4$ being approximately 0.08 microns; width $W_2$ being approximately 0.05 microns; width $W_3$ being approximately 0.15 microns; lengths $L_1$, $L_2$, $L_4$, $L_5$, $L_6$, $L_7$, and $L_8$ each being approximately 0.5 microns; and length $D_1$ being approximately 0.1 microns. The two dimensional electron gas structure of junction 140 can be formed of InAs and tunnel junction 141 can be formed with junctions 110-1 and 110-2 separated by a niobium oxide layer of approximately 0.05 microns thickness.

Figure 1K:
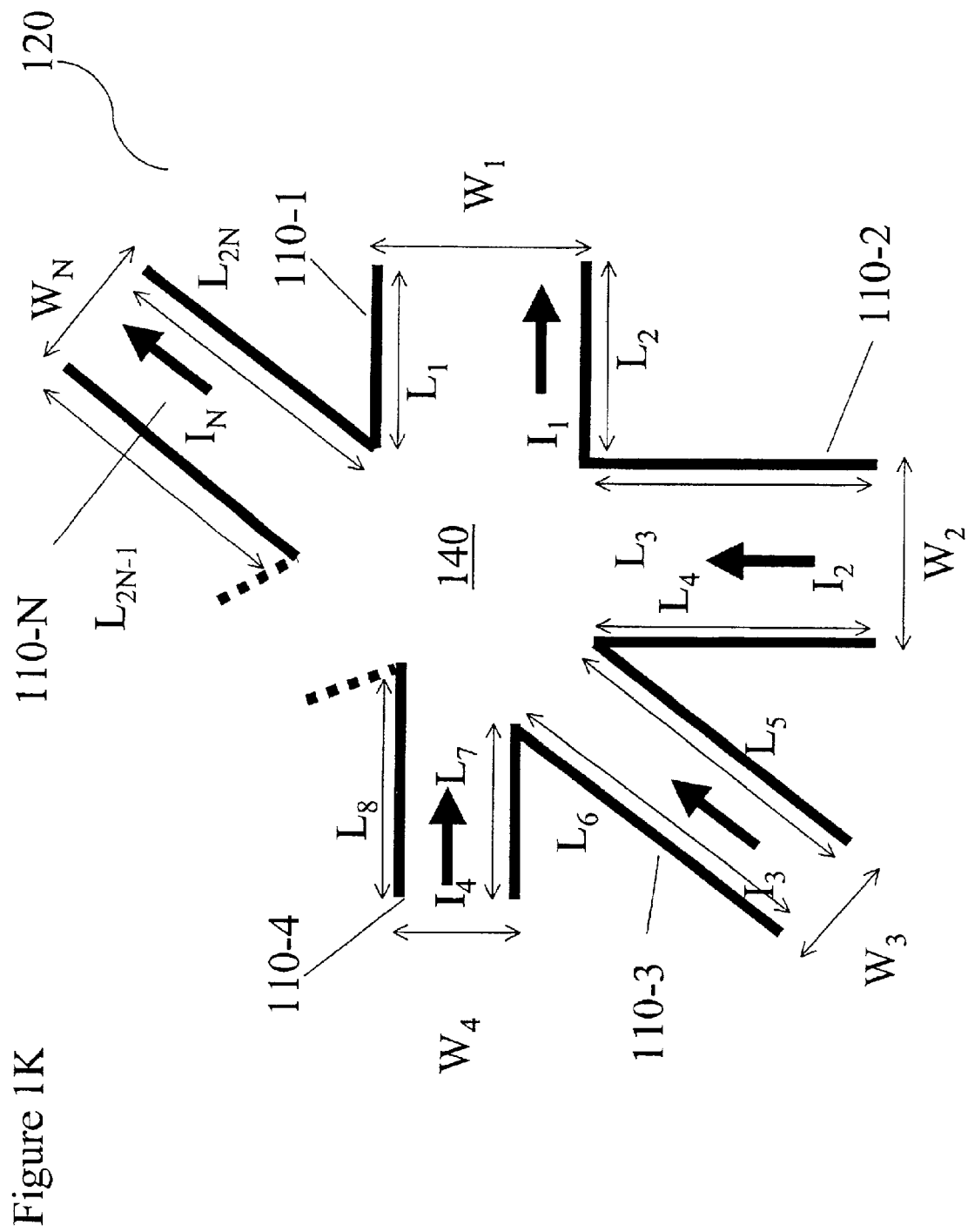

FIG. 1K shows a plan view of an embodiment of a multi-terminal junction 120 with constriction junction 140 coupling terminals 110-1 through 110-N, where N is an arbitrary integer. Terminals 110-1 through 110-N can carry superconducting currents $I_1$ through $I_N$, respectively. The terminal lengths $L_1$ through $L_{2N}$, which describe the dimensions of terminals 110-1 through 110-N, can all be different and are typically chosen to be less than about 10 microns. The widths of terminals 110-1 through 110-N, $W_1$–$W_N$, can also all be different and are typically chosen to be less than the coherence length of the superconducting material of multi-terminal junction 120. Multi-terminal constriction junction 120 can be fabricated of any superconducting material. In accordance with aspects of the present invention, multi-terminal junction 120 can be an element in superconducting circuits.

Figure 1L:
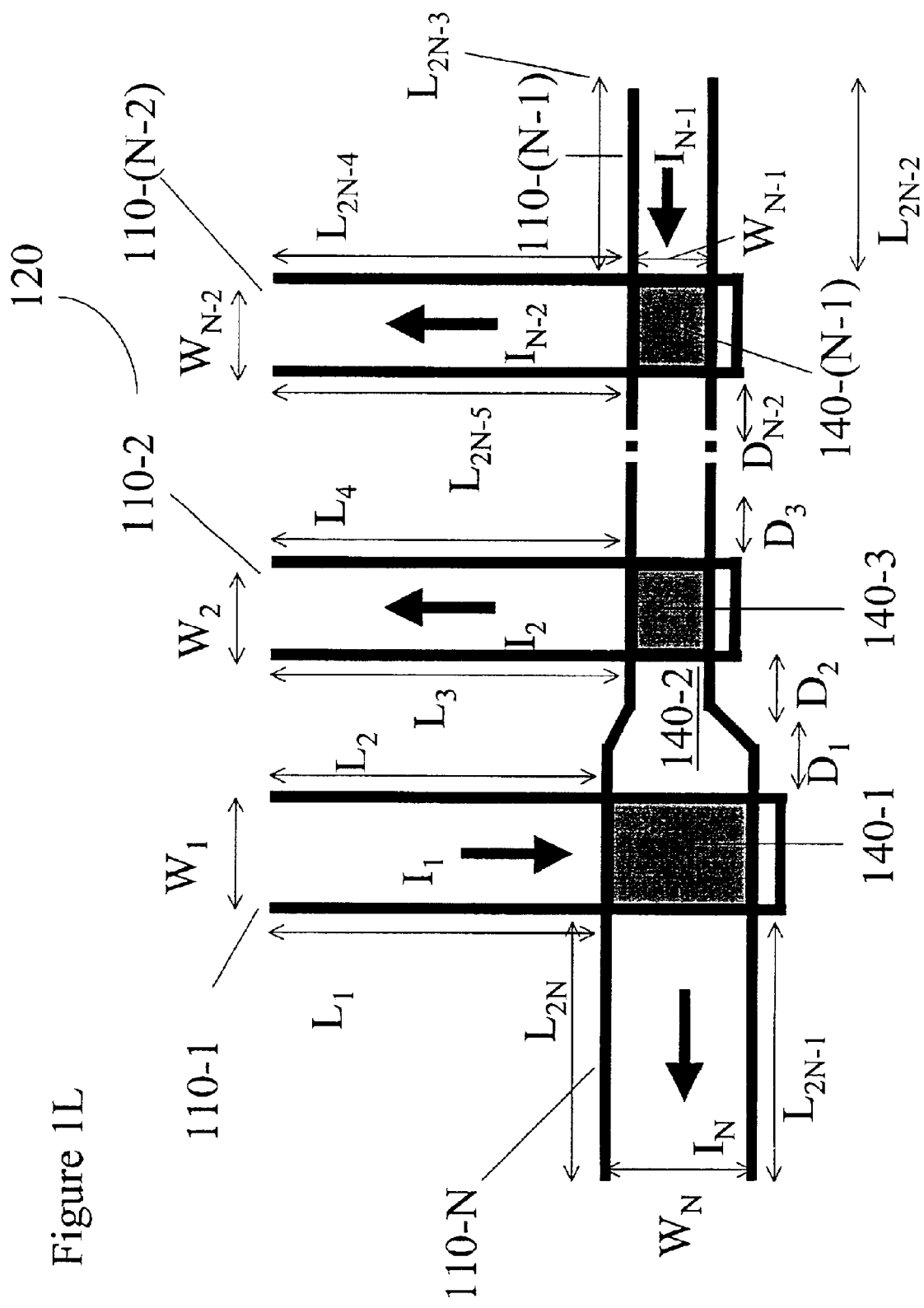

FIG. 1L shows a plan view of an embodiment of a multi-terminal junction 120 having a constriction junction 140-2 coupling terminals 110-N and 110-(N−1), a tunnel junction 140-1 coupling terminals 110-N with 110-1, and tunnel junctions 140-3 through 140-(N−1) coupling junctions 110-2 through 110-(N−2), respectively, to terminal 110-(N−1), where N is an arbitrary number. Terminals 110-1 through 110-N can carry superconducting currents $I_1$ through $I_N$, respectively. The lengths $L_1$ through $L_{2N}$, which characterize the dimensions of terminals 110-1 through 110-N, can all be different and are typically chosen to be less than about 10 microns. The widths of terminals 110-1 through 110-N, $W_1$–$W_N$, can all be different and are typically chosen to be less than the coherence length of the superconductor used. The separation between junctions, $D_1$ through $D_{N-2}$, can also all be different and are typically chosen to be less than about 10 microns. Multi-terminal junction 120 can be fabricated of any superconducting material. In accordance with certain aspects of the present invention, multi-terminal junction 120 can be utilized as a circuit element in superconducting circuits.

Figure 1M:
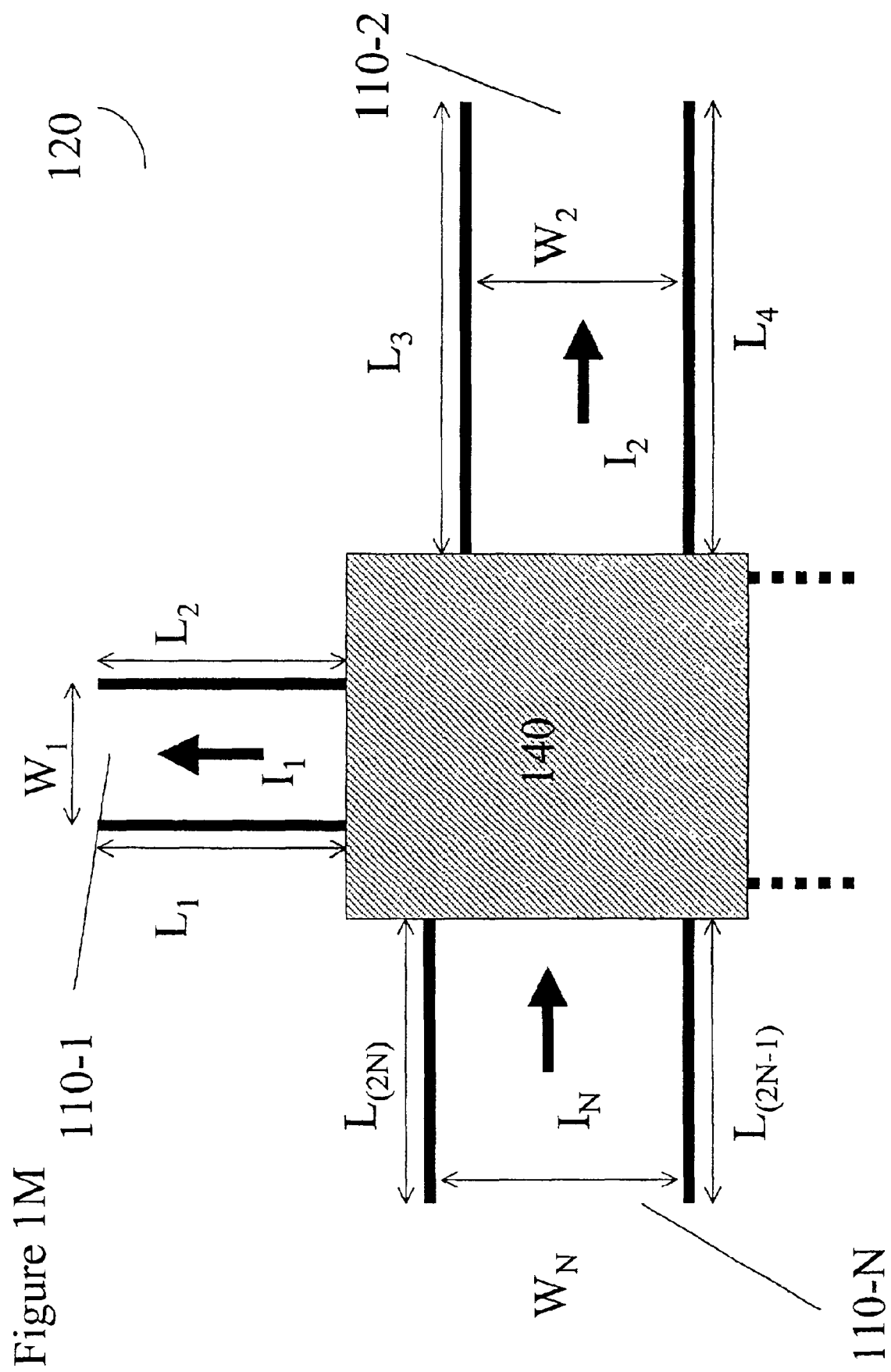

FIG. 1M shows a plan view of another embodiment of multi-terminal junction 120. Multi-terminal junction 120 of FIG. 1M includes a two dimensional electron gas junction 140 coupling terminals 110-1 through 110-N, where N is an integer. As before, terminals 110-1 through 10-N can carry superconducting currents $I_1$ through $I_N$, respectively. The terminal lengths $L_1$ through $L_{(2N)}$, which indicate the dimensions of terminals 110-1 through 110-N, can all be different and are typically chosen to be less than about 10 microns. The widths of terminals 110-1 through 110-N, $W_1$–$W_N$, can all be different and are typically chosen to be less than the coherence length of the superconducting material of terminals 110-1 through 110-N. Terminals 110-1 through 110-N can be fabricated from any superconducting material. Two dimensional electron gas junction 140 can, for example, be formed of InAs. In an exemplary embodiment the two dimensional electron gas is formed of an InAs layer deposited on an AlSb substrate. Terminals 110-1 through 110-N can be formed of niobium and can be deposited on the InAs layer. In accordance with certain embodiments of the invention, multi-terminal junction 120 can be used as a circuit element in superconducting circuits.

In general, multi-terminal junction 120 can include any number of terminals coupled by any types of junction. The embodiments of junction 120 shown in FIGS. 1A through 1M are exemplary only. One skilled in the art will recognize a multitude of variations from those shown above. Those variations are intended to be within the scope of this disclosure.

Additionally, qubit 100 shown in FIG. 13 illustratively shows terminals 110-N and 110-1 coupled to portions 124 and 125 of superconducting loop 122. In general, superconducting loop 122 can be formed with any arbitrary pair of terminals 110-1 through 110-N. Further, qubit 100 shows phase shifter 123 as part of superconducting loop 122.

Figure 2A:
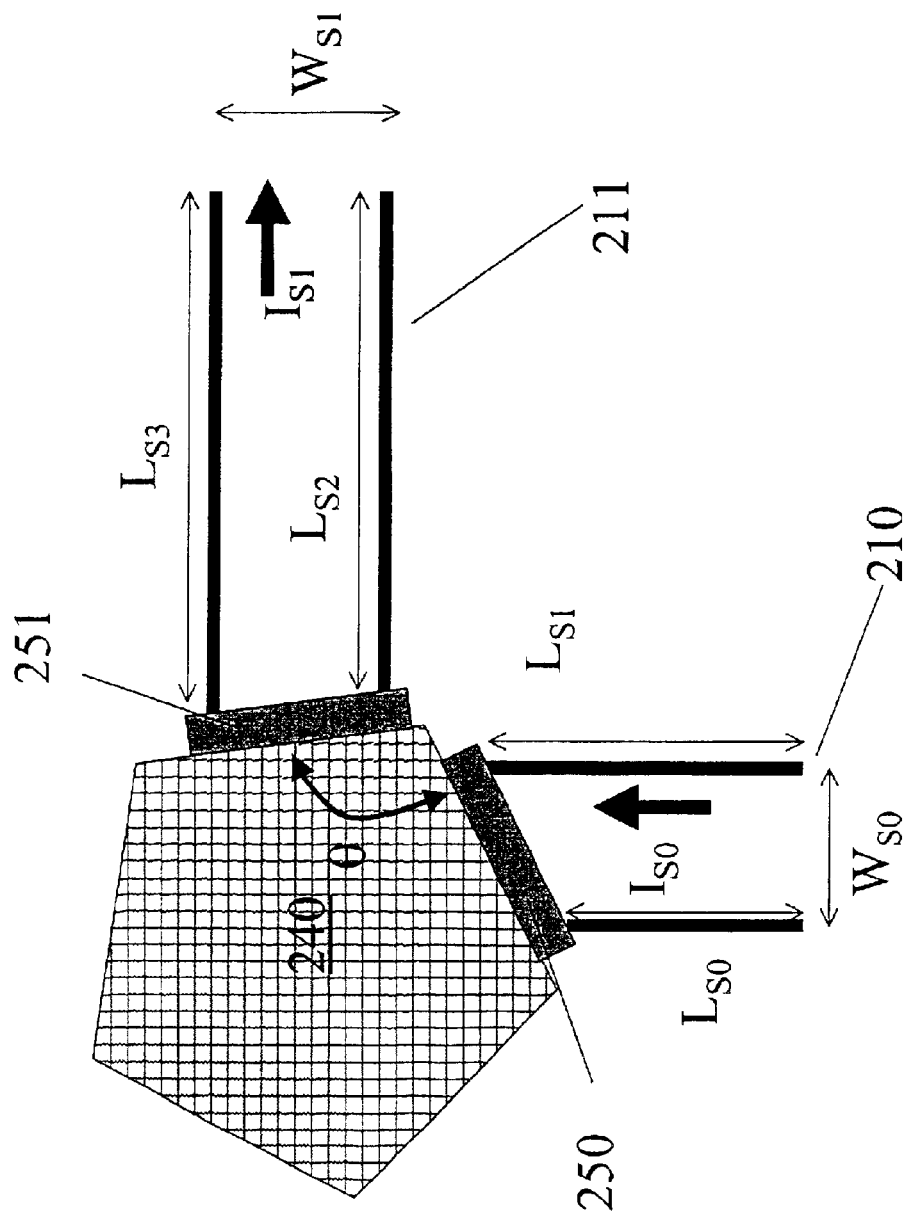
FIGS. 2A–2G show example embodiments of phase shifter structures in accordance with aspects of the present invention.

FIG. 2A shows a plan view of an embodiment of a two terminal phase shifter 123 having a S/N/D/N/S heterostructure. Phase shifter 123 of FIG. 2A includes an s-wave superconducting terminal 210 coupled to a normal metal connector 250 which is coupled to a d-wave superconductor 240 which, in turn, is coupled to a normal metal connector 251 which is coupled to an s-wave superconducting terminal 211. In some embodiments all lengths and widths $L_{S0}$, $L_{S1}$, $L_{S2}$, $L_{S3}$, $W_{S0}$, and $W_{S1}$, indicating the termination of terminals 210 and 211, can all be different. In some embodiments, the terminal lengths and widths can all be less than about five microns.

Figure 2B:
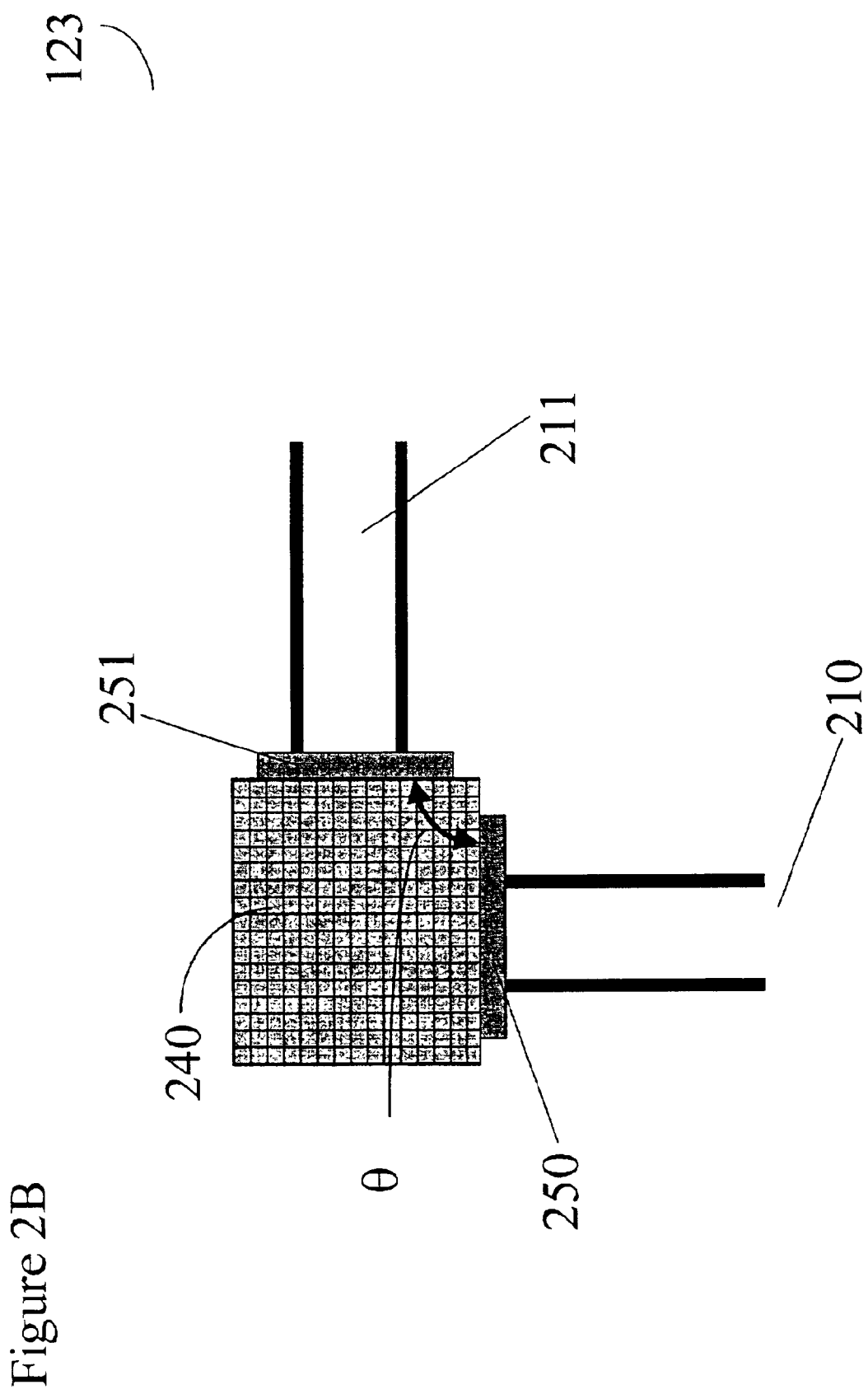

Modifying the angle of contact between the d-wave superconductor 240 and each of the two external terminals 210 and 211 modifies the phase shift acquired in transit through phase shifter 123 in a known way. For example, if the normal metal connectors, 250 and 251, are at a right angle to each other, the total phase is shifted by $\pi$ through the phase shifter 123. Furthermore, if the normal metal connectors were directly opposite (0° apart), then there would be no accumulated phase shift. Following from this, any angle between 0° and 90°, where the angle is represented by θ, would lead to a phase shift of 2θ. FIG. 2B illustrates an exemplary embodiment of a π-phase shifter. The angle θ is 90° and the normal metal connector 250 is directly parallel with the crystal alignment of the junction 240. There is no restriction that the normal metal connector 250 be directly parallel with the crystal alignment of the junction 240.

The physical characteristics of the normal metal connectors 250 and 251 can be chosen so as to provide standard Josephson junction connections between terminal 210 and d-wave superconductor 240 and terminal 211 and d-wave superconductor 240, respectively. Currents flowing in terminals 210 and 211 are labeled $I_{S0}$ and $I_{S1}$, respectively. The dimensions of d-wave superconductor 240 and connectors 250 and 251 are not critical.

In some embodiments terminals 210 and 211 can be niobium (Nb), aluminum (Al), lead (Pb) or tin (Sn). In some embodiments d-wave superconductor 240 can be $YBa_2Cu_3O_{7-d}$, where $0.2<d<0.8$. In accordance with an exemplary embodiment, terminals 210 and 211 can be made of niobium, connectors 250 and 251 of gold, and d-wave superconductor 240 of $YBa_2Cu_3O_{6.68}$. Lengths $L_{S0}$, $L_{S1}$, $L_{S2}$, and $L_{S3}$ can be approximately 0.5 microns, widths $W_{S0}$ and $W_{S1}$ can be approximately 0.5 microns, and connectors 250 and 251 can be approximately 0.05 microns thick. The embodiment of phase shifter 123 shown in FIG. 2B will produce a phase shift of $\pi$ in the superconducting order parameter accumulated in transition between terminals 210 and 211.

Figure 2C:
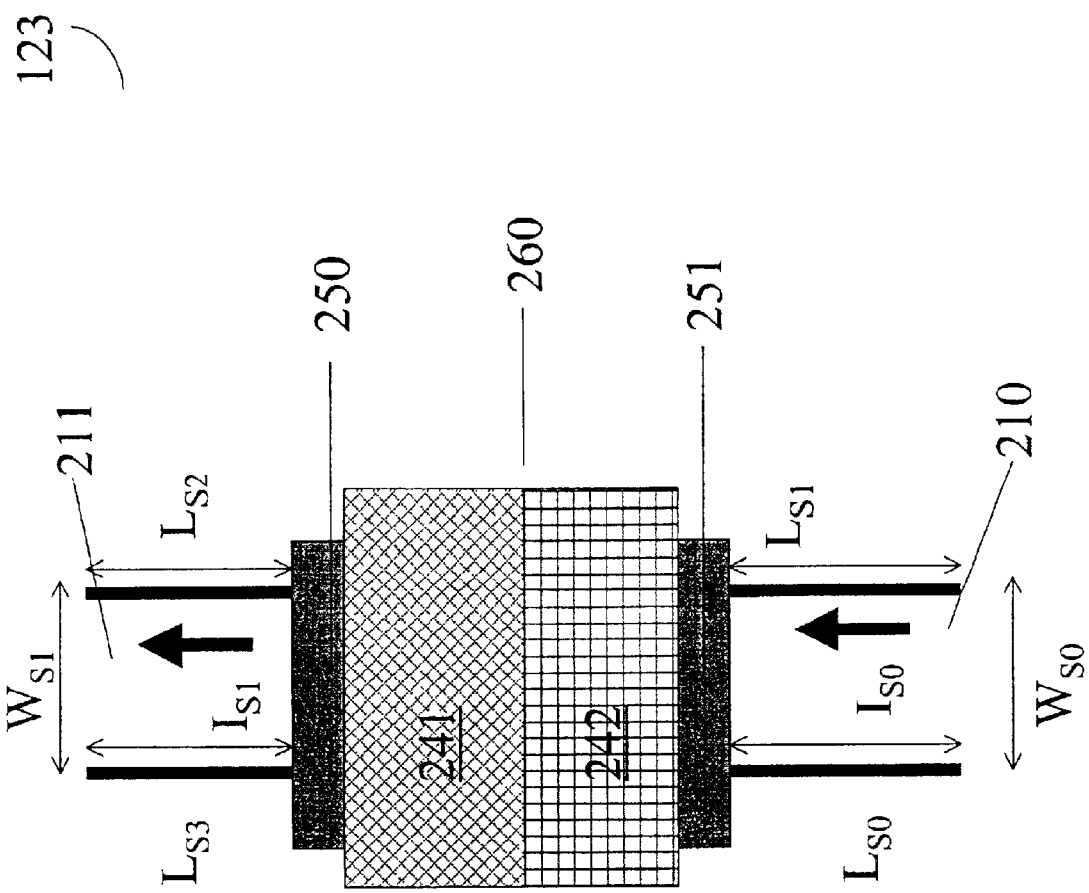

FIG. 2C shows a plan view of another embodiment of two terminal phase shifter 123. Phase shifter 123 as shown in FIG. 2C includes a heterostructure containing a grain boundary junction 260 between two lattice-mismatched d-wave superconductors 241 and 242. In some embodiments the d-wave superconductors 241 and 242 can be $YBa_2Cu_3O_{7-d}$, where $0.2<d<0.8$. Modifying the angle of mismatch of the d-wave order parameters at grain boundary 260 between superconductors 241 and 242 affects the phase shift across grain boundary 260 in a known way. For example, FIG. 2C illustrates a mismatch angle of 45° which would lead to a $\pi/2$-phse shift. The behavior and resulting phase shift of such junctions are well known and are described in detail in C. Bruder, A. van Otterlo, and G. T. Zimanyi, "Tunnel Junctions of Unconventional Superconductors," Phys. Rev. B 51, 12904–07 (1995), and furthermore in R. R. Schultz, B. Chesca, B. Goetz, C. W. Schneider, A. Schmehl, H. Bielefeldt, H. Hilgenkamp, J. Mannhart, and C. C. Tsuei, "Design and Realization of an all d-Wave dc π-Superconducting Quantum Interference Device," *Applied Physics Letters*, 76. p. 912–14 (2000), each of which are herein incorporated by reference in their entirety. In some embodiments the mismatch at grain boundary 260 can be achieved by deposition of the d-wave superconductor onto a bi-crystal substrate with an existing lattice-mismatched grain boundary which the d-wave superconductor inherits.

Figure 2D:
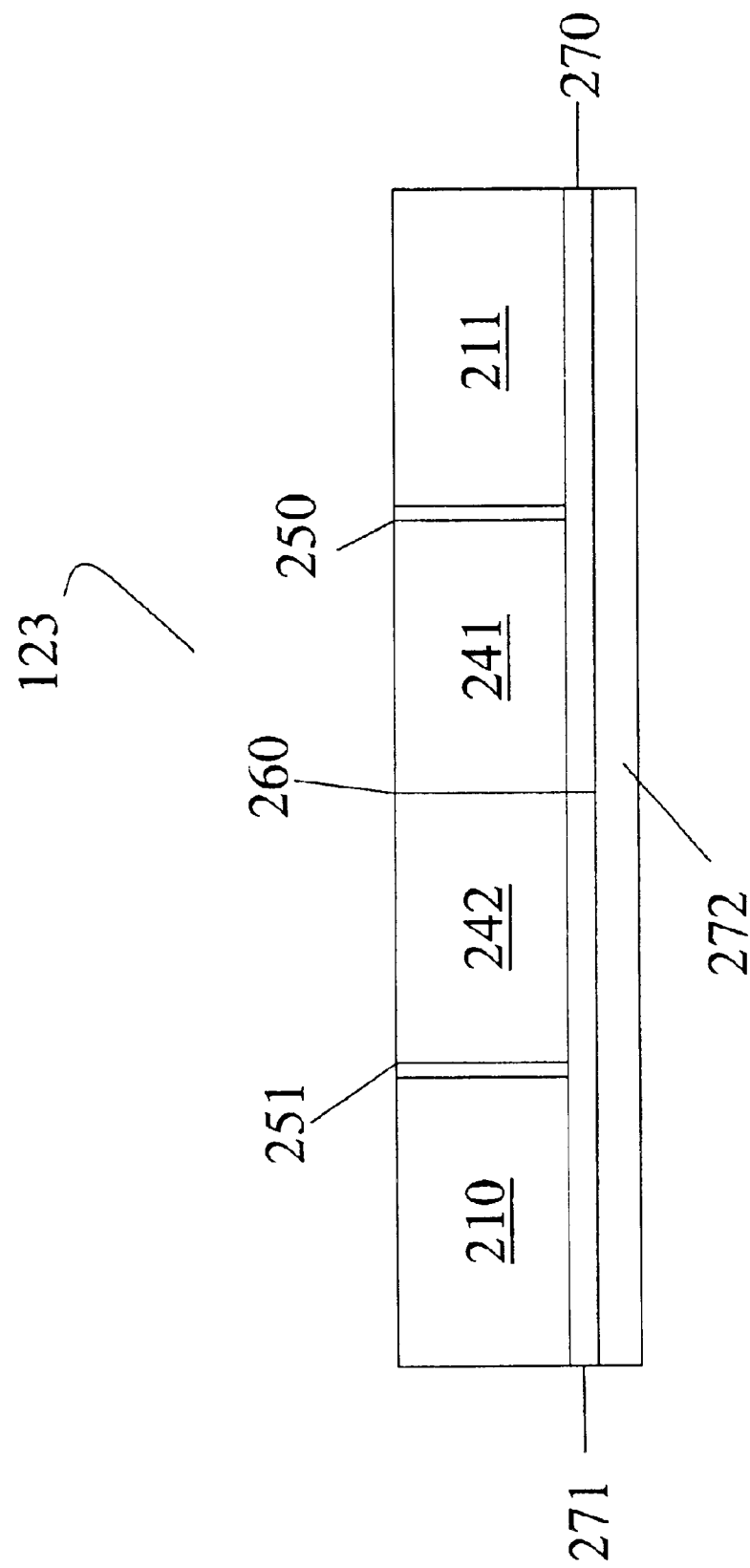

FIG. 2D shows a cross sectional view of phase shifter 123 as shown in FIG. 2C. Superconductors 242 and 241 are grown on substrate crystals 271 and 270, respectively. Substrate crystals 271 and 270 can be mounted on substrate 272. In some embodiments bi-crystal substrate 270 and 271 can be an insulator such as $SrTiO_3$ (strontium titanate) or $Ti:Al_2O_3$ (sapphire) which are commercially available.

In some embodiments, grain boundary 260 can be created by using a bi-epitaxial method where a d-wave superconductor is deposited onto a substrate containing seed layers upon which the d-wave superconductor grows in a different crystallographic direction than on the substrate itself. In some embodiments the substrate can be an insulator such as strontium titanate and the seed layers can be CeO (cerium oxide) or MgO (magnesium oxide). See F. Tafuri, F. Carillo, F. Lombardi, F. Miletto Granoziou, F. Ricci, U. Scotti di Uccio, A. Barone, G. Testa, E. Sarnelli, J. R. Kirtley, "Feasibility of Biepitaxial $YBa_2Cu_3O_{7-x}$ Josephson Junctions for Fundamental Studies and Potential Circuit Implementation, Los Alamos preprint cond-mat/0010128. published Phys. Rev. B 62, 14431–38 (2000), which is herein incorporated by reference in its entirety.

In some embodiments normal metal connector 250 couples d-wave superconductor 241 to s-wave superconducting terminal 211. In some embodiments normal metal connector 251 couples d-wave superconductor 242 to s-wave superconducting terminal 210. In some embodiments normal metal connectors 250 and 251 can be gold (Au), silver (Ag), platinum (Pt), or any other normal metal substance; and s-wave superconducting terminals 210 and 211 can be aluminum (Al), niobium (Nb), or any other superconductor with s-wave pairing symmetry.

In some embodiments all lengths and widths $L_{S0}$. $L_{S1}$. $L_{S2}$. $L_{S3}$. $W_{S0}$. and $W_{S1}$ can all be different, in some embodiments each of the lengths can be less than about one micron. The physical characteristics of normal metal connectors 250 and 251 can be chosen so as to provide standard Josephson junction connections between terminals 210 and d-wave superconductor 241 and terminals 211 and d-wave superconductor 240, respectively. Currents flowing in terminals 210 and 211 are labeled $I^{S0}$ and $I_{S1}$. respectively. The dimensions of d-wave superconductor 240 and connectors 250 and 251 are not critical.

In accordance with an exemplary embodiment of phase shifter 123 as shown in FIG. 2C, terminals 210 and 211 can be made of niobium, connectors 250 and 251 of gold, and d-wave superconductor 240 and 241 of $YBa_2Cu_3O_{6.68}$. Lengths $L_{S0}$. $L_{S1}$. $L_{S2}$. and $L_{S3}$ can be approximately 0.5 microns, widths $W_{S0}$ and $W_{S1}$ can be approximately 0.5 microns, and connectors 250 and 251 can be approximately 0.05 microns thick. The d-wave superconductors 240 and 241 can have a symmetric 22.5/22.5 degree lattice mismatch, in which the crystallographic a-axis of d-wave superconductor 240 makes an angle of +22.5 degrees with grain boundary 260 and the crystallographic a-axis of d-wave superconductor 241 makes an angle of −22.5 degrees with grain boundary 260. This type of grain boundary is typically called a symmetric 45 degree grain boundary, as the angle between the crystallographic a-axes of superconductors 240 and 241 is 45 degrees. This embodiment will produce a phase shift of π in the superconducting order parameter accumulated in transition across grain boundary 260. It is also "quiet" in the sense that no spontaneous supercurrents or magnetic fluxes are produced at a symmetric 45 degree grain boundary and therefore noise due to phase shifter 123 in a superconducting electronic circuit is reduced.

Figure 2E:
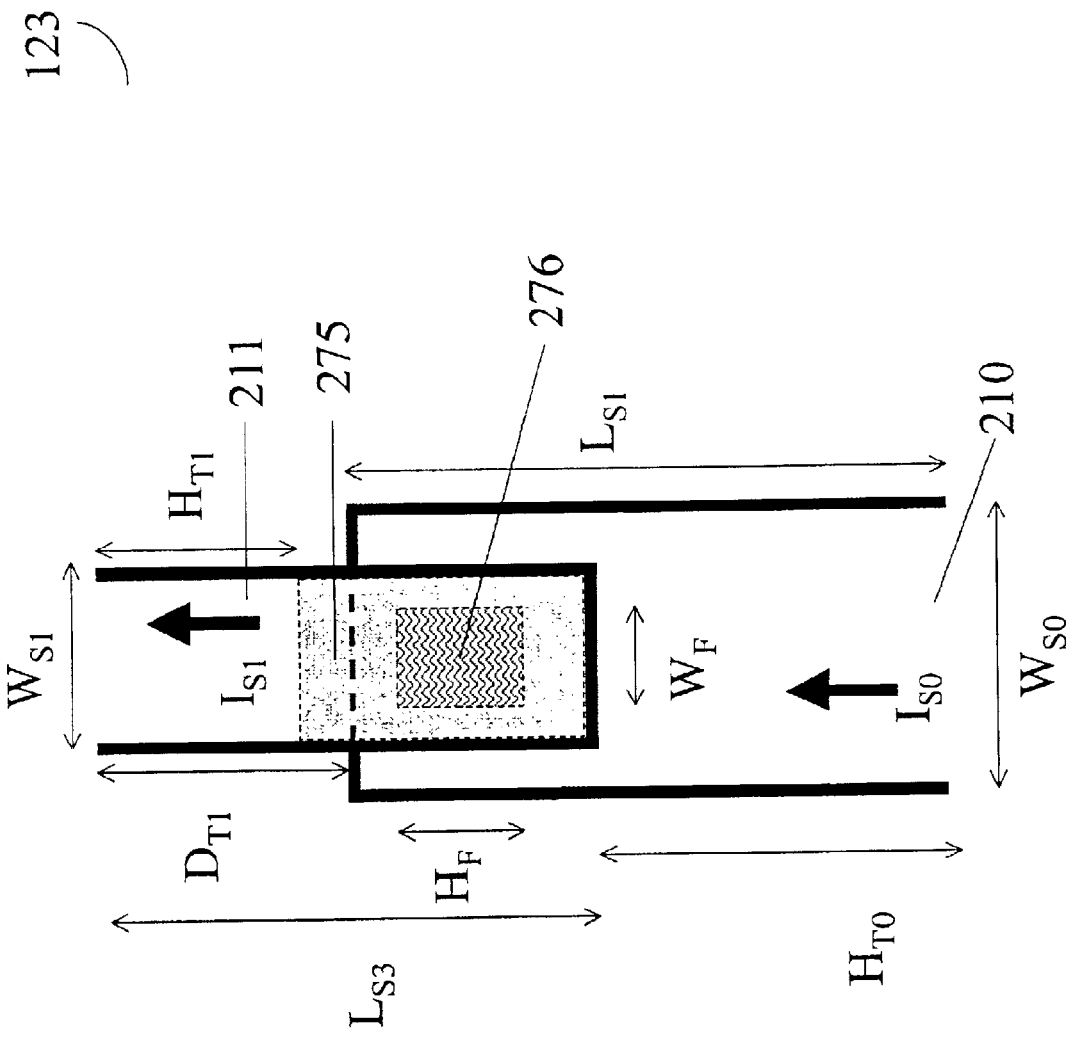
Figure 2F:
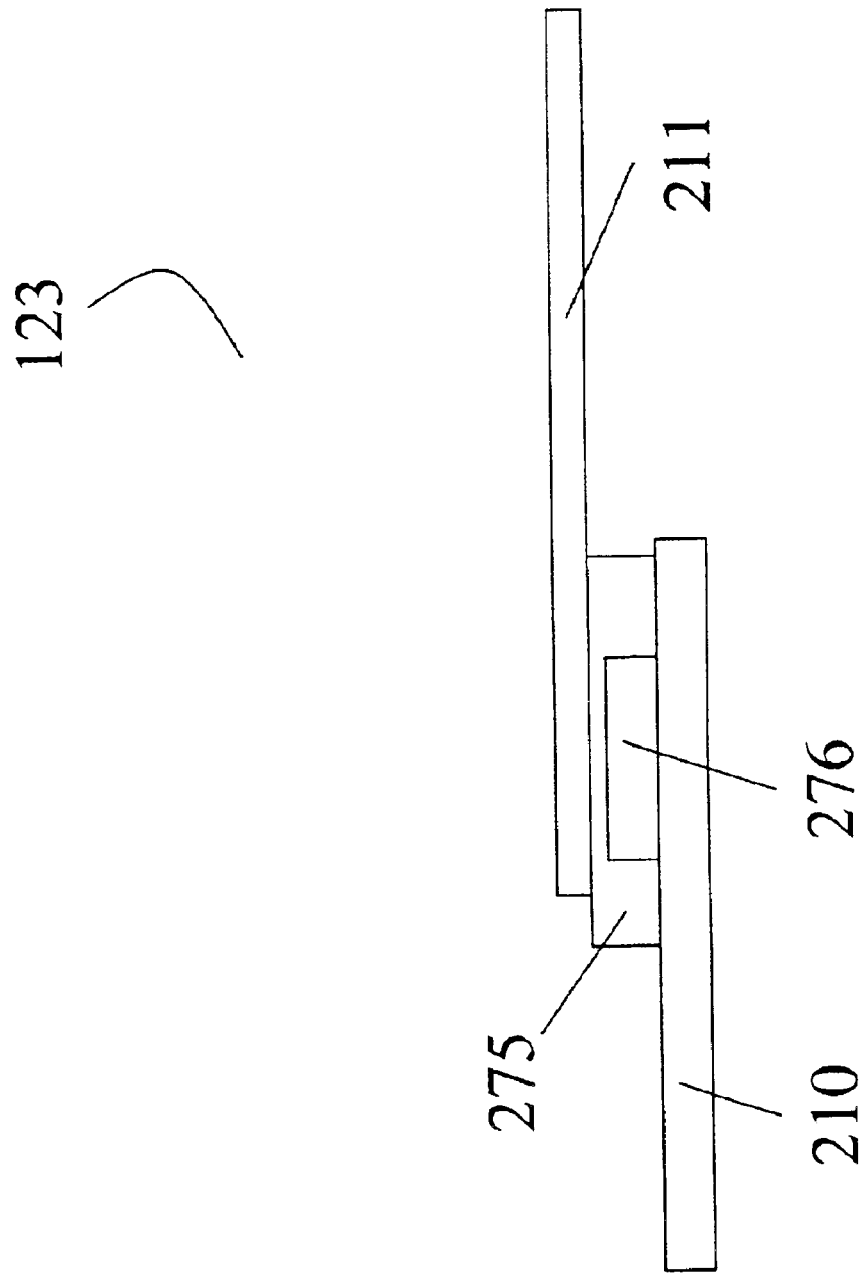

FIG. 2E shows a plan view of another embodiment of a two terminal phase shifter 123. Phase shifter 123 of FIG. 2E includes a junction between s-wave superconductor 210, ferromagnetic region 276 and s-wave superconductor 211. In this embodiment the s-wave superconductor/ferromagnet/s-wave superconductor junction is in the axis normal to the plane shown in FIG. 2E. FIG. 2F shows a cross sectional view of phase shifter 123 with ferromagnet 275 between s-wave superconductor 210 (on the bottom) and s-wave superconductor 211 (on the top). An insulating barrier 275, shown in gray in FIG. 2E, provides insulation between terminals 210 and 211.

Modifying the geometry of the ferromagnetic region 275 can change the angle of the phase shift in a known way. In FIG. 2E, lengths $L_{S1}$ and $L_{S3}$. as before, indicate the lengths of terminals 210 and 211, respectively. $H_{T0}$ and $H_{T1}$ indicate the distance between the edge of terminals 210 and 211, respectively, and the edge of insulation region 275. The quantities $H_F$ and $W_F$ indicate the height and width of ferromagnetic region 276, respectively. The quantity $D_{T1}$ indicates the distance between the edge of terminal 211 and the edge of terminal 210. In some embodiments, lengths and widths $D_{T1}$. $H_{T1}$. $L_{S2}$. $H_{T0}$. $W_{S0}$. and $W_{S1}$ can be all different and, in some embodiments, all be less than about five microns. In some embodiments lengths $H_F$ and $W_F$ can be different and, in some embodiments, can be less than about one micron, with these lengths chosen so as to give a required phase shift. Currents flowing in terminals 210 and 211 are labeled $I_{S0}$ and $I_{S1}$. respectively.

In some embodiments terminals 210 and 211 can be niobium (Nb), aluminum (Al), lead (Pb), tin (Sn), or any other superconductor with s-wave pairing symmetry. In some embodiments insulating region 275 can be aluminum oxide ($AlO_2$) or any other insulating material. In some embodiments ferromagnetic region 276 can be an alloy of copper and nickel (Cu:Ni) or any other ferromagnetic material. One method for fabricating an example of phase shifter 123 as shown in FIGS. 2E and 2F is described in V. V. Ryazanov, V. A. Oboznov, A. Yu. Rusanov, A. V. Veretennikov, A. A. Golubov, J. Aarts, "Coupling of Two Superconductors Through a Ferromagnet: Evidence for a π-Junction," Los Alamos preprint server cond-mat/0008364. submitted to *Phys. Rev. Lett.* (2000), which is herein incorporated by reference in its entirety.

Figure 2G:
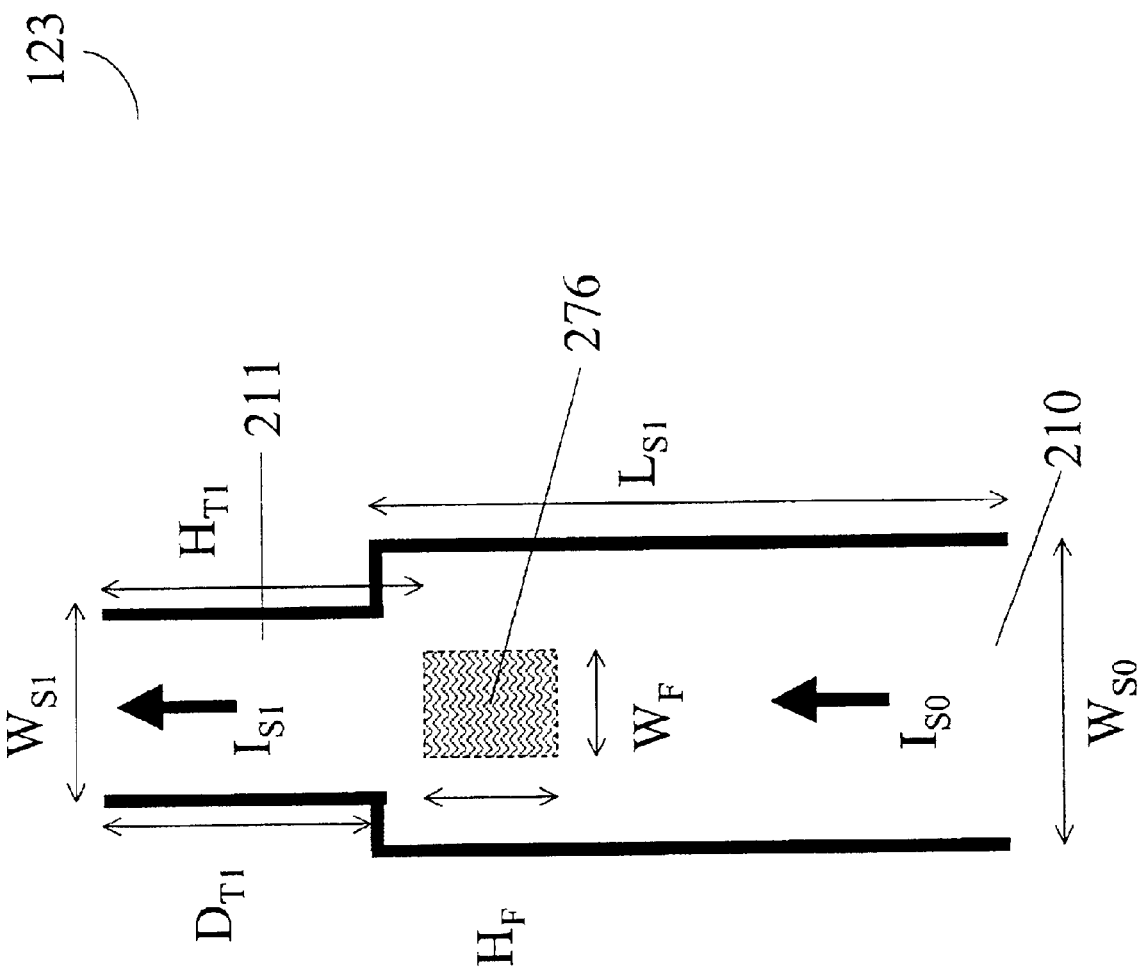

FIG. 2G shows a plan view of another embodiment of a two terminal phase shifter 123 having a ferromagnetic region 276 imbedded in a junction between s-wave superconductors 210 and 211. In this embodiment the s-wave superconductor/ferromagnet/s-wave superconductor junction is in the plane of FIG. 2G. Thus, the ferromagnetic region, 276, is directly in the plane with of the terminals 210 and 211. Modifying the geometry of the ferromagnetic region 276 can change the angle of the phase shift in a known way. In some embodiments lengths and widths $D_{T1}$. $H_{T1}$. $L_{S2}$. $W_{S0}$. and $W_{S1}$ can be all different and, in some embodiments, all be less than about five microns. In some embodiments lengths $H_F$ and $W_F$ can be different and less than about one micron, with these lengths chosen so as to give a required phase shift. Currents flowing in terminals 210 and 211 are labeled $I_{S0}$ and $I_{S1}$, respectively. In some embodiments terminals 210 and 211 can be niobium (Nb), aluminum (Al), lead (Pb) tin (Sn), or any other superconductor with s-wave pairing symmetry. In some embodiments ferromagnetic region 276 can be an alloy of copper and nickel (Cu:Ni) or any other ferromagnetic material. Ferromagnetic region 276 can be prepared by, for example, implantation of a ferromagnetic substance into a superconducting junction.

Figure 3A:
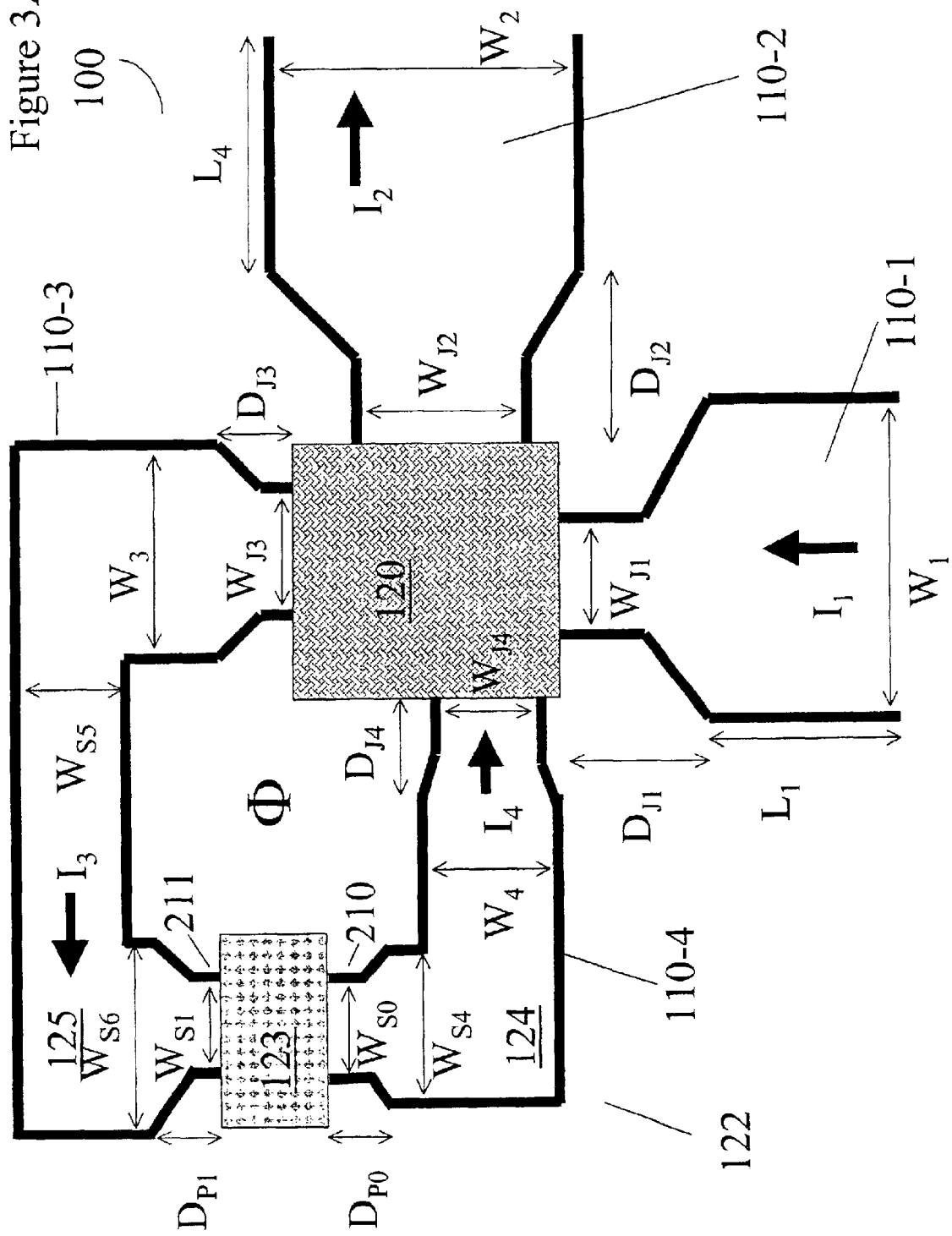
FIG. 3A shows a plan view of a four-terminal qubit with intrinsic phase shifter qubit horizontal architecture in accordance with embodiments of the present invention.

FIG. 3A shows a plan view of an embodiment of a four-terminal qubit 100 having junction 120 and phase shifter 123 in superconducting loop 122. Junction 120 can be any four-terminal junction. Examples of embodiments of junction 120 are shown in FIGS. 1A through 1M. Examples of embodiments of phase shifter 123 are shown in FIGS. 2A through 2G. In Qubit 100 as shown in FIG. 3A, terminal 110-1 can be reduced from width $W_1$ to width $W_{J1}$ before being coupled to junction 120, terminal 110-2 can be reduced from width $W_2$ to width $W_{J2}$ before being coupled to junction 120, terminal 110-3 can be reduced from width $W_3$ to width $W_{J3}$ before being coupled to junction 120, and terminal 110-4 can be reduced from width $W_4$ to width $W_{j4}$ before being coupled to junction 120. Terminal 210 of phase shift 123 is coupled to portion 124 having width $W_{S4}$ and terminal 211 of phase shift 123 is coupled to portion 125 having width $W_{S6}$. Terminal 110-3 is coupled to portion 125 having width $W_{S5}$.

Terminals 110-1, 110-2, 110-3, 110-4, 210, and 211 along with portions 124 and 125 can be made of any superconducting material compatible with the particular embodiments of phase shifter 123 and four-terminal junction 120. Superconducting currents $I_1$, $I_2$, $I_3$ and $I_4$ can exist in terminals 110-1, 110-2, 110-3 and 110-4, respectively. Widths $W_{J1}$ through $W_{J4}$ are constrained only by the requirement of compatibility with junction 120 and widths $W_{S0}$ and $W_{S1}$ are compatible with phase shifter 123. In some embodiments, widths $W_1$ through $W_4$, $W_{J1}$ through $W_{J4}$, and $W_{S0}$ through $W_{S6}$ can all be less than about 10 microns. Lengths $L_1$, $L_2$, $D_{J1}$, $D_{J2}$, $D_{J3}$, $D_{J4}$, $D_{P0}$, and $D_{P1}$ are all compatible with phase shifter 123 and four-terminal junction 120 and, in some embodiments, can be all less than about 10 microns. Superconducting loop 122 can be threaded by a magnetic flux $\Phi$, which may contain contributions from a spontaneous supercurrent in the loop and externally applied magnetic fields.

Four-terminal junction 120 couples one end of each of the four terminals 110-1 through 110-4 by, for example, constriction junctions, tunnel junctions, two-dimensional electron gas structures, or combinations of these. The choice of the physical sizes of the elements in four-terminal junction 120 that couple the four terminals 110-1 through 110-4 also affects the function of qubit 100. To achieve a small magnetic flux $\Phi$ in superconducting loop 122 (which is desirable for coherence consideration) and maximum influence of the transport current $I_T = I_1 = I_2$ on the properties of superconducting loop 122, in some embodiments the links in the transport loop are much wider than the ones in superconducting loop 122, that is, $W_{J1}$ and $W_{J2}$ are much larger than $W_{J3}$ and $W_{J4}$. A small magnetic flux $\Phi$ can exist even in the absence of external magnetic fields because of spontaneous supercurrents. In those embodiments, the height of the potential energy barrier between the two degenerate quantum states of the qubit quantum system of qubit 100 will be affected most pronouncedly by the applied transport current $I_T = I_1 = I_2$.

SQUID loop 122 with intrinsic phase shifter 123 can provide a basic block for construction of qubit 100 but can also be utilized for demonstration of macroscopic quantum tunneling and incoherent quantum noise in a solid state system. As described further below, the macroscopic quantum tunneling in a set of independent four-terminal qubits 100 with intrinsic phase shifters 123 (i.e., with no entanglements between individual qubits) permits construction of a random number generator that generates random series with zero correlation between numbers in the random series.

Four-terminal qubit 100 with intrinsic phase shifter 123 includes a superconducting loop 122 linking two of terminals 110-1 through 110-4, terminals 110-4 and 110-3 in FIG. 3A. Four-terminal qubit 100 with intrinsic phase shifter 123 can be made superconducting by reducing the temperature of qubit 100 below the superconducting critical temperature $T_c$ of all of the superconducting materials utilized in the formation of qubit 100. Four-terminal junction 120 may be either symmetric or asymmetric, as was discussed with respect to FIGS. 1A through 1M. The superconducting materials from which qubit 100 is constructed are constrained only by the requirement of compatibility with phase shifter 123 and four-terminal junction 120 and otherwise may have any pairing symmetry. For example, materials used may be s-wave, for example, niobium or aluminum, or d-wave, such as a high-Tc cuprate, for example $YBa_2Cu_3O_{7-x}$, or any superconducting material in which the Cooper pairs are in a state with non-zero orbital angular momentum.

Figure 3B:
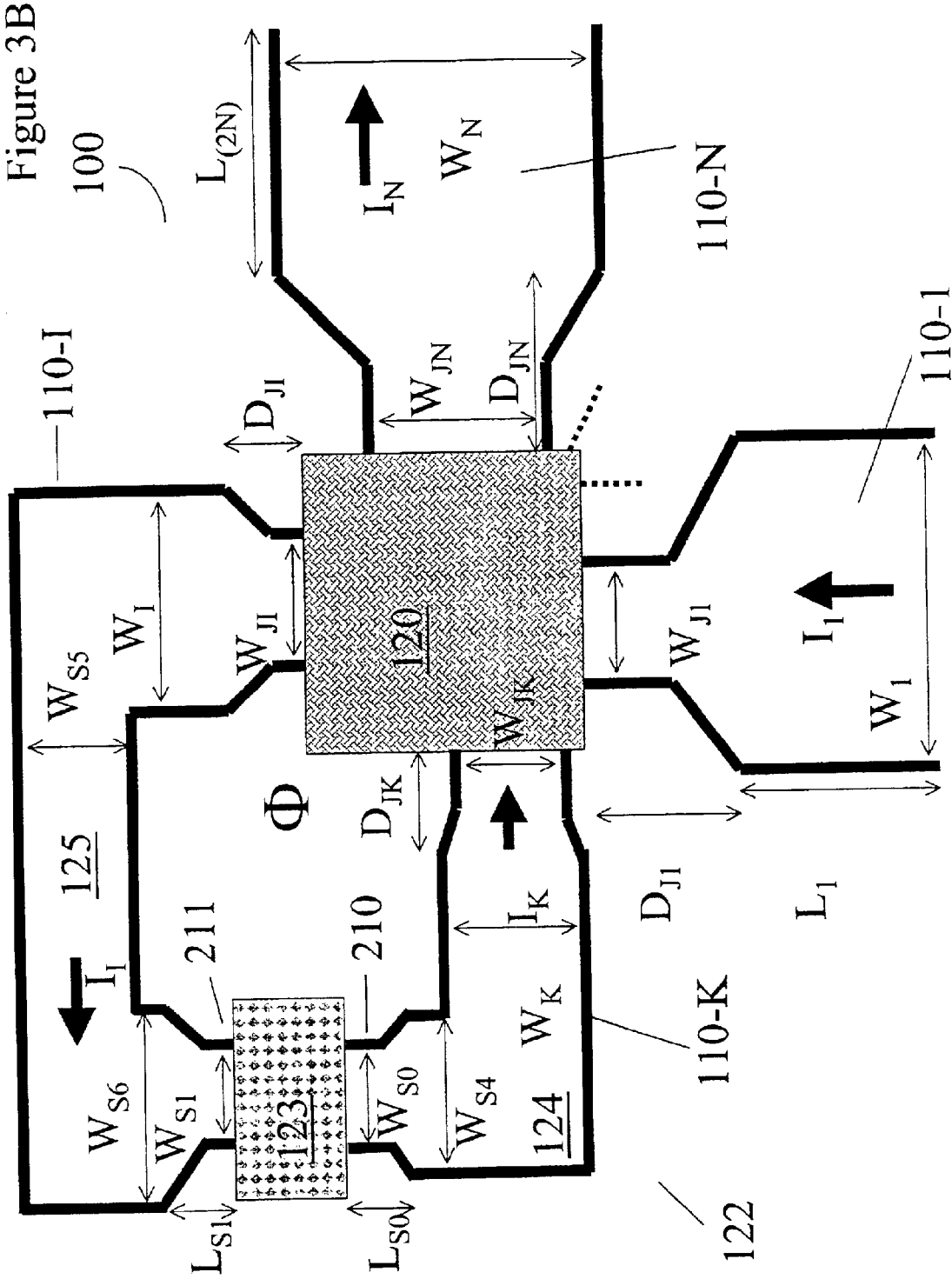
FIG. 3B shows a plan view of a multi-terminal qubit with intrinsic phase shifter qubit horizontal architecture in accordance with embodiments of the present invention.

Four-terminal qubit 100 with intrinsic phase shifter 123 can be formed on an insulating substrate such as, for example, strontium titanate or sapphire. (See FIG. 2C, for example). Phase shifter 123 may be any structure that shifts the phase of the superconducting order parameter in transition across the structure. Examples of phase shifter 123 are shown in FIGS. 2A through 2G. Superconducting loop 122 can include multi-crystalline d-wave superconducting material where the phase shift is caused by transition through the crystalline boundaries of the multi-crystalline material. In such embodiments, phase shifter 123 is distributed throughout portions 124 and 125 of FIG. 3A. FIG. 3B shows a plan view of an embodiment of a N-terminal qubit 100 according to the present invention. Qubit 100 includes terminals 110-1 through 110-N where superconducting loop 122 is formed between arbitrary terminals 110-I and 110-K. Terminals 110-I and 110-K can be any pair of terminals 110-1 through 110-N. Qubit 100 includes phase shifter 123 in superconducting loop 122 between portion 125 and portion 124. Multi-terminal junction 120 couples terminals 110-1 through 110-N. Examples of embodiments of phase shifter 123 are shown in FIGS. 2A through 2G. Examples of embodiments of junction 120 are shown in FIGS. 1A through 1M. Terminals 110-1 through 110-N can be made of any superconducting material compatible with the particular embodiment of phase shifter 123 and N-terminal junction 120. Terminals 110-1 through 110-N carrying superconducting currents $I_1$ through $I_N$, respectively. The transport current $I_T$ is the current directed to terminal 110-I, $I_I$.

Widths $W_1$ through $W_N$, widths $W_{J1}$ through $W_{JN}$, and widths $W_{S0}$ through $W_{S6}$ are only constrained by the requirement of compatibility with phase shifter 123 and N-terminal junction 124 and, in some embodiments, typically all less than about 10 microns. Terminals 110-1 through 110-N of qubit 100 as shown in FIG. 3B include a narrowing of the width of the terminal as the terminal is couple to junction 120. Additionally, portions 124 and 125 are narrowed to coupled with terminals 210 and 211 of phase shifter 123. Lengths $L_1$ through $L_N$, $D_{J1}$ through $D_{JN}$, $L_{S0}$, and $L_{S1}$ are only constrained by the requirement of compatibility with phase shifter 123 and N-terminal junction 120 and, in some embodiments, are typically all less than about 10 microns.

The superconducting loop can be threaded by a magnetic flux $\Phi$ which may contain contributions from a spontaneous supercurrent in the loop and externally applied magnetic fields.

N-terminal junction 120 couples one end of each of terminals 110-1 through 10-N by, for example, constriction junctions, tunnel junctions, two-dimensional electron gas structures, or combinations of these. The choice of the physical sizes of the elements in N-terminal junction 120 also affects the function of qubit 100. To achieve a small magnetic flux $\Phi$ in superconducting loop 122 (which is desirable for coherence consideration) and maximum influence of the transport currents $I_1$ through $I_N$ on the properties of superconducting loop 122, in some embodiments the terminals in the transport terminals (i.e., terminals 110-1 through 110-N that are not terminals 110-I and 110-K) are much wider than terminals 110-I and 110-K at junction 120, that is, $W_{J1}$ through $W_{JN}$, excluding $W_{JI}$ and $W_{JK}$ are much larger than $W_{JI}$ and $W_{JK}$. A small magnetic flux $\Phi$ can exist, even in the absence of external magnetic fields, because of spontaneous supercurrents. In those embodiments, the height of the potential energy barrier between the two degenerate quantum states of the qubit quantum system will be affected most pronouncedly by the applied transport currents $I_1$ through $I_N$.

N-terminal qubit 100 with intrinsic phase shifter 123 can provide a basic block for construction of a qubit but can also be utilized for demonstration of macroscopic quantum tunneling and incoherent quantum noise in a solid state system. As described further below, the macroscopic quantum tunneling in a set of independent N-terminal qubits with intrinsic phase shifters (i.e., with no entanglements between individual qubits) permits construction of a random number generator that generates random series with zero correlation between numbers in the random series.

N-terminal qubit 100 with intrinsic phase shifter 123 includes a superconducting loop 122 linking two of the N terminals, terminals 110-I and 110-K. N-terminal qubit 100 with intrinsic phase shifter 123 is made superconducting by reducing the temperature of qubit 100 below the superconducting critical temperature $T_c$ of all of the superconducting materials in qubit 100. N-terminal junction 120 may be either symmetric or asymmetric. The superconducting materials from which qubit 100A is constructed are constrained only by the requirement of compatibility with phase shifter 123 and N-terminal junction 120 and otherwise may have any pairing symmetry. For example, materials used may be s-wave, for example, niobium or aluminum, or d-wave, such as a high-Tc cuprate, for example $YBa_2Cu_3O_{7-x}$, or any superconducting material in which the Cooper pairs are in a state with non-zero orbital angular momentum.

N-terminal qubit 100 with intrinsic phase shifter 123 can be formed on an insulating substrate such as, for example, strontium titanate or sapphire. Phase shifter 123 may be any structure that shifts the phase of the superconducting order parameter in transition across the structure. Examples of embodiments of phase shifter 123 are shown in FIGS. 1A through 1G. Additionally, phase shifter 123 can be incorporated into portions 124 and 125 if portions 124 and 125 are of a multi-crystalline d-wave superconducting material, where the phase shift is caused by transition through the crystalline boundaries of the multi-crystalline material.

FIG. 3C shows a schematic diagram of qubit 100. Terminals 110-1 through 110-N are coupled at one end through junctions 140-1 through 140-(N–1) in multi-terminal junction 120. Terminals 110-I and 110-K are coupled to portions 124 and 125. Phase shifter 123 is included in superconducting loop 122.

FIG. 4A shows a plan view of an embodiment of a qubit array 400. Qubit array 400 includes a series of multi-terminal qubits 401-1 through 401-M, each of which includes an intrinsic phase shifter 402-1 through 402-N coupled in series to terminals 410 and 411, which are themselves coupled to form a loop. As such, qubit array 400 as shown in FIG. 4A is an example of a qubit register structure. Multi-terminal qubits 400-1 through 400-N can be embodiments of qubit 100 as shown in FIGS. 3A through 3C. Each of qubits 401-1 through 401-2 can be threaded by a magnetic flux $\Phi_{480-1}$ through $\phi_{480-N}$, respectively. The loop formed by terminals 410 and 422 can be threaded by magnetic flux $\Phi_{481}$. Terminals 410 and 411 can be made of any superconducting materials that can be coupled to the terminals of qubits 401-1 through 401-N.

Terminal 410 is coupled to one of the terminals of qubit 401-1. Another of the terminals of qubit 401-1 is coupled to a terminal of qubit 401-2. Each of qubits 401-2 through 401-N are coupled to a terminal of qubit 401-1 through 401-(N–1). Additionally, a second terminal of qubit 401-N is coupled to terminal 411. Connectors joining qubits 401-1 through 401-N can be made of any superconducting material compatible with qubits 401-1 through 401-N. Superconducting current $I_L$ can exist in the loop formed by joining terminals 410 and 411. Widths $W_{L1}$ through $W_{L(N+1)}$ and $W_{SL1}$ through $W_{SL3}$ are constrained only by the requirement of compatibility with qubits 400-1 through 400-N and are typically all less than about 10 microns. Lengths $L_{SL1}$ through $L_{SL3}$ and $L_{L1}$ through $L_{L(N+1)}$ are not critical but, in some embodiments, are typically all less than about 10 microns.

The magnetic flux $\Phi_{481}$, which threads the loop formed by joining terminals 410 and 411, may contain contributions from a spontaneous supercurrent in the loop and contributions from externally applied magnetic fields. The magnetic fluxes $\Phi_{480-1}$ through $\Phi_{480-N}$, which thread the loops in multi-terminal qubits 401-1 through 401-N, respectively, may contain contributions from a spontaneous supercurrent in the loop and contributions from externally applied magnetic fields.

In accordance with embodiments of aspects of the present invention, qubit array 400 as shown in FIG. 4A demonstrates coupling of different qubit quantum systems (i.e., qubits 401-1 through 401-N) and reading out information about this coupling. In embodiments where there is no externally applied magnetic field, the magnetic flux $\Phi_{481}$ threading the loop formed by joining terminals 410 and 411 is a known function of the quantum states of the qubits 401-1 through 401-N. A discussion of the relationship between the magnetic flux $\Phi_{481}$ and the quantum states of qubits 401-1 through 401-N is given in Appendix A, herein incorporated by reference in its entirety.

Therefore, measurement of the flux $\Phi_{481}$, for example by an external measuring instrument such as a magnetic force microscope, scanning SQUID microscope or scanning Hall probe, provides information on the quantum states of qubits 401-1 through 401-N. In addition, application of time-dependent external magnetic fields to the superconducting loops of SQUID qubits 401-1 through 401-N and to the loop formed by joining terminals 410 and 411 can function as an operating system to perform specific algorithms using the qubit register architecture of qubit array 400 as disclosed in FIG. 4A. The relation of the time-dependent magnetic field application and the algorithm performed is described in Appendix A.

Figure 4B:
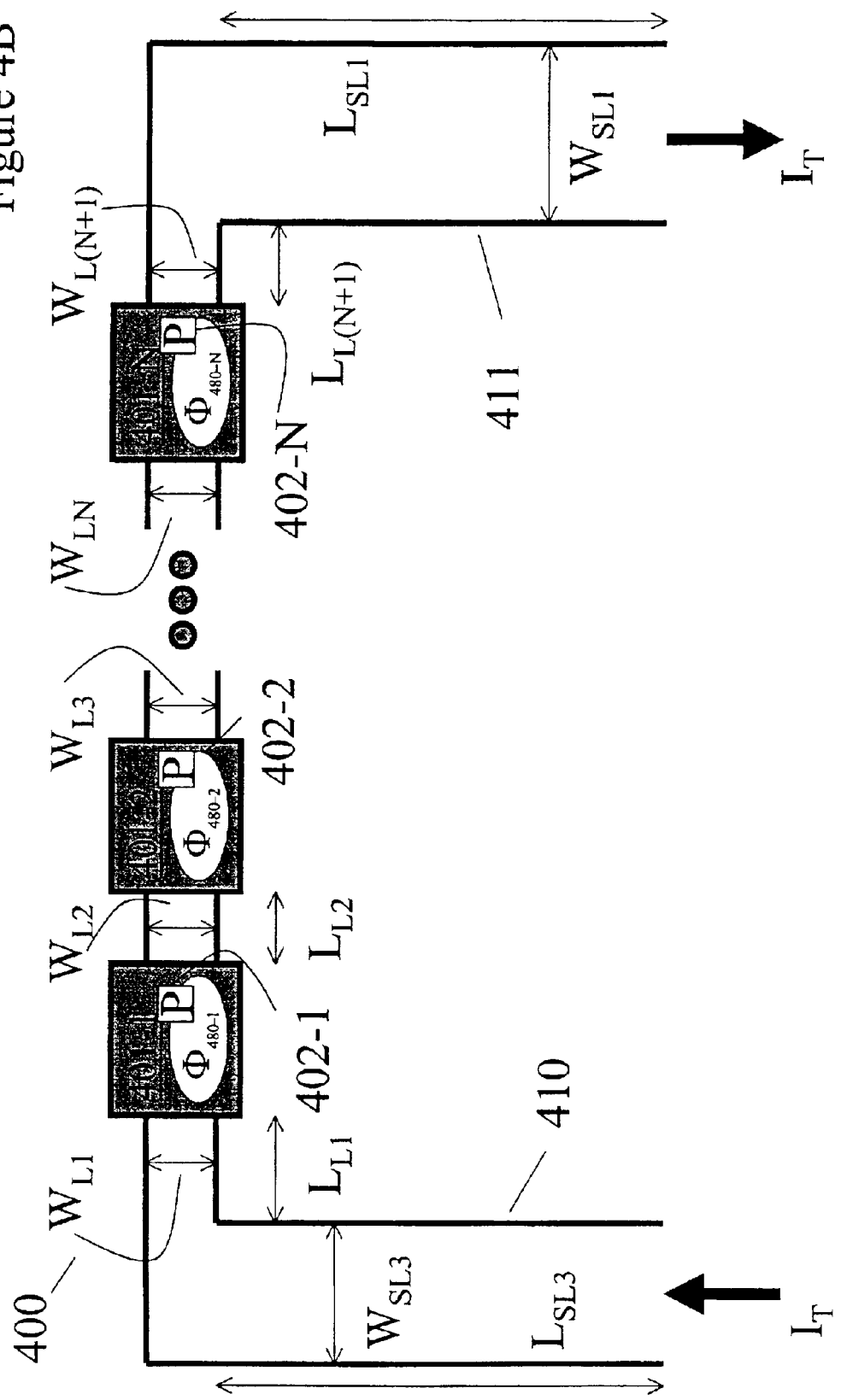
FIG. 4B shows a plan view of a two-terminal circuit with a plurality of multi-terminal qubits each having a superconducting loop with intrinsic phase shifter in accordance with embodiments of the present invention.

FIG. 4B shows a plan view of an embodiment of a qubit array 400. Qubit array 400 includes series coupled qubits 401-1 through 401-N coupled to terminals 410 and 411. Each of qubits 401-1 through 401-N includes a superconducting loop 122 with intrinsic phase shifter 402-1 through 402-N, respectively. Terminals 410 and 411 are coupled to an external source of transport current to provide current $I_T$. Multi-terminal qubits 401-1 through 401-N are embodiments of aspects of the invention described in FIGS. 3A through 3C and can be any multi-terminal qubit. Qubits 401-1 through 401-N can be threaded by magnetic fluxes $\Phi_{480-1}$ through $\Phi_{480-N}$, respectively.

Terminals 410 and 411 can be made of any superconducting material compatible with the choice of qubits 401-1 and 401-N. Connectors joining qubits 401-1 through 401-N can be made of any superconducting material compatible with the choice of qubits 401-1 through 401-N. Superconducting current $I_T$, which can be present in terminals 410 and 411, typically arises from an external transport current source.

Widths $W_{L1}$ through $W_{L(N+1)}$ and $W_{SL1}$ through $W_{SL3}$ are only constrained by the requirement of compatibility with qubits 401-1 through 401-N and, in some embodiments, are typically all less than about 10 microns. Lengths $L_{L1}$ through $L_{L(N+1)}$, $L_{SL1}$ and $L_{SL3}$ are not critical but are typically all less than about 10 microns. The magnetic fluxes $\Phi_{480-1}$ through $\Phi_{480-N}$ which thread the superconducting loops in qubits 401-1 through 401-N, respectively, may contain contributions from a spontaneous supercurrent in the loop and contributions from externally applied magnetic fields.

In accordance with an embodiment of an aspect of the invention, qubit array 400 of FIG. 4B demonstrates an apparatus for coupling different qubit quantum systems and reading out information about this coupling. In the case where there is no externally applied transport current (i.e., no transport current through other ones of the terminals of qubits 401-1 through 401-2 other than those coupled to terminals 410 and 411), the current $I_T$ in terminals 410 and 411 is a known function of the quantum states of qubits 401-1 through 401-N, as discussed in Appendix A. Therefore measurement of the current $I_T$, for example by an external measuring instrument such as a single electron transistor, provides information on the logical states of qubits 401-1 through 401-N. In addition, application of time-dependent externally applied transport current $I_T(t)$ to terminals 410 and 411 and time-dependent external magnetic fields $B_1(t)$ through $B_N(t)$ to the superconducting loops of qubits 401-1 through 401-N, respectively, can function as an operating system to perform specific algorithms using the qubit register architecture of qubit array 400 shown in FIG. 4B. The relation of the time-dependent magnetic field B(t) and transport current $I_T(t)$ application and the algorithm performed is described in Appendix A.

Figure 5:
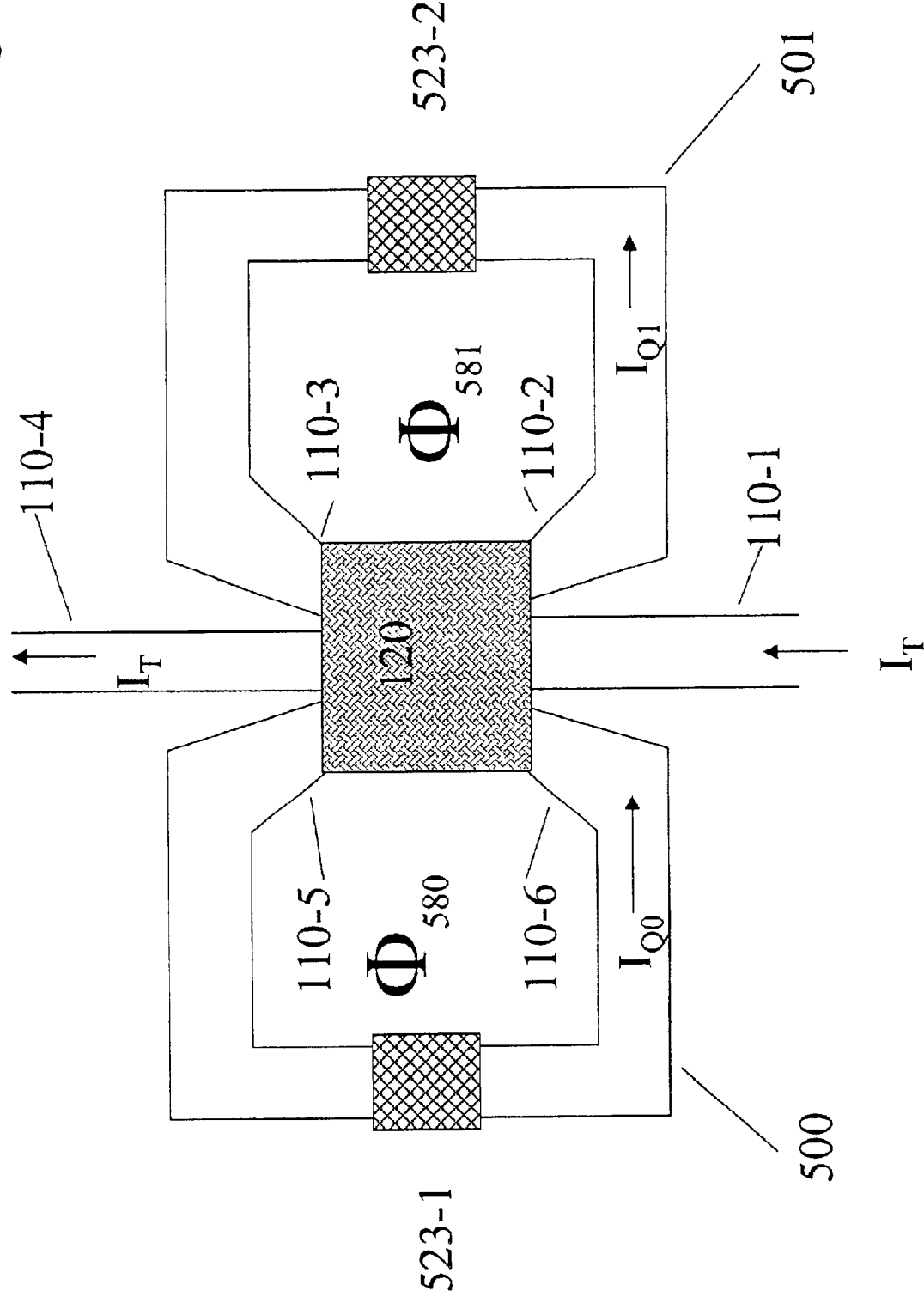
FIG. 5 shows a plan view of a six-terminal junction connecting two superconducting loops, each with an intrinsic phase shifter, to form a pair of qubits in accordance with embodiments of the present invention.

FIG. 5 shows a plan view of an qubits 500 and 501 coupled at junction 120 where junction 120 is, in this example, a six-terminal junction. Qubits 500 and 501, then, share one junction 120. Qubit 500 includes a superconducting loop coupled into junction 120 with terminals 110-5 and 110-6. Qubit 501 includes a superconducting loop coupled into junction 120 with terminals 110-2 and 110-3. Terminals 110-1 and 110-4 can be coupled to a source of transport current $I_T$. Further, qubits 500 and 501 include phase shifters 523-1 and 523-2, respectively.

Examples of embodiments of phase shifters 523-1 and 523-2 are shown as phase shifter 123 in FIGS. 2A through 2G. Examples of embodiments of junction 120 are shown in FIGS. 1A through 1M. Examples of embodiments of qubits 500 and 501 are shown in FIGS. 3a through 3C.

The superconducting loops of qubits 500 and 501 can be threaded by magnetic fluxes $\Phi_{580}$ and $\Phi_{581}$, respectively.

Terminals 110-1 through 110-6 can be made of any superconducting material compatible with the choice of qubits 500 and 501. Superconducting current $I_T$ in terminals 110-1 and 110-4 typically arises from an external transport current source. The superconducting loops of qubits 500 and 501 carry superconducting currents $I_{Q0}$ and $I_{Q1}$. respectively. The physical dimensions of terminals 110-1 through 110-6 are constrained only by the requirement of compatibility with qubits 500 and 501 and, in some embodiments, are typically all less than about 10 microns. The magnetic fluxes $\Phi_{580}$ and $\Phi_{581}$ which thread the superconducting loops of qubits 500 and 501, respectively, may contain contributions from a spontaneous supercurrent in the loop and contributions from externally applied magnetic fields.

In accordance with an embodiment of an aspect of the invention, qubits 500 and 501 as shown in FIG. 5 demonstrates an apparatus for coupling two different qubit quantum systems (i.e., the quantum systems of qubits 500 and 501) and reading out information about this coupling. In the case where there is no externally applied transport current, the current $I_T$ in terminals 110-1 and 110-4 is a known function of the quantum states of qubits 510 through 511, as discussed in Appendix A. Therefore measurement of the current $I_T$, for example by an external measuring instrument such as a single electron transistor, provides information on the quantum states of qubits 500 and 501. In addition, application of time-dependent externally applied transport current $I_T(t)$ to terminals 110-1 and 110-4 and time-dependent external magnetic fields B(t) to the superconducting loops of qubits 500 through 501 can function as an operating system to perform specific algorithms using the qubit register architecture qubits 500 and 501 as shown in FIG. 5. The relation between the time-dependent magnetic field and transport current application and the algorithm performed is described in Appendix A.

Figure 6A:
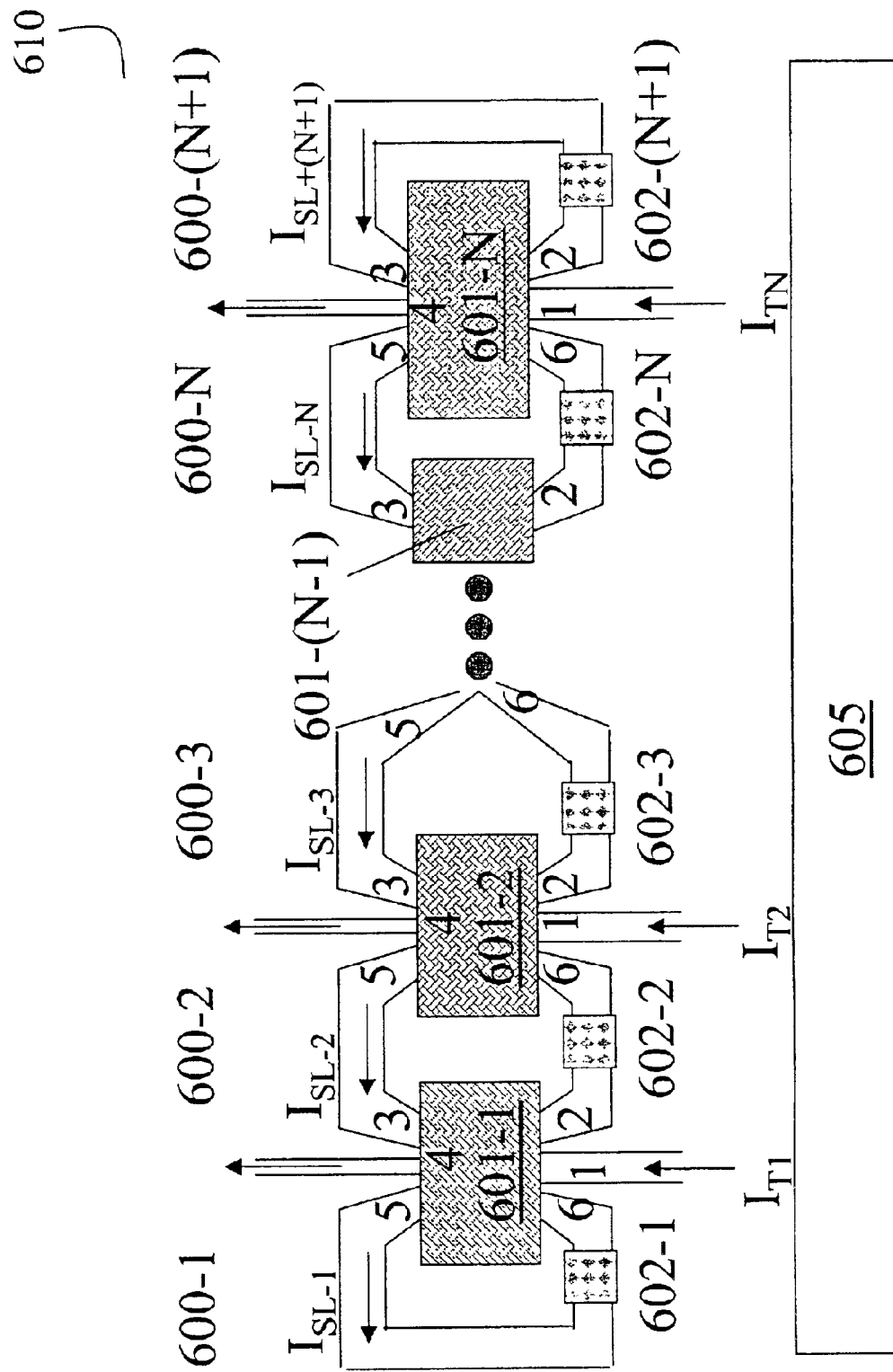

FIG. 6A shows a plan view of an embodiment of a qubit array 610. Qubit array 690 includes qubits 600-1 through 600-(N+1) coupled by six-terminal junctions 601-1 through 601-N. Examples of embodiments of junctions 601-1 through 601-N are shown as junction 120 in FIGS. 1A through 1M. The superconducting loop of each of qubits 600-2 through 600-N includes two of junctions 600-1 through 600-N whereas the superconducting loops of qubits 600-1 and 600-(N+1) includes one of junctions 600-1 and 600-N. Each of Junctions 601-1 through 601-N, as shown in FIG. 6A, includes six terminals labeled 1 through 6 in counter-clockwise fashion. In an arbitrary one of junctions 601-1 through 601-N, terminals 1 and 4 are coupled to receive transport currents $I_{T1}$ through $I_{TN}$, respectively. Terminals 2 and 3 form part of a superconducting loop (e.g., terminals 2 and 3 of junction 601-2 forms part of the superconducting loop of qubit 600-3). Terminals 5 and 6 form part of a separate superconducting loop (e.g., terminals 5 and 6 of junction 601-2 forms part of the superconducting loop of qubit 600-2). The superconducting loop of qubits 600-1 through 600-(N+1) each include a phase shifter 602-1 through 602-(N+1), respectively. Examples of embodiments of phase shifter 602-1 through 602-(N+1) are shown as phase shifter 123 in FIGS. 2A through 2G.

The superconducting loop of qubits 600-1 through 600-(N+1) can be threaded by magnetic fluxes $\Phi_{680-1}$ through $\Phi_{680-(N+1)}$, respectively. The superconducting loops of qubits 600-1 through 600-N can include any superconducting material compatible with junctions 601-1 through 601-N and phase shifters 602-1 through 602-(N+1). Terminals 1 and 4 of each of junctions 601-1 through 601-N can carry superconducting currents $I_{T1}$ through $I_{TN}$, which typically arise from external transport current sources. The superconducting loops of each of qubits 600-1 through 600-(N+1) can carry superconducting currents $L_{SL-1}$ through $L_{SL-(N+1)}$, respectively. All length and width scales are constrained only by the requirement of compatibility with junctions 601-1 through 601-N and phase shifters 602-1 through 602-(N+1), as has been previously discussed. The magnetic fluxes $\Phi_{680-1}$ through $\Phi_{680-(N+1)}$ which thread the loops in multi-terminal qubits 600 through 600-(N+1) respectively may contain contributions from a spontaneous supercurrent in the loop and contributions from externally applied magnetic fields.

In accordance with an embodiment of an aspect of the invention, qubit array 610 as shown in FIG. 6A demonstrates an apparatus for coupling a plurality of different qubit quantum systems and reading out information about the quantum states of the qubit quantum systems. In the case where there are no externally applied transport currents, the currents $I_{T1}$ through $I_{TN}$ in terminals carried by terminals 1 and 4 of junctions 601-1 through 601-N are known functions of the logical states of the qubits 600-1 through 600-(N+1), as described in Appendix A. Therefore measurement of the currents $I_{T1}$ through $I_{TN}$, for example by external measuring instruments such as single electron transistors, provides information on the logical states of the qubits 600-1 through 600-(N+1). In addition, application of time-dependent externally applied transport currents $I_{T1}(t)$ through $I_{TN}(t)$ to terminals 1 and 4 of junctions 601-1 through 601-N, respectively, and time-dependent external magnetic fields to the superconducting loops of qubits 600-1 through 600-(N+1) can function as an operating system to perform specific algorithms using the qubit register architecture of qubit array 610 as shown in FIG. 6A. The relation of the time-dependent magnetic field and transport current application and the algorithm performed is described in Appendix A. Readout 605 reads the quantum states of each of qubits 600-1 through 600-(N+1).

FIG. 6B shows a plan view of an embodiment of a qubit register 680 from an array of M-qubit registers 690-1 through 690-M. An example of an embodiment of qubit registers 690-1 through 690-M is shown as qubit array 610 of FIG. 6A. Registers 690-1 through 690-M are coupled together through junctions 695-11 through 695-(M–1)N. With reference to FIG. 6A, terminals 1 and 4 of each of junctions 601-1 through 601-N for a particular one of registers 690-1 through 690-M are coupled to counterpart terminals 4 and 1, respectively, of junctions 601-1 through 601-N adjoining ones of registers 690-1 through 690-M. In the embodiment shown in FIG. 6B, each of junctions 695-1,1 through 695-(M–1),N are four-terminal junctions, examples of which are given as junction 120 in FIGS. 1A through 1M. In FIG. 6B, the four terminals of each of 695-1,1 through 695-(M–1),N are labeled counterclockwise as terminals 1–4, as shown for junction 695-1,1. As an example, terminal 3 of junction 695-1,1 is coupled to terminal 1 of junction 601-1 of array 690-1 and terminal 1 of junction 695-1,1 is coupled to terminal 4 of junction 601-1 of array 690-1. Terminal 2 is coupled to terminal 4 of junction 695-1,2. Terminal 4 of junctions 695-1,1 through 695-(M–1),1 can be coupled to current sources to receive currents $I_{A1}$ through $I_{A(M-1)}$, respectively. Further, terminal 1 of each of junctions 601-1 through 601-N of array 690-M can be coupled to receive currents $I_{B1}$ through $I_{BN}$, respectively. All length and width scales are constrained only by the requirement of compatibility with qubit registers 690-1 through 690-M as described in FIG. 6A.

Magnetic fluxes $\Phi_{680-1,1}$ through $\Phi_{680-(M),(N)}$ can be embraced by superconducting loops contained in qubit registers 690-1 through 690-M. The magnetic fluxes $\Phi_{680-11}$ through $\Phi_{680-(M)(N)B}$ which thread the superconducting loops in qubits 600-1 through 600-N of each of qubit registers 690-1 through 690-M, respectively, may contain contributions from a spontaneous supercurrent in the loop and contributions from externally applied magnetic fields.

In accordance with an embodiment of an aspect of the invention, the array of registers 690-1 through 690-M shown in FIG. 6B demonstrates an apparatus for coupling a plurality of different qubit quantum systems and reading out information about the logical states of the qubit quantum systems. In the case where there are no externally applied transport currents, the currents $I_{A1}$ through $I_{A(M-1)}$ and currents $I_{B1}$ through $I_{B(N-1)}$ are known functions of the quantum states of the qubits in qubit registers 690-1 through 690-M, as discussed in Appendix A. Therefore measurement of the currents $I_{A1}$ through $I_{A(M-1)}$ and $I_{B1}$ through $I_{B(N-1)}$. for example by external measuring instruments such as single electron transistors, provides information on the quantum states of the qubit 600-1 through 600-N in each of qubit registers 690-1 through 690-M. In addition, application of time-dependent externally applied transport currents $I_{A1}(t)$ through $I_{A(M-1)}(t)$ to terminal 4 of junctions 695-11 through 695-(M–1)1, respectively, and $I_{B1}(t)$ through $I_{B(N-1)}(t)$ to terminal 1 of junctions 601-1 through 601-N of qubit register 690-M, respectively, and time-dependent external magnetic fields B(t) to the superconducting loops of qubits 600-1 through 600-N of each of qubit register 690-1 through 690-M function as an operating system to perform specific algorithms on qubit register 680 as shown in FIG. 6B. The relation of the time-dependent magnetic field and transport current application and the algorithm performed is described in Appendix A.

Figure 7:
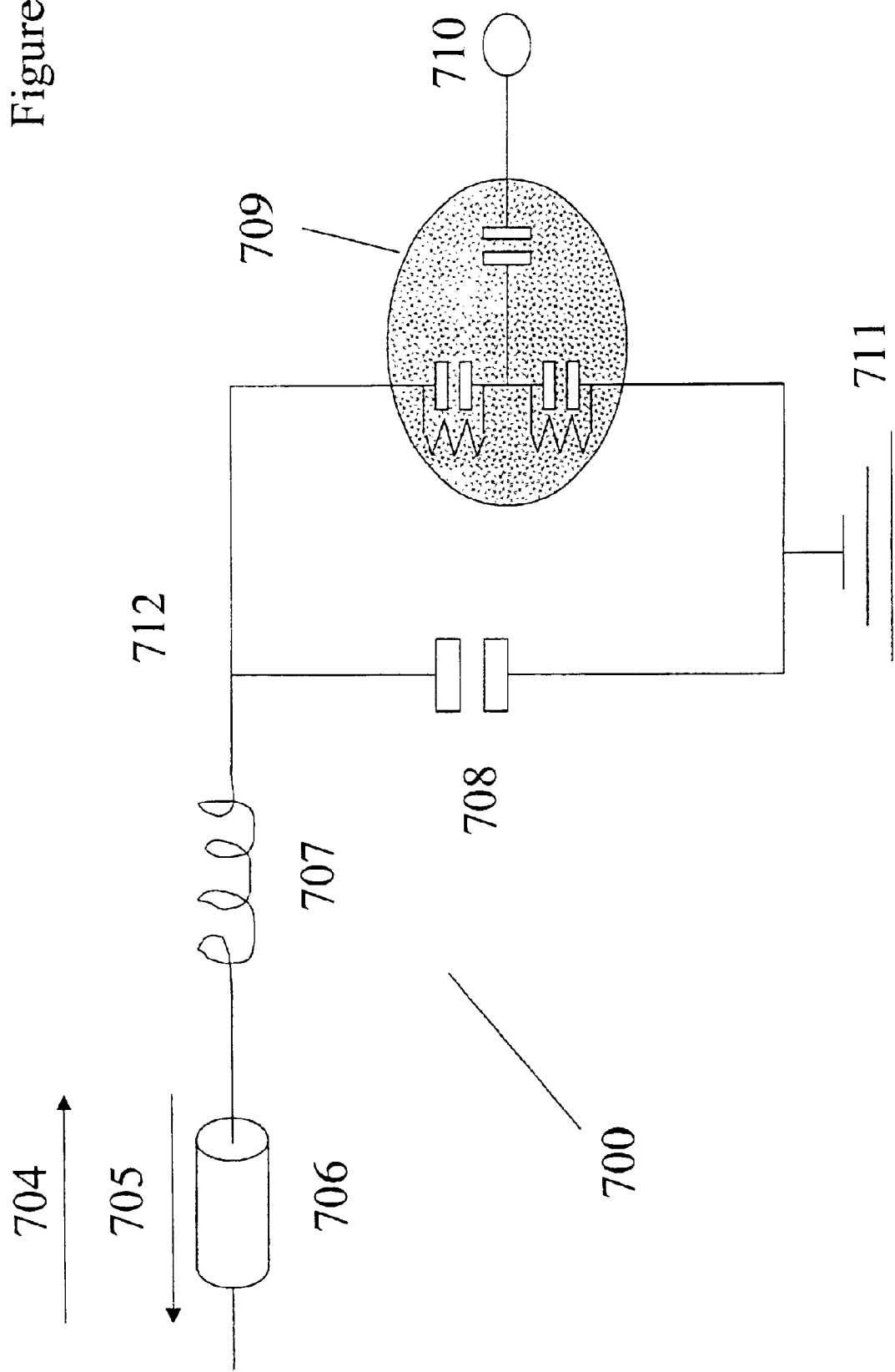
FIG. 7 shows a plan view of a voltage measurement circuit in accordance with embodiments of the present invention.

In accordance with another embodiment of an aspect of the present invention, FIG. 7 demonstrates an apparatus for measuring voltages 700. Apparatus 700 is a radio-frequency single electron transistor electrometer and is well-known and described, for example, in A. N. Korotkov and M. A. Paalanen, "Charge Sensitivity of Radio-Frequency Single Electron Transistor, *Appl. Phys. Lett.* 74, 26 (1999), which is herein incorporated by reference in its entirety. Apparatus 700 can be utilized in readout 605 of FIG. 6A to read the quantum state of each of qubits 600-1 through 600-(N+1).

The single-electron transistor (SET) 709 can be made of any material that displays a Coulomb blockade effect, for example niobium, aluminum, lead, tin, and any high-temperature superconducting cuprate. P. Joyez, P. Lafarge, A. Filipe, D. Esteve, and M. H. Devoret, "Observation of Parity-Induced Suppression of Josephson Tunneling in the Superconducting Single Electron Transistor", *Phys. Rev. Letters*. Vol. 72. No. 15, 2458–61 (Apr. 11, 1994), describes operation and manufacture of single electron transistors and is incorporated by reference herein in its entirety. SET 709 is placed in a high quality factor tank circuit 712 tuned to resonance. Tank circuit 712 includes inductor 707 and capacitor 708. Capacitor 708 is coupled across SET 709. A third terminal of SET 709 is coupled to electrode 710. A radio-frequency or microwave signal 704 is introduced into the circuit 712. The reflected signal 705 is a strong function of the voltage difference between electrode 710 and ground 711. Analysis of reflected signal 705 using established techniques allows measurement of the voltage difference between electrode 710 and ground 711.

Read-out of the state of the qubit quantum system may be done via the use of a single electron transistor (SET) 709 according to known procedures, for example, as described in R. J. Schoelkopf, P. Wahlgren, A. A. Kozhevnikov, P.

Delsing, and D. E. Prober, "The Radio-Frequency Single-Electron Transistor (RF-SET): A Fast and Ultrasensitive Electrometer," *Science*. Vol. 280, 1238–42 (May 22, 1998). SET 709 may be coupled to three devices (e.g., terminals 710, 711 and 712). An electron or Cooper pair can tunnel onto SET 709 when SET 709 is uncharged. However, SET 709 is small enough that once an electron or Cooper pair tunnels onto SET 709, the charging of SET 709 electrically repels and prevents further tunneling onto SET 709. A terminal 710 associated with SET 709 can change the voltage of SET 709 and de-tune tank circuit 712, changing the characteristics of the reflected wave 705.

In operation, in order to measure a current, for example one of currents $I_{A1}$ through $I_{A(M-1)}$ or $I_{B1}$ through $I_{B(N-1)}$ shown in FIG. 6B, electrode 710 is coupled to terminal 4 of junctions 495-11 through 495-(M–1)N or terminal 1 of junctions 601-1 through 601-N of qubit register 690-M. The current at those terminals can be measured by applying signal 704 and monitoring signal 705 of FIG. 7.

All structures in FIGS. 1A through 7 can be formed using conventional fabrication techniques. Elemental s-wave superconductors may be purchased from, for example, CIL Cambridge Isotopes Laboratories Inc. and substrates upon which superconducting structures can be formed may be purchased, for example, from Kagaku Gijutsu-sha of Tokyo, Japan or from Shinkosha, Ltd. (c/o Nikko Trading Co.). The fabrication process for a four-terminal structure with s-wave superconductors is developed in detail, for example, in B. J. Vleeming, "The Four-Terminal SQUID," Ph.D. Dissertation, Leiden University, The Netherlands, 1998 and references therein, which has previously been incorporated into this disclosure by reference.

Some embodiments of the invention allow all of the operations that are required for quantum computing to be done without the application of external magnetic fields. Operations such as read and initialization, as well as operating system gates such as application of Pauli operators $\sigma_x$ and $\sigma_z$. and furthermore operations for maintaining coherence in the state of the qubit can be achieved, without the use of external magnetic fields.

Figure 8:
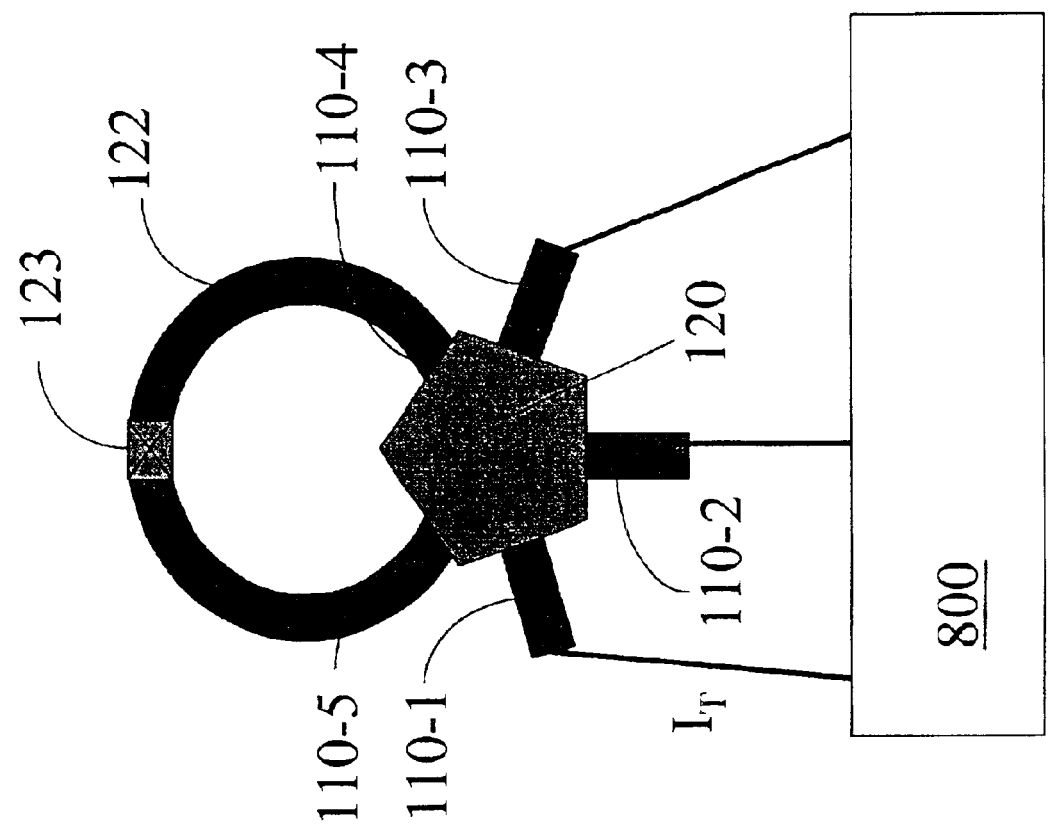
FIG. 8 shows a plan view of a five-terminal quantum qubit according to embodiments of the present invention.

In some embodiments, as illustrated in FIG. 8, a qubit 100 comprises a five terminal junction 120 and a superconducting loop 122 with phase shifter 123. The embodiment of qubit 100 shown in FIG. 8 includes terminals 110-1 through 110-5, where terminals 110-4 and 110-5 are connected to form superconducting loop 122 by a phase shifter 123. Terminals 110-1 through 110-3 can be utilized for the application of transport current as well as for voltage measurements in reading the quantum state of qubit 100. Five terminal junction 120 can be any junction for coupling terminals 110-1 through 110-5, such as those discussed with FIGS. 1A through 1M. For example, junction 120 can be a two dimensional electron gas junction and terminals 110-1 through 110-5 can be of niobium. A controller 800 can be coupled with terminals 110-1 through 110-3 in order to supply currents to and measure voltage across various ones of terminals 110-1 through 110-3, as discussed below. Qubit 100 as shown in FIG. 8, then, can be both symmetric and asymmetric.

Although qubit 100 in FIG. 8 is being discussed as a five-terminal qubit, one skilled in the art will recognize that methods and examples given here are extendable to qubit 100 having any number of terminals 110-1 through 110-N.

The quantum state of the quantum system of qubit 100 of FIG. 8, for example, can be initialized by controller 800 passing a transport current $I_T$ through junction 120 for a sufficient duration, as is further discussed in Appendix A. The transport current $I_T$ through junction 120 has the effect of biasing the energy states of the quantum system of qubit 100 towards a particular energy state and of breaking the ground state degeneracy. Given a sufficient period of time, the quantum system of qubit 100 will relax into the lower energy state. By manipulating the direction of the transport current $I_T$ passing through junction 120, qubit 100 can be initialized such that the quantum state of qubit 100 is the desired state. For example, controller 800 can apply a bias current from terminal 110-1 to terminal 110-3, thereby selects a particular state of the quantum system of qubit 100. By reversing the current through the same terminals, controller 800 can select the opposite state of the quantum system.

A read operation on qubit 100 of FIG. 8 can be accomplished based on the fact that each of the two degenerate ground states of the quantum system of qubit 100 exhibits a unique current-voltage curve with respect to current flowing between terminals 110-1 and 110-3. Each of the two degenerate ground states results in a different critical current in junction 120. The critical current is the current which, if exceeded, results in junction 120 developing a resistance. Therefore, determining which of the two critical currents is appropriate for junction 120 differentiates between the two degenerate ground states of the quantum system.

The quantum state of the quantum system of qubit 100 of FIG. 8, for example, can be read by controller 800 passing a transport current $I_T$ through junction 120 (for example between terminals 110-1 and 110-3). The critical current $I_C$ of junction 120 is dependent on the quantum state of the quantum system of qubit 100, with one state corresponding to a lower value of critical current in junction 120 and the opposite state corresponding to a higher value of critical current. In any Josephson junction, if the critical current $I_C$ is exceeded, dynamical effects result and a resistance becomes present in the junction. Thus, determining the state of the quantum system of qubit 100 can be accomplished by discerning the value of the critical current $I_C$ in the junction, see Appendix A.

In one method of measuring the quantum state of the quantum system of qubit 100, controller 800 applies a transport current $I_T$ to junction 120 which is between the known upper and lower critical current values (i.e., between the values of the critical current $I_C$ for each of the quantum states). The upper and lower values of the critical current $I_C$ is dependent upon the particular embodiment of qubit 100. When the transport current $I_T$ is applied, if the system occupies the state associated with the lower critical current, then the transport current will have exceeded the critical current value of the junction, thus resulting in a junction resistance, and a corresponding voltage across the terminals (for example, between terminals 110-1 and 110-3 to which the transport current $I_T$ is applied). Alternatively, if the system occupies the high critical current state, no voltage across the terminals will result. Controller 800, then, can determine the quantum state of the quantum system of qubit 100 by monitoring the voltage across junction 120 while applying the transport current $I_T$ through junction 120. For example, by applying a transport current from terminal 110-1 through terminal 110-3 of qubit 100 of FIG. 8, and measuring the voltage between terminals 110-1 and 110-3, it is possible for controller 800 to determine the state of the system, where the presence of a voltage indicates one of the states and the absence of voltage represents the opposite state. In some embodiments, controller 800 blocks the flow of current through terminal 110-2 by, for example, shorting terminal 110-2.

A phase gate operation $\sigma_z$ can be performed, for example, on qubit 100 of FIG. 8 by controller 800 applying a transport current $I_T$ pulse through junction 120. In essence, a quantum gate operation operates to bias a particular state of the quantum system of qubit 100. Thus, in action, the current pulse producing the $\sigma_z$ operation can be similar to the read operation discussed above, except that the magnitude of the current pulse applied is much less than the magnitude used for the exemplary read operation so that no dynamical effect results from its application, see Appendix A. The magnitude and duration of the transport current $I_T$ pulse necessary to affect the $\sigma_z$ operation is specific to the particular embodiment of qubit 100. As long as the magnitude of the pulse of transport current $I_T$ is small, application of the transport current $I_T$ by controller 800 will not destroy the quantum superposition of states in the quantum system of qubit 100, but merely weight one of the states as desired.

A phase gate operation $\sigma_x$ can be performed, for example, on qubit 100 of FIG. 8 by application of a transport current $I_T$ to terminal 110-2 and allowing it to escape through both of terminals 110-1 and 110-3. In performing the $\sigma_x$ operation, then, controller 800 applies a transport current to junction 120 through terminal 110-2, and having current flow out of junction 120 through terminals 110-1 and 110-3. Application of the transport current in this manner results in manipulating the height of the potential barrier that separates the two degenerate states of the quantum system of qubit 100, see Appendix A. The magnitude of the transport current applied is dependent on the actual configuration of qubit 100. When applied for a short duration of time, the height of the potential barrier between the two degenerate states is reduced and the tunneling frequency of the system increases for the duration of the pulse.

Furthermore, it is possible to tune the tunneling frequency of the qubit by applying a steady state current in the same manner as that of the $\sigma_x$ operation. This allows a tuning of the quantum overlap of the two degenerate ground states in the qubit to a desired range. This is useful in an array of qubits where the tunneling frequencies of some or all of the qubits vary. By tuning the tunneling frequency of each qubit, the array can be tuned into a uniform range of tunneling frequencies, thus allowing more predictable application of quantum algorithms in the array.

Tuning can be achieved for example on qubit 100 of FIG. 8 by application of a steady state current to terminal 110-2 and allowing the current to escape through terminals 110-1 and 110-3. A method for tuning the tunneling frequency of a qubit would comprise controller 800 applying a steady state current at terminal 110-2 of junction 120, while grounding or allowing escape from the adjacent terminals 110-1 and 110-3. By varying the magnitude of the applied steady state current, the tunneling frequency of the qubit can be manipulated.

Figure 9:
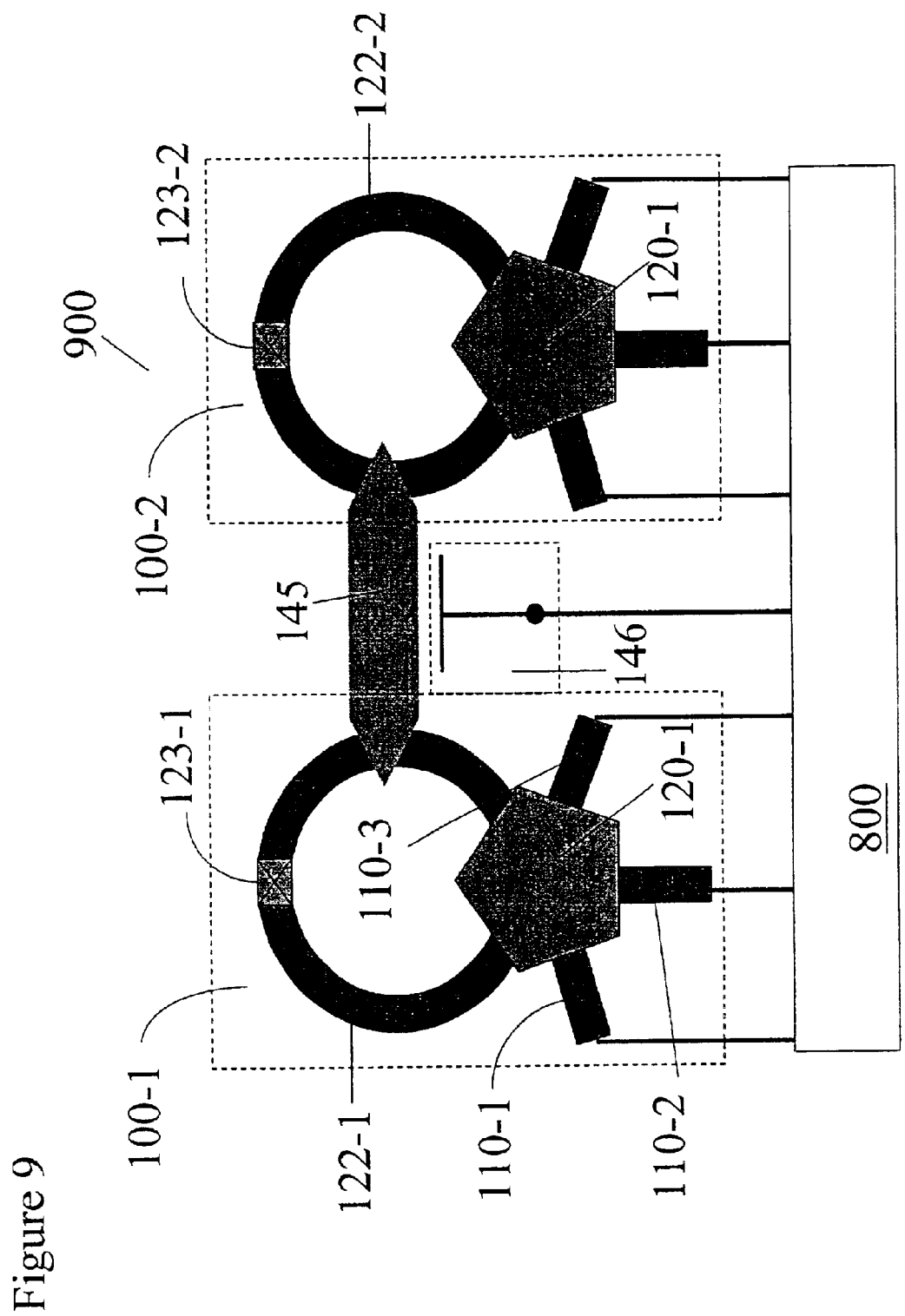
FIG. 9 shows an exemplary method of entangling a pair of five terminal qubits as shown in FIG. 8.

FIG. 9 shows a qubit array 900 including qubits 100-1 and 100-2. Array 900 can include any number of qubits. Qubits 100-1 and 100-2, for exemplary purposes only, are each five-terminal qubits 100 as shown in FIG. 8. Qubits 100-1 and 100-2 are entangled by junction 145 coupled between superconducting loop 122-1 of qubit 100-1 and superconducting loop 122-2 of qubit 100-2. In order that qubits 100-1 and 100-2 can behave independently, it is desirable that junction 145 can be opened to isolate qubit 100-1 from qubit 100-2 (and hence from all the other qubits in qubit array 900) and closed to entangle qubit 100-1 with 100-2, see Appendix A. Junction 145 can be controlled by controller 800 by applying a voltage to junction 145, for example capacitively through plate 146.

Figure 10B:
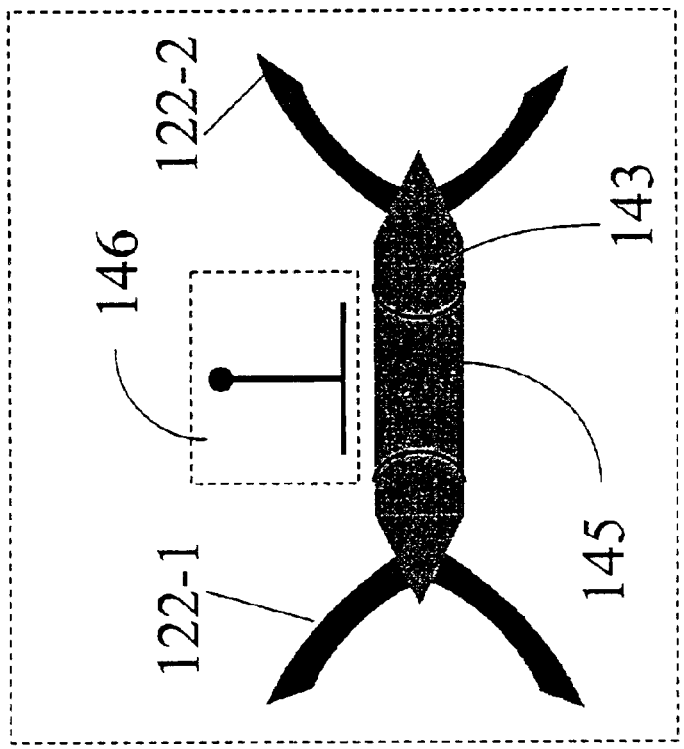
FIGS. 10a and 10b illustrate a switchable entanglement method for coupling two five terminal qubits.
Figure 10A:
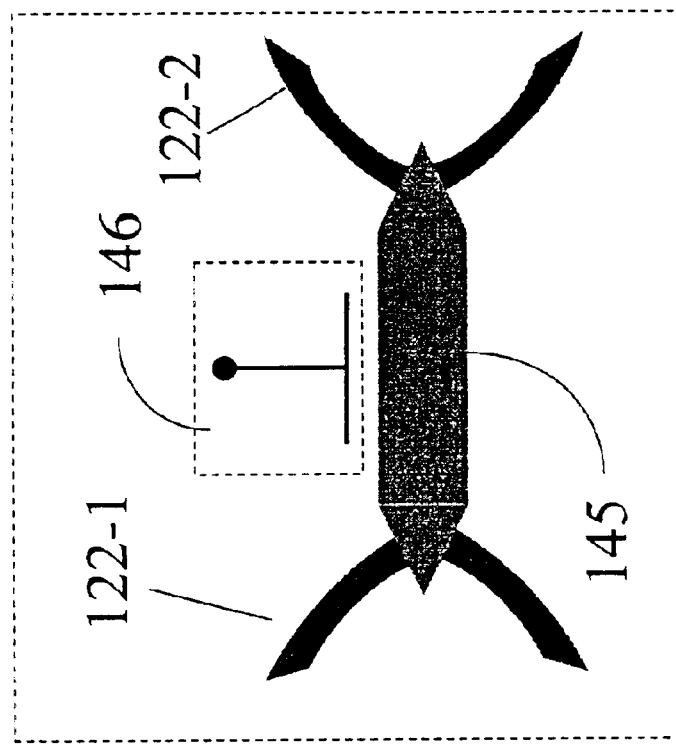

FIGS. 10a and 10b show operation of plate 146 in opening and closing junction 145 and thereby entangling or isolating qubits 100-1 and 100-2 of array 900. Controller 800 is electrically coupled to plate 146 at a terminal so that controller 800 can apply a voltage to plate 146, which is capacitively coupled to junction 145. Junction 145 can be any superconducting junction, including a two-dimensional electron gas, tunneling junction, or constriction junctions.

As shown in FIG. 10a. when controller 800 does not apply a voltage to plate 146, current can freely flow between superconducting loop 122-1 of qubit 100-1 and superconducting loop 122-2 of qubit 100-2. Therefore, qubits 100-1 and 100-2 are entangled.

As shown in FIG. 10b. when controller 800 applies a voltage to plate 146, electrons are prevented from flowing through junction 145 by electric fields 143 and junction 145 effectively becomes opened, thus isolating qubit 100-1 from qubit 100-2.

Figure 11:
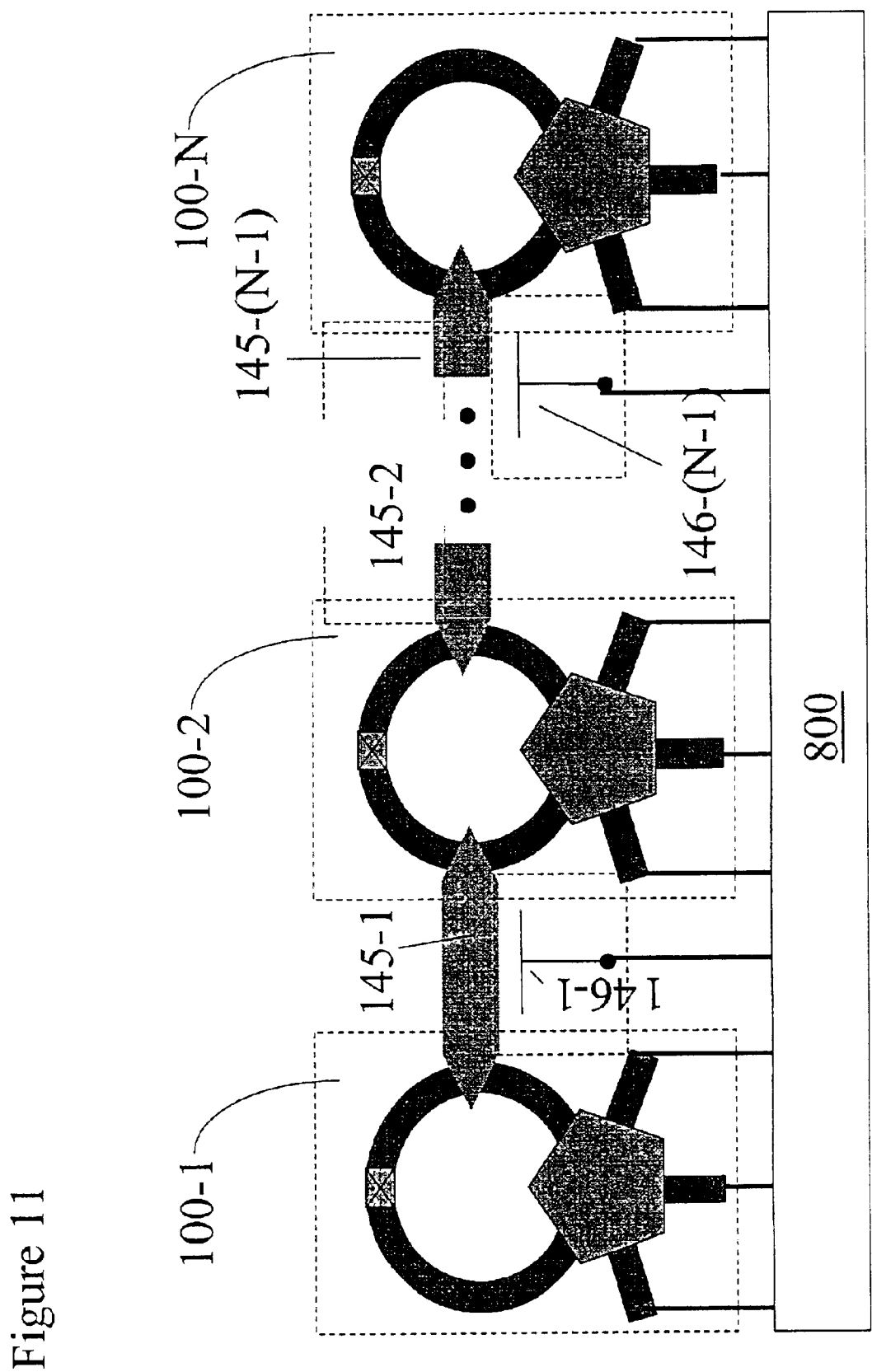
FIG. 11 shows an array of N five terminal qubits according to the present invention.

FIG. 11 illustrates a qubit array 900 of five terminal qubits, where each of qubits 100-1 through 100-N is coupled by a junction 145-1 through 145-(N−1) to its nearest neighbors. That is, qubit 100-1 through 100-N can be entangled by junction 145-1 and the entanglement can be switched by plate 146-1. Further, qubit 100-(N−1) and qubit 100-N can be entangled by junction 145-(N−1) and the entanglement can be switched by plate 146-(N−1

Although array 900 of FIGS. 9 and 11 illustrate entanglements between qubits in a linear array, one skilled in the art should recognize that a two-dimensional array of qubits 100 can be entangled in this fashion. Each superconducting loop 122 can be switchably entangled to any number of other superconducting loops through a junction 145 with a plate 146.

Figure 12:
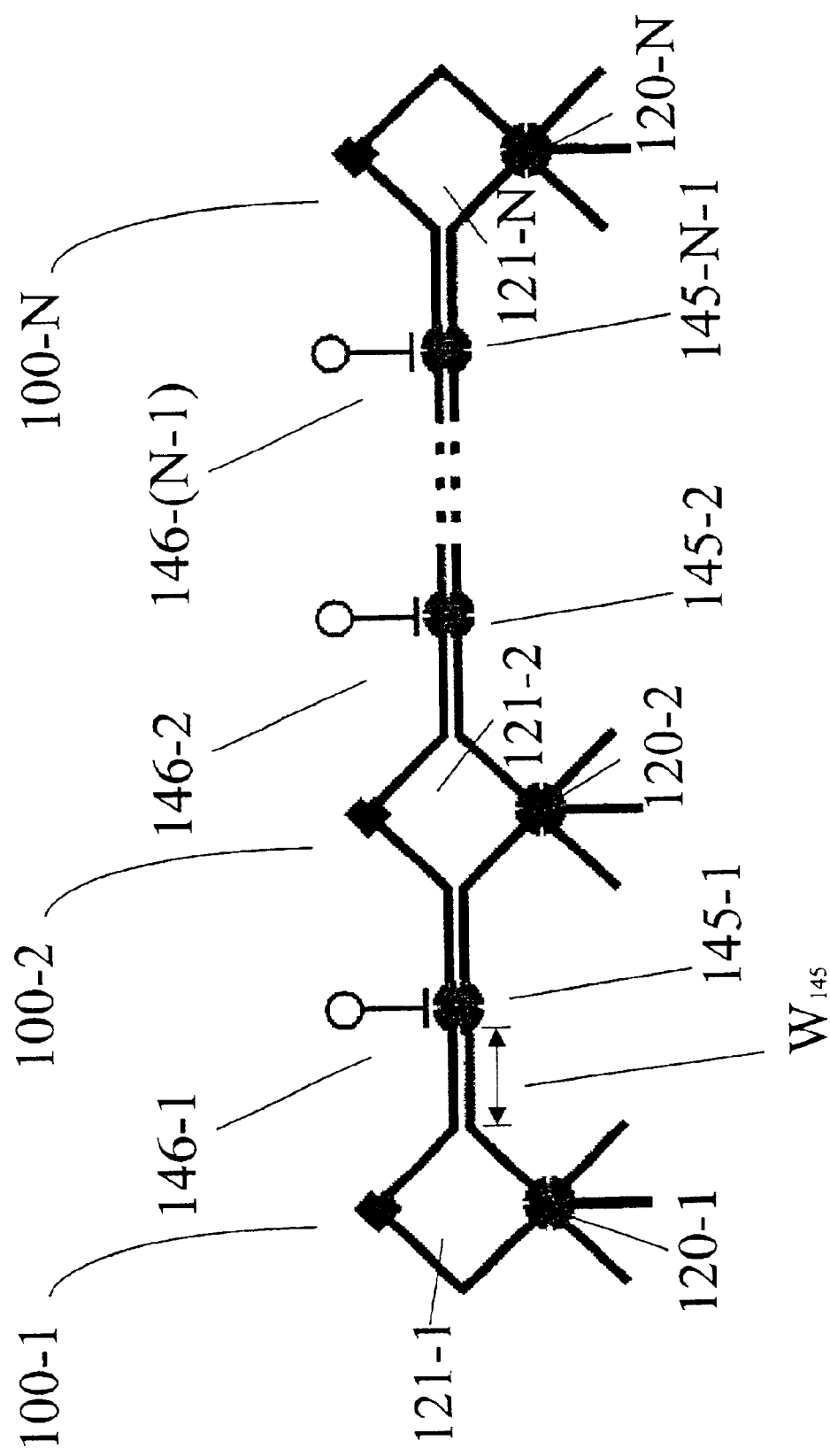
FIG. 12 shows another embodiment of a qubit array according to the present invention.

FIG. 12 shows a particular embodiment of qubit array with qubits 100-1 through 100-N coupled by junctions 145-1 through 145-(N−1) and switched with plates 146-1 through 146-(N−1), respectively. In FIG. 12, junctions 145-1 through 145-(N−1) are each two-dimensional electron gas junctions. Additionally, junction 145-1, for example, is coupled such that it is within both superconducting loop 121-1 and 121-2, rather than simply linking superconducting loops 121-1 through 121-2 as is shown in FIG. 11. In this fashion, junction 145-1, through plate 146-1, controls the coupling of superconducting loop 121-1 with multiterminal junction 120-1, controls the coupling of superconducting loop 121-2 with multiterminal junction 120-2, and controls the entanglement between qubits 100-1 and 100-2. To avoid any interaction of the entangling junction with the flux in the qubit, the entangling junctions 145-1 through 145-(N−1) are isolated from the main loop of the qubit by a distance $W_{145}$. This further decouples the qubit from any interaction with the environment or surrounding fields, thus decreasing the decoherence in the qubit.

In operation, qubits and qubit arrays according to the present invention (such as, for example, the embodiments discussed above) are cooled to a temperature well below the superconducting transition temperature T, of all superconducting materials utilized to fabricate the particular structures. In an exemplary embodiment, the structures described in FIGS. 1A through 13 are cooled to an operating temperature of about 10 milliKelvin so that all structures are superconducting, all phase shifters are operative and decoherence processes due to thermal fluctuations and inelastic scattering are suppressed.

In accordance with current theoretical descriptions, for example, the Eliashberg theory of superconductivity (see, e.g., R. de Bruyn Ouboter and A. N. Omelyanchouk, "Macroscopic Quantum Interference Effects in Superconducting Multiterminal Structures," *Superlattices and Microstructures*. Vol. 25. No. 5/6 (1999)) an order parameter T describes current flow in superconductors and phase differences in multi-terminal junctions. Multi-terminal qubit 100 with intrinsic phase shifter 123 as shown, for example, in FIGS. 3A through 3C have degenerate ground states of the qubit quantum system, the supercurrent circulating in superconducting loop 122 of qubit 100 being twice degenerate if no external magnetic field or transport current from any external current source is applied. The two degenerate states having the ground state energy and definite magnetic moment, |0> and |1>. correspond to minimal supercurrents circulating through superconducting loop 122 in clockwise and counter-clockwise senses. The two states associated with the supercurrent in superconducting loop 122 permit quantum computing in the standard fashion, which is described in many papers and books (see, e.g., J. E. Mooij, T. P. Orlando, L. Levitov, L. Tian, Caspar H. van der Wal, and Seth Lloyd, "Josephson Persistent-Current Qubit," *Science* 285, 1036–39 (1999)).

The role of phase shifter 123 in multi-terminal qubit 100 is to cause the two basis states of the qubit to be naturally degenerate. This is a major advantage over other qubit designs, for example that of Mooij et al., *Science* 285 1036. where it is necessary to apply a magnetic field in order to bring the basis states of the qubit quantum system into resonance (i.e., cause them to be degenerate). The magnetic field required by the system of Mooij et al., *Science* 285 1036. needs to be extremely finely tuned in order to maintain the resonance condition. This is because the precision to which the external field has to be tuned is approximately the tunneling amplitude $\Delta_T$ between qubit basis states which is usually about 5 GHz and corresponds to a magnetic field precision of one part in about $10^6$.

One application of embodiments of multi-terminal qubits according to the present invention is a quantum computational random number generator. As a random number generator, the quantum states of an array of qubit 610 as shown in FIG. 6A or array 680 as shown in FIG. 6B or of array 900 as shown in FIGS. 9 and 11 evolve to a state where the qubit quantum system on each of individual qubits (e.g, qubits 600-1 through 600-(N+1) of array 610) has an equal (or at least known) probability of evolving to each of the basis states |0> and |1>. The basis states, which are related to the superconducting current directions in the superconducting loops, are then determined, for example, by observing each of qubits with a magnetic force microscope, a SQUID magnetometer, a scanning Hall probe, or other magnetic probes, or alternately by applying transport currents and measuring voltage drops with, for example, apparatus 700 as described in FIG. 7, which will fluctuate if the state to be measured is in the higher energy state or remain static otherwise. Each determined state (clockwise current or counterclockwise current) corresponds to a bit value (0 or 1) so that the collection of determined states provides a random binary value having as many bits as there are qubits in the array. Quantum theory indicates that, with known (including zero) entanglements between individual qubits, a series of bits thus generated can be random without correlation or repetition between bits.

Qubits according to embodiments of aspects of the current invention may also alternatively be read by other readout devices such as a magnetic force microscope (MFM) tip, a superconducting quantum interferometer device (SQUID) loop, or a Hall probe device. The readout device measures the weak local magnetic fields that the spontaneous supercurrents (clockwise or counterclockwise) cause in the vicinity of the multi-terminal qubit. More particularly, the MFM scans a microscopic magnetized tip attached to a cantilever across the surface and measures deformation of the cantilever as the mechanical force that acts on the magnetized tip. Alternatively, a superconducting loop can detect the magnetic flux in the vicinity of the multi-terminal qubit. Alternatively, a Hall probe can detect the magnetic flux in the vicinity of the multi-terminal qubit. Another possible read out system may use a difference in the absorption of circularly polarized microwave radiation due to the clockwise or counterclockwise currents by a multi-terminal qubit.

The time required for a calculation and the interpretation of the read out results depends on the calculation performed. Such issues are the subject of many papers on quantum computing, for example P. Shor, "Introduction to Quantum Algorithms," Los Alamos preprint server condmat/005003 (Apr. 29, 2000). The structures described herein can serve as components of quantum computing systems and also can implement any single qubit algorithm.

In general a controller can be electrically coupled to provide current to the terminals of each qubit 100 in an array of qubits (for example, controller 800 shown in FIGS. 8, 9 and 11). Controller 800 controls the currents in each of the terminals and thereby is capable of controlling the initial states of each qubit, the entanglements between qubits, the application of magnetic fields to each qubit, and the measurements of the state of the qubit. As such, one skilled in the art will recognize that controller 800 can be a microprocessor based system operating software which controls the programming and readout of qubits single or in arrays as shown in FIGS. 6A, 6B, 6C, 9, and 11.

Although the invention has been described with reference to particular embodiments, the description is exemplary only and should not be considered limiting. One skilled in the art may recognize several obvious variations, which are intended to be within the scope and spirit of the present disclosure. One skilled in the art will recognize embodiments of other qubits according to the present invention which are within the scope of this disclosure. Various adaptations and combinations of features of the embodiments disclosed are within the scope of the invention. As such, the invention is limited only by the following claims.

APPENDIX A

Multi-Terminal Superconducting Phase Qubit

M. H. S. Amin[1]. A. N. Omelyanchouk[2]. A. Blais[3]. A. M. Zagoskin[1,4]. G. Rose[1] and T. Duty[1]

[1] D-Wave Systems Inc., 320-1985 West Broadway, Vancouver, BC V6J 4 Y3. Canada

[2] B. I. Verkin Institute for Low Temperature Physics and Engineering, Ukrainzan National Academy of Sciences, Lenin Ave. 47. Kharkov 310164. Ukraine

[3] Centre de Recherche sur les propriété de matériau électronique and Départment de Physique, Université de Sherbrooke, Sherbrooke Québec, Canada, J1K 2R1

[4] Physics and Astronomy Dept., The University of British Columbia, 6224 Agricultural Rd., Vancouver, B.C., V6T 1Z1. Canada We propose a novel superconducting flux qubit design based on mesoscopic 4-terminal junctions. The logical states correspond to different orientations of persistent currents in superconducting loops. Magnitude of the corresponding fluxes is of the order of a fraction of the flux quantum minimizing considerably interactions with the environment. No external fluxes are necessary to attain bistability or to perform logical operations.

I. Introduction

In the past twenty years, clear evidences have been gained that quantum information processing could offer significant advantages over classical information processing [1, 2]. In parallel, it was recognized that superconducting systems, and particularly SQUIDs, are good candidates for the observations of quantum phenomena at the macroscopic level [3]. A great body of experimental evidences has been accumulated to support this assertion.

In this paper, a novel qubit design using the phase degree of freedom is introduced. Similarly to the rf-SQUID [4] or to the design introduced in [5] the logical states are represented by persistent currents of different orientations flowing in a superconducting loop. In the present design logical operations are not performed by manipulations of external fluxes. This is, among others, an advantage of this design.

The paper is organized as follows. In Sec. II we present the layout of the multi-terminal phase qubit. In Sec. III the quantum dynamics of the flux degree of freedom in this device is studied and it is shown how it can be reduced to a two-level system (TLS). In the following sections, we go on showing how this TLS satisfies the requirements for quantum computation [6]: initialization and measurement in Sec. IV, a universal set of gates is given in Sec. V, VI and VII and finally estimates for decoherence are presented in Sec. VIII.

II. Mesoscopic 4-Terminal Qubit

The basic constituent of the novel qubit design studied in this paper is the 4-terminal Josephson junction (FIG. 14) which has been the focus of extensive studies [7]. Nonlocal coherent transport in this structure was investigated in the companion paper (thereon referred to as Article I). The mesoscopic 4-terminal junctions of FIGS. 14(b) and 14(c) on which we will focus our attention in this paper consist of four s-wave superconducting banks weakly coupled by a ballistic two-dimensional electron gas (2DEG) layer. As seen in Article I, in such devices the total current, $I_i$, flowing into the i-th terminal depends on the superconducting phases $\phi_j$ at all the banks and has the form [8]:

$$I_i = \frac{\pi \Delta_o}{e} \sum_{j=1}^{4} \gamma_{ij} \sin\left(\frac{\varphi_i - \varphi_j}{2}\right) \tanh\left[\frac{\Delta_o}{2T}\cos\left(\frac{\varphi_i - \varphi_j}{2}\right)\right],$$

where $\Delta_0$ is the superconducting gap in the banks, the $\gamma_{ij}$ are geometry dependent coupling coefficients between the $i^{th}$ and $j^{th}$ terminals and $\gamma_{ij}$=0. A pair of terminals are either current biased or closed by a superconducting loop (see below). As noted in FIG. 14, we label the terminals such that terminals 1 and 2 sustain current I while terminal 3 and 4 current J; below I and J will respectively be transport and persistent currents.

As discussed in Article I, coupling between the I and J circuits is characterized by the matrix $$\gamma_{coup} = \begin{pmatrix} \gamma_{13} & \gamma_{14} \\ \gamma_{23} & \gamma_{24} \end{pmatrix} \tag{2}$$

Figure 14C:
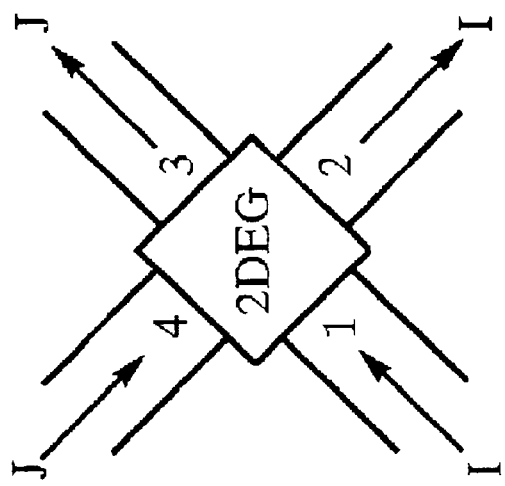
FIG. 14. 4-terminal Josephson junctions. (a) Junction with microbridges. (b) Mesoscopic junction with two-dimensional electron gas (2DEG) and symmetric current configuration. In this configuration, coupling between currents I and J inside the normal region is local ($\delta=0$). (c) Mesoscopic junction in the asymmetric currents configuration. Coupling is non-local ($\delta\neq0$).

For multi-terminal junctions such that det($\gamma_{coup}$)=0. coupling between the currents I and J is local. Constriction junctions (FIG. 14a) and mesoscopic junctions in the crossed currents configuration (FIG. 14b) belong to this category. In the later case, although coupling is really nonlocal, it is the extra symmetry in the current configuration that imposes det($\gamma_{coup}$)=0. Alternatively, when det ($\gamma_{coup}$)≠0 coupling is nonlocal. This is realized for the mesoscopic junction in the parallel current configuration (FIG. 14c). In this case, and as emphasized in Article I, the phase across the two terminals in one current loop is affected by the direction of the current in the other loop. This will be referred to as phase dragging effect. As will be shown below, this effect plays a crucial role in manipulation, initialization and readout of qubit's states.

Figure 15:
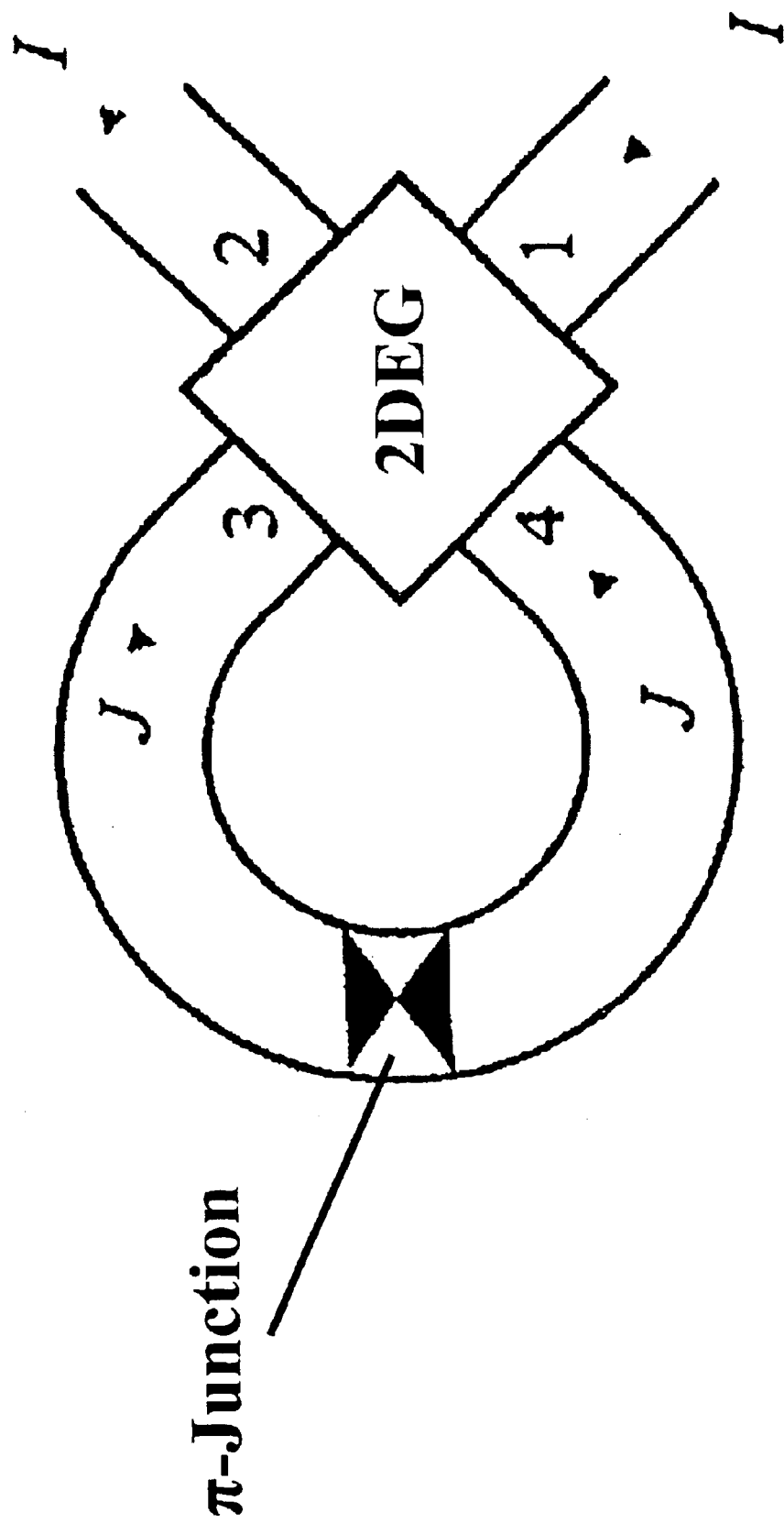
FIG. 15. Mesoscopic 4-terminal SQUID qubit. The $\pi$-phase shifter in the flux loop is added to attain bistability without external flux. The externally controlled transport current I affects the current J in the superconducting loop through the phase dragging effect and in turns in the loop.

By connecting terminals 3 and 4 via a superconducting ring, a 4-terminal SQUID is realized. FIG. 15 (the π-junction will be introduced below) shows such a structure where, to take advantage of phase dragging effect, the asymmetric current configuration of FIG. 14c is used.

In this configuration, the 4-terminal SQUID is reminiscent of the much studied rf-SQUID [9]. It is known that for rings of large enough inductance and under $\Phi_0/2$ externally applied flux ($\Phi_0$=h/2e, the flux quantum) the rf-SQ can be bistable [4]. The bistable states correspond to different orientations of persistent currents or equivalently to different magnetic flux enclosed by the ring. Quantum behavior of the flux degree of freedom in this system has been the focus of numerous experimental and theoretical investigations over the past twenty years, see [4] for reviews.

Bistability of the 4-terminal SQUID has also been the focus of theoretical investigations and has been confirmed experimentally [10]. For quantum computing purposes, a major advantage of the 4-terminal SQUID over the standard rf-SQUID is that bistability can be attained for arbitrarily small loop inductance. As a result, the enclosed flux is much smaller than for the rf-SQUID and weaker coupling to the environment is to be expected. Small inductances and thus small fluxes were the main advantage of the 3 junction design of reference [5].

As in the rf-SQUID or 3 junction case, an external flux of $\Phi_c=\Phi_0/2$ is needed to get bistability (see appendix A). However, as will become clear in the next sections, this control parameter is not exploited to manipulate the flux (i.e. qubit) state. The external flux can thus be fixed to $\Phi_0/2$ for all qubits. This opens the possibility of replacing, as shown in FIG. 15, the external fluxes by a π-phase shifter in each qubit's superconducting ring. The net effect is the same but this has the advantage that the π-phase shifter does not bring in extra coupling to the electromagnetic environment.

Let us now proceed with the description of the 4-terminal SQUID. For clarity of presentation, the bulk of the calculations is given in the appendix and only the main results are presented here. It is useful to introduce the new variables:

$$\theta = \varphi_2 - \varphi_1, \phi = \varphi_3 - \varphi_4, \mathcal{X} = \frac{1}{2}(\varphi_1 + \varphi_2) - \frac{1}{2}(\varphi_4 + \varphi_3), \tag{3}$$

where φ is related to the flux Φ threading the ring through $\phi=2\pi\Phi/\Phi_0$ mod 2π. It is also us variable $\tilde{\phi}=\phi+\pi$ which, physically, is the phase related to the self-generated flux on the ring in the presence of a π-phase shifter or, equivalently, a $\Phi_0/2$ external flux.

In mesoscopic four terminal junctions where the 2DEG layer has a square geometry, the coefficient $\gamma_{ij}$ are such that $\gamma_{13}=\gamma_{24}$ and $\gamma_{14}=\gamma_{23}$. As shown in the appendix, this constrains χ to take only one of two possible variables, 0 and π. We will thereon work under this condition but results can be generalized to the more general case. We define the new variables $\gamma=(\gamma_{13}+\gamma_{14})/\gamma_{12}$ and $\delta=(\gamma_{13}-\gamma_{14})/\gamma_{12}$. The difference between local and nonlocal couplings lies in the value of δ, namely δ=0 for the local case but δ≠0 in the nonlocal case.

In appendix A, the free energy of the 4-terminal SQUID is derived for T=0 and near the superconducting critical temperature $T_c$. It turns out that the free energy has the same form in both cases with differences only in the values of their coefficients. We therefore expect the same behavior to hold at all intermediate temperatures as well. All discussions in the main body of this article are devoted to the T=0 limit keeping in mind that the arguments are more general and that the same expressions can be derived near $T_c$ as well. Evidently, the limit T=0 is more pertinent for qubit operation where one should expect longer coherence times.

¿From (A18) (keeping only the $\phi$ dependent terms), the free energy for the flux loop can be written as $$U_\varphi(I) = \frac{1}{2\mathcal{L}}(|\varphi| - \varphi_0(I))^2 - \varepsilon(I)\,\text{sign}(\varphi), \tag{4}$$

where $\mathcal{L}=2\pi I_0 L/\Phi_0$ is the dimensionless inductance with $I_0$ the Josephson critical current between terminals 1 and 2 (see appendix A). Energy is expressed in units of the Josephson energy $E_0=\hbar I_0/2e$ of the 1-2 loop and current in units of $I_0$. The coefficient of the second term, $\varepsilon(I)$, and $\phi_0(I)$ are functions of the transport current I:

$$\varphi_0(I) = \frac{\varphi_0(0)}{\sqrt{2}}\left(1 + \sqrt{1-I^2}\right)^{1/2},\ \varepsilon(I) = \varepsilon_0 I\left(1 + \sqrt{1-I^2}\right)^{-1/2}, \tag{5}$$

with $\phi_0(0)=\gamma\mathcal{L}/\sqrt{2}$ and $\epsilon_0=2\delta$. The energy (4) has two local minima at $\phi=\pm\phi_0(I)$ with energy difference $2\epsilon(I)$. These minima correspond to different orientations of the persistent current in the superconducting loop. It is clear from (4) that the system can be bistable even if the superconducting loop as a very small inductance L. As stressed earlier, small inductance results in a small separation between the minima and correspondingly a smaller coupling to the environment.

The main difference between locally and non-locally coupled 4-terminal junctions, for which $\delta=0$ and $\neq 0$ respective now becomes apparent. In the former case, one as $\epsilon_0=0$ and the minima are always degenerate. In this case (or when $\epsilon(I)$ is tuned to zero) the barrier height between the minima is given by $$U_b(I) = \frac{\varphi_0(I)^2}{2\mathcal{L}} = \frac{1}{2}U_b(0)\left(1 + \sqrt{1-I^2}\right). \tag{6}$$

In the non-locally coupled case, the bias term can be used to break this degeneracy and make one of the minima more favorable than the other. Hence, bias energy and barrier height can be tuned by the externally applied transport current. In the following sections, we will show how these properties can be used for initialization, readout and manipulation of the qubit's state.

III. Quantum Dynamics

In the presence of a small capacitance C across the junction 1-3, the system's total energy is $$E = \frac{Q^2}{2C} + U_\varphi(I), \tag{7}$$

where Q is the number of charges on the capacitor and $C=E_0 C/(2e)^2$ the dimensionless capacitance. The system's Hamiltonian is obtained by replacing Q by the appropriate operator in $\phi$-representation, $Q \to i\partial/\partial\phi$. In units of $E_0$ one then obtains $$H = \frac{-1}{2C}\frac{\partial^2}{(\partial\varphi)^2} + \frac{1}{2\mathcal{L}}(|\varphi| - \varphi_0(I))^2 - \varepsilon(I)\text{sign}(\varphi). \tag{8}$$

This is equivalent to a particle of mass proportional to the capacitance C moving in the double well potential of equation (4). For small enough capacitance, this system can behave quantum mechanically.

Near the two minima of (4), the classical oscillation frequency, in units of $E_0/\hbar$, is given by $$\omega_0 = \frac{1}{\sqrt{\mathcal{LC}}} = \frac{\hbar}{E_0\sqrt{LC}}. \tag{9}$$

If this frequency is much smaller than the barrier height, in other words if $\omega_0 \ll U_b(I)$, then the low energy levels on both sides of the barrier can be approximated by $$E_{n,\pm} = \mp\varepsilon(I) + \omega_0\left(n + \frac{1}{2}\right). \tag{10}$$

When the minima are degenerate, coherent tunneling between the right and left well is allowed. In this situation, degeneracy between the two lowest levels is lifted by the tunneling splitting.

$$\Delta = 2\omega_0\left(\frac{\omega_0 C\varphi_0(I)}{\pi}\right)^{1/2} e^A e^{-S_0}, \tag{11}$$

where $$S_0 = \int_{-\varphi_-}^{\varphi_+} d\varphi \sqrt{2CU_\varphi(I)},\ A = \int_0^{\varphi_+} d\varphi\left[\frac{\omega_0 C}{\sqrt{2CU_\varphi(I)}} - \frac{1}{\varphi_0(I) - \varphi}\right]. \tag{12}$$

For the potential (4), A is identically zero and $$S_0 = \frac{2U_b(I)}{\omega_0}. \tag{13}$$

One then obtains the tunneling splitting $$\Delta(I) = 2\omega_0\left(\frac{1}{\pi}U_b(I)\sqrt{2C}\right)^{1/2} e^{-2U_b(I)/\omega_0}. \tag{14}$$

In the regime were the attempt frequency $\omega_0$ is much smaller than the barrier height, but much larger than tunneling splitting, energy bias $\epsilon(I)$ and temperature, truncation to the Hilbert space spanned by the system's two lowest energy levels is possible. In the basis of the ground states of the right and left well respectively (which will be denoted $\{|0\rangle, |1\rangle\}$ for obvious reasons), this yields the usual two level system Hamiltonian $$H_{eff}=\Delta(I)\sigma_z-\epsilon(I)\sigma_z. \tag{15}$$

The $\sigma$'s are Pauli matrices and the coefficients $\epsilon(I)$ and $\Delta(I)$ are given by (5) and (14) respectively. We have thus mapped the 4-terminal SQUID flux state's to a pseudospin. We will now proceed to show how this pseudospin can be used as a qubit.

IV. Initialization and Readout

Initialization is the process of taking an arbitrary state and bringing it to a well-defined state (which is usually chosen to be |0>). This evidently is a non-unitary process and is therefore possible only through coupling to an environment. Obviously, measurement is also a non-unitary process and also requires coupling to an environment (the measuring apparatus).

In this design, initialization and readout are performed through the phase dragging effect by applying a transport current. More specifically, for initialization a transport current I is applied for sufficiently long time. Because of the resulting energy bias (5), the system will relax to the lower energy state after sufficiently long time. By choosing the direction of current one can choose to whichever state to initialize to.

To readout the state of a qubit, one can use the fact that the critical current in the transport current loop depends on the state of the flux loop. As derived in appendix A, for the system to be bistable, $\theta$ (defined in (3) must satisfy the constrain $|\theta|<\theta_{max}$. where $\theta_{max}$ is given by (A11). When this is satisfied, the current-phase relation in the transport current loop is given by (A15) and is reproduced here for convenience $$I = \sin\frac{\theta}{2} - \frac{\delta}{\sqrt{2}}\cos\frac{\theta}{4}\text{sign}(\varphi). \quad (16)$$

The critical current therefore occurs near $\theta=\pi$ with the value $I_c=1 \mp \delta/2$. depending on the qubit's state. In order to measure this state, one applies a current I=1. If the qubit is in the state $+\phi_0$. the current exceeds the critical current and the system goes to the non-stationary state with a voltage drop across the transport terminals. On the other hand if the system is the state $-\phi_0$. the current will be below the critical current and no voltage will be detected.

An important condition here is that when $\theta \approx \pi$ the system should still preserve its bistable behavior. Therefore we need to have $\theta_{max}>\pi$. This imposes a minimum value for the equilibrium flux $\phi_0(0)>4\sqrt{2}(\delta/\gamma)$, or equivalency puts an upper limit on $\delta$ $$\delta < \mathcal{L}\gamma^2/8. \quad (17)$$

Minimization of the flux $\phi_0$ while respecting (17) requires $\delta<<\gamma$ or equivalently $\gamma_{13}\approx\gamma_{14}$.

Note that initialization can alternatively be performed by measuring the qubit's state. If the measurement result is |0>, initialization is complete. Otherwise, one can apply a $\pi$ pulse (see below) to obtain |0> (this can be followed by a second measurement to cope with any imperfections in the pulse application).

V. Single Qubit Operations

Single qubit operations are generated by the single qubit Hamiltonian (15). As stressed in sections II and III, the coefficients $\epsilon(I)$ and $\Delta(I)$ of this effective Hamiltonian can be controlled through the transport current I. This gives the possibility to coherently manipulate the qubit's state.

Let us first consider locally-coupled multi-terminal qubits for which $\delta=0$. In this situation, $\epsilon(I)$ is fixed to zero and only $\Delta(I)$ is externally controllable. For coherent manipulations, the control current I should not exceed the critical value $I_c\approx 1$ where the system becomes non-stationary. In practice, the maximum allowed value for I is slightly less than this critical value in order to avoid tunneling and thermally activated processes in $\theta$-direction. Hence, currents roughly in the range [0, 1[ are useful for coherent control of $\Delta(I)$. In this range, the barrier height $U_b(I)$ changes by a factor of ½.

Since tunneling amplitude $\Delta(I)$ is exponentially dependent on this parameter, reducing $U_b(I)$ by a factor of ½ can have a significant effect on the value of $\Delta(I)$. Thus, one can practically switch tunneling on and off by applying transport currents I=1 and I=0 respectively. As a result, when I=0. the qubit does not evolve, it is 'frozen'. With a transport current I=1 however, the effective Hamiltonian is $\Delta(1)\sigma_x$. and the qubit's evolution operator is $$X(\alpha) \equiv e^{-i\sigma_x\alpha/2}. \quad (18)$$

with $\alpha=2E_0 \Delta(1) t/\hbar$ and where we reintroduced proper units for the tunneling splitting. Choosing t and I such that $\alpha=\pi$, one obtains the $\pi$ pulse of the previous section. Therefore, for $\delta=0$. a qubit is either frozen (I=0) or undergoes coherent oscillations (I$\approx$1).

In the asymmetric current configuration of FIG. 15, $\delta\neq 0$ and the transport current will also produce an energy bias. When the bias exceeds the level width, tunneling between the two basis states stops because they are out of degeneracy [11]. Hence, if I=0. the levels are degenerate but the qubit is frozen because the barrier height is at it's maximum. When I=1 however, $\epsilon(I)$ reaches it's maximum value $\sqrt{2}\delta$ and the barrier height it's minimum value. Coherent tunneling is nevertheless prohibited because the degeneracy condition is not satisfied. As a result, for $\delta\neq 0$ a qubit can either be frozen (I=0) or the effective Hamiltonian $\epsilon(I)\sigma_z$ is generating a phase difference between the basis states (I>0)

$$Z(\beta) \equiv e^{-i\sigma_z\beta/2}, \quad (19)$$

with $\beta=2E_c\epsilon(I)t/\hbar$.

It is well known that to implement arbitrary single qubit logical operations, one needs rotations around at least two orthogonal axis [12]. Since the situations $\delta=0$ and $\neq 0$ cannot be realized in the same 4-terminal SQUID we clearly have not yet reached this goal. Different ways to remedy this are possible. First, for $\delta\neq 0$ the 4-terminal SQUIDs can be engineered such that for I=0 tunneling is not suppressed (e.g. by working with smaller capacitances). In this case, both $X(\alpha)$ and $Z(\beta)$ operations are possible. It was shown in [13] how, in that situation, to 'freeze' a qubit evolution using NMR-like refocusing sequences. Alternatively, for $\delta=0$. it will become clear in section VII that by using two-qubit gates and the single-qubit gate $X(\alpha)$, one can implement arbitrary single-qubit gates. Finally, we will see in the next section how the 4-terminal SQUID can be modified to effectively combine both the $\delta=0$ and $\delta\neq 0$ cases.

Before moving on, some comments are in order. First, for $\delta=0$. when setting the transport current to I=0. one would expect the qubit to be frozen. However, since the tunneling amplitude $\Delta(0)$ is not identically zero, care must be taken to prevent residual coherent tunneling from introducing bit flip errors. Accordingly, we require that the time for a bit flip when the qubit should be frozen $\hbar\pi/2E_0\Delta(0)$ be much larger than the time $\hbar\pi/2E_0\Delta(1)$ when coherent oscillation are desired (when I$\approx$1). For the error probability to satisfy the threshold condition for fault-tolerant quantum computation [2], one then roughly requires that $\Delta(0)<10^{-4}\Delta(1)$ or equivalently that $U_b(0)>4n10\omega_0$. which in turns puts a limit on the size of the capacitor $$C > \frac{(4\ln 10)^2}{\mathcal{L}U_b(0)^2}. \quad (20)$$

Moreover, it is important to make sure that the bias energy is always less than the difference between the energy of the lowest energy states and the first exited state. Otherwise, there might be leakage out of the computational Hilbert space causing loss of information [14]. To avoid this undesirable tunneling we require $\delta < \omega_0/\sqrt{2}$.

Finally, the double well potential (4) is obtained from (A18) which is a function of $\phi$ and $\theta$. It is through relation (16) that $\theta$, and thus $U_\phi$, is a function of the transport current I. To obtain (4) however, the small term proportional to $\delta$ in (16) was dropped. For very small $\delta$, this is reasonable but care should be taken because, through this term, $\theta$ does not only depend on the transport current I but also on the qubit's state. Since $\theta$ is not an observable quantity, this will not lead to additional environmental coupling. However, this effect, although very small can cause computational errors after a large number of operations. To minimize this, the junction parameter $\delta$ should then be chosen as small as possible. Since we are interested in junctions such that $\delta \ll \gamma \ll 1$, this corresponds to $\gamma_{13}$, $\gamma_{14} \ll \gamma_{12}$ and is not hard to achieve in practice. Note however that while this later requirement is in agreement with (17), junctions with very small $\delta$'s will require a correspondingly high level of accuracy in the applied transport current for measurement.

VI. Mesoscopic 5-Terminal Qubits

Figure 14B:
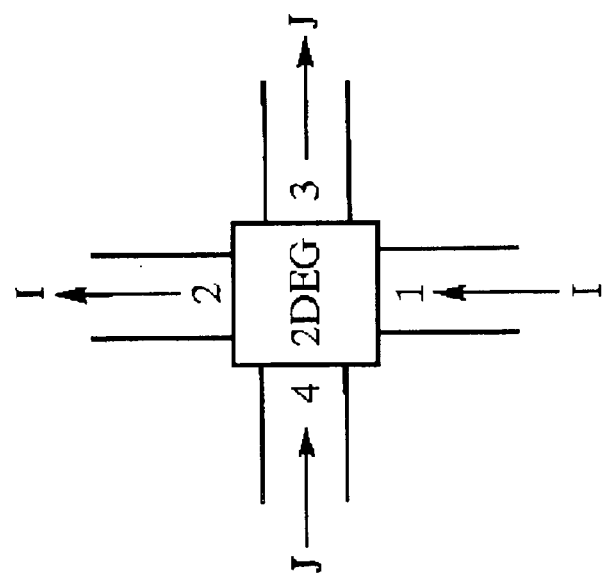
Figure 14A:
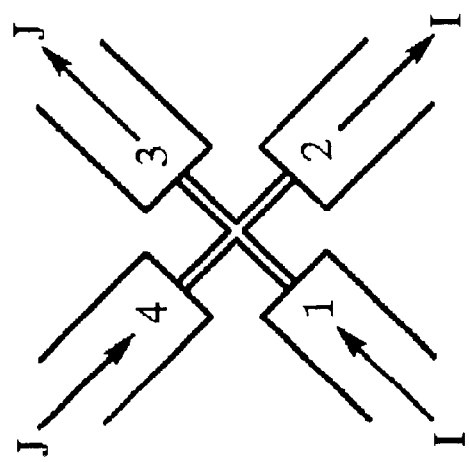

As exposed in the previous section, junctions with $\delta=0$ and $\delta \neq 0$ offer complementary possibilities for single bit operations and it would be practical to combine those possibilities in a single qubit design (this would for example remove the need of refocusing to freeze qubits in the asymmetric current configuration). This is impossible for the single 4-terminal SQUID because, as seen in FIGS. 14*b*) and 14*c*), non-local and local coupling of currents inside the 2DEG layer are realized in differently engineered junctions.

Figure 16:
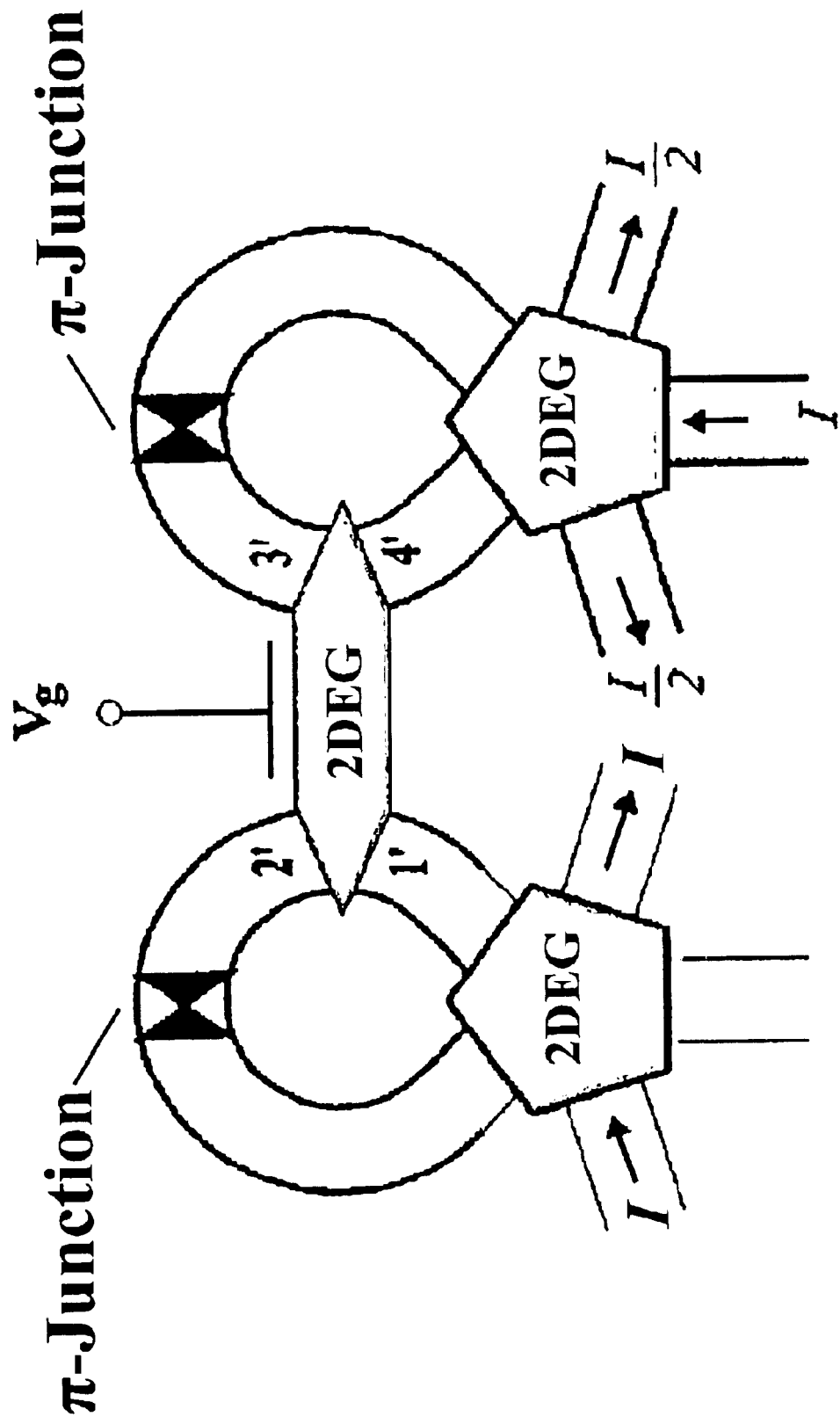
FIG. 16. Two coupled five-terminal qubits. The left qubit has an asymmetric current configuration while the right one has a symmetric one.

We suggest here to use the 5-terminal junctions illustrated in FIG. 16. Coupling between the two flux rings is used to create entanglement and will be discussed in the next section. The extra lead for transport current in this design gives the opportunity to use either symmetric ($\delta=0$) or asymmetric ($\delta \neq 0$) current configurations. More specifically, the qubit on the left hand side of FIG. 16 (where the middle junction is disconnected from the current source) is completely equivalent to the asymmetric 4-terminal SQUID. In this configuration, the transport current tunes $\epsilon(I)$ (as discussed in the previous section, it will also tune $\delta(I)$ but as long as the truncation conditions hold, this does not change the dynamics). On the other hand, the rightmost qubit in FIG. 16 is in the symmetric configuration and therefore $\delta=0$. For the current values indicated on the leads of this qubit, the description is analogus to the 4-terminal case already discussed. Therefore, in this symmetric configuration, the transport current tunes $\Delta(I)$ while $\epsilon(I)$ is fixed to zero.

As a result, without transport current, the 5-terminal qubit is frozen (with appropriately chosen junction parameters). Applying a transport current $I \approx 1$ in the symmetric configuration a $X(\alpha)$ logical operation is performed while the asymmetric configuration yields a $Z(\beta)$ operation. Arbitrary single qubit gates are then readily implementable in this design. This is done without manipulation of external fluxes but by injecting currents in appropriate leads.

Note finally that measurement and initialization should be performed here using the asymmetric current configuration.

VII. Two-Qubits Operations

To obtain a universal set of gates for the 5-terminal qubits, a prescription for a non-trivial qubit-qubit interaction is needed [12]. Here again, this interaction is provided by the phase dragging effect. Two qubits axe coupled through an additional mesoscopic 4-terminal junctions as presented schematically in FIG. 16.

The interaction can be turned off by applying a gate voltage to the 2DEG region between the two qubits. This voltage depletes the middle region and, as a result, prevents coherent coupling between the two flux loops. This interaction is studied in more details in appendix B and the resulting effective two-qubit Hamiltonian is $$H_{2qb} = H_1 + H_2 + \Omega_{1,z} \otimes \sigma_{2,z}. \tag{21}$$

where $i=1, 2$ indexes the qubits, $H_i$ is the one-qubit Hamiltonian (15) and $$\Omega = \frac{\delta' \gamma^2}{\kappa'^2}. \tag{22}$$

The primed coefficients are parameters of the connecting 4-terminal junction (see appendix B). As indicated in the previous sections, the single qubits Hamiltonians can be manipulated individually through their transport current leads. When no transport current is applied on either qubits and when the 2DEG connecting the two qubits is not depleted, the system's evolution operator is then given by $$CP(\zeta) = e^{-i\zeta \sigma_{1,z} \otimes \sigma_{2,z}/2}, \tag{23}$$

where $\zeta = 2E_0 \Omega t/\hbar$ and CP stands for 'Conditional Phase shift'.

Figure 17:
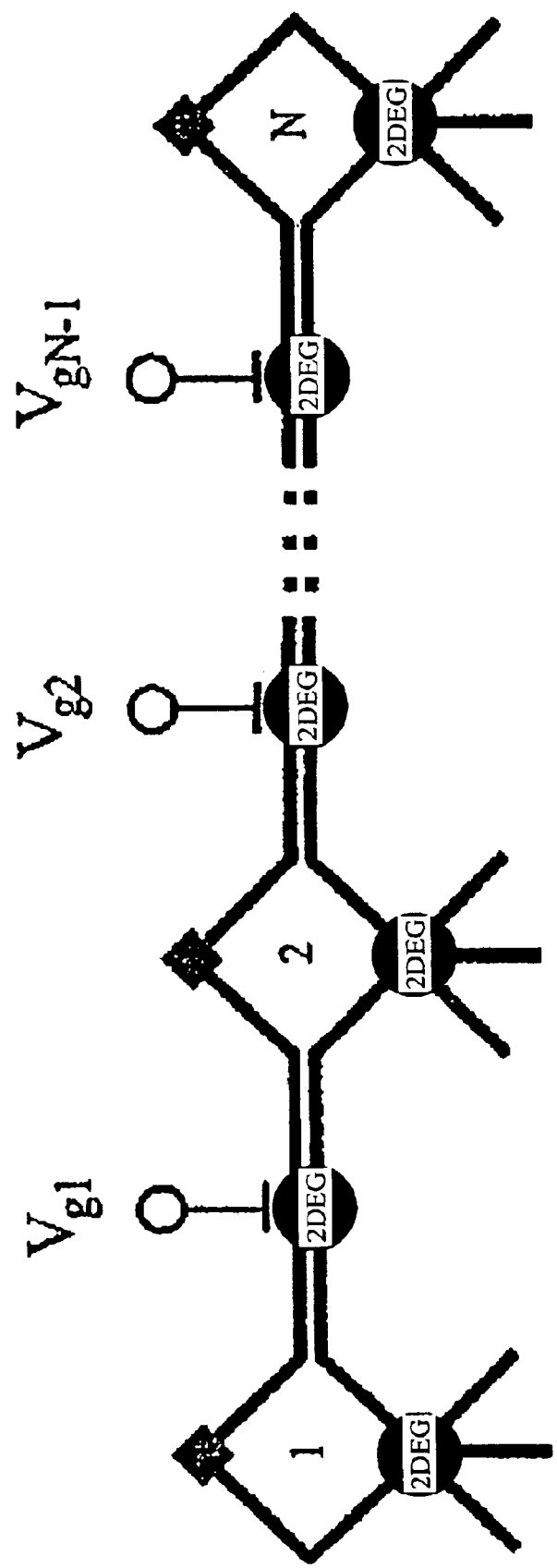
FIG. 17. System of N coupled qubits. The distance between the flux regions is maximized to have less magnetic interaction between qubits.

As schematically shown in FIG. 17, N qubits can be connected in this way to form an N-qubit quantum register. From the 2-qubit logical operation $CP(\zeta)$ and the single-qubit gates defined earlier, it is possible to implement arbitrary N-qubit logical operations on such a register [13]. For example, a Controlled-NOT gate can be implemented, lip to an irrelevant global phase factor, by the following sequence of one- and two-qubit gates $$CN_{12} = X_2(3\pi/2)CP_{12}(\pi/2)Z_2(\pi/2)X_2(\pi/2)CP_{12}(\pi/2)Z_2(\pi/2)Z_1(\pi/2) \tag{24}$$

Some comments are in order. First, magnetic interaction between qubits should be very small to eliminate decoherence due to unwanted qubit-qubit interactions. The qubits should therefore be disposed in such a way as to keep the regions containing the maximum flux farthest apart. Secondly, it is possible, in this design, to apply logical operations simultaneously on distinct qubits. Since it is known that only quantum computers having this kind of classical parallelism can hope to satisfy a threshold condition for fault-tolerant quantum computation [2,15], this is a major advantage of this design. Note that not all (solid-state) quantum computer architectures have this ability [4].

Moreover, FIG. 17 shows an N-qubit array in it simplest design: a linear array of qubits limited to nearest-neighbor couplings. While more complex coupling schemes are possible, this configuration is, at least for some computational tasks, sufficient [16]. Finally, as announced in section V, for two-coupled 4-terminal SQUIDs in the symmetric configuration (i.e. where $\delta=0$ for both qubits), the two-qubit gate $CP(\zeta)$ and the single-qubit gate $X(\alpha)$ are universal. This is quite obvious because $CP(\zeta)$ gives the possibility of accumulating relative phases, something which was absent when only $X(\alpha)$ was available.

VIII. Decoherence

As for any other qubit design, the most important limitation for performance is decoherence due to interaction of the qubits with the environment. Many sources of decoherence that may be active for superconducting flux qubits were discussed in [17]. see also [4]. These are fluctuation of background charges, quasiparticule tunneling in the superconductors, coupling of fluxes to nuclear spins, electromagnetic radiation and finally unwanted magnetic qubit-qubit couplings. At low temperature and for small equilibrium fluxes, coherence time was shown to be limited by the later source [17]. In the present design, this can be minimized as was discussed in the previous section.

Let us now consider additional sources that may cause decoherence in this system. One potential source of decoherence is the fluctuations of the external transport currents. These cause fluctuations of the tunneling matrix element $\Delta(I)$ and of the energy bias $\epsilon(I)$ and in turn affects the relaxation and dephasing time of the qubit [4,20]. The effects of fluctuations of a general external control field on the relaxation and dephasing times of a qubit are described in [4]. We will consider here fluctuations of transport current in the asymmetric configuration where they should affect dephasing and relaxation more strongly. In this situation, fluctuations of currents $\delta I$ will provide a term of the form $\sigma_z \delta I$ in the system+environment Hamiltonian. The power spectrum of the current fluctuations is given by Johnson-Nyquist relation $$I_0^2 \langle \delta I \delta I \rangle_\omega = Re\{Z(\omega)^{-1}\} \hbar \omega \coth\left(\frac{\hbar \omega}{2 k_B T}\right), \quad (25)$$

where $Z(\omega)$ is the impedance of the transport current circuit. For a purely real impedance, $R_I$. the strength of qubit-environment coupling is characterized by the dimensionless parameter [4,21]

$$\alpha_z = \frac{R_K}{4 R_I} \delta^2, \quad (26)$$

where $R_K = h/e^2$ is the quantum resistance. Hence, to minimize coupling, $R_I$ should be as large as possible and $\delta$ small. This last constraint goes along the constraints already imposed on $\delta$ in sections IV and V. From (26), one can estimate the relaxation and dephasing times respectively given by $$\tau_{relax}^{-1} \approx \pi^2 \delta^2 \left(\frac{R_K}{R_I}\right)\left(\frac{\Delta E}{h}\right) \coth\left(\frac{\Delta E}{k_B T_{cs}}\right) \quad (27)$$

$$\tau_\varphi^{-1} \approx \frac{1}{2} \tau_{relax}^{-1} + \pi^2 \delta^2 \left(\frac{R_K}{R_I}\right)\left(\frac{k_B T_{cs}}{h}\right). \quad (28)$$

where $\Delta E = \sqrt{\epsilon(I)^2 + \Delta(I)^2}$ and $T_{cs}$ is the temperature at which the current source circuit operates, which is not necessarily equal to the working temperature of the qubits (T). $T_{cs}$ is usually higher than T. In the large $T_{cs}$ limit, the two terms in (29) have the same functional form and we find $$\tau_\varphi^{-1} \approx \frac{3}{2} \pi^2 \delta^2 \left(\frac{R_K}{R_I}\right)\left(\frac{k_B T_{cs}}{h}\right). \quad (29)$$

The relevant parameter for quantum computation is less the dephasing time by itself than the quality factor Q: the ratio of the dephasing time over the characteristic time it takes to implement a single logical operation. For the asymmetric current configuration this characteristic time is $\hbar/E_0 \delta$ and we obtain for the quality factor $$Q \approx \frac{2}{\pi \delta}\left(\frac{R_I}{R_K}\right)\left(\frac{E_0}{k_B T}\right). \quad (30)$$

For typical junction parameters, the Josephson energy $E_0 = \hbar I_0/2e$ is of the order of XX. For the corresponding frequency of operation of the qubit, the lead impedance is of the order of the vacuum impedance and thus $R_I \sim 100 \Omega$ [4,22]. Since $\delta << 1$. for working temperatures in the milliKelvin range, the quality factor should be large. The ratio $R_I/R_K \sim 10^{-3}$ is the limiting factor here. However, as we shall shortly see, this ratio could potentially be modulated.

The finite conductance of the normal quasiparticles through the 2DEG can also cause decoherence. The coupling of the quasiparticle current to the system is through the term $I_{qp} \phi_0(I) \sigma_z$. Following exactly the same procedure as above we find $$\alpha = \frac{R_K}{(2\pi)^4 R_{qp}} \varphi_0^2(I), \quad (31)$$

where $R_{qp}$ is the quasiparticle resistance of the junction (or shunt resistance in the Resistively Shunted Junction (RSJ) model). At small temperatures ($k_B T << \Delta E$) we find $$\tau_\varphi^{-1} \approx \frac{1}{2} \tau_{relax}^{-1} \approx \frac{\varphi_0^2(I)}{32\pi^3}\left(\frac{R_K}{R_{qp}}\right)\left(\frac{\Delta E}{h}\right) \coth\left(\frac{\Delta E}{k_B T}\right) \approx \frac{\varphi_0^2(I)}{32\pi^3}\left(\frac{R_K}{R_{qp}}\right)\left(\frac{\Delta E}{h}\right). \quad (32)$$

Although (32) does not show explicit T dependence at low temperatures, $R_{qp}$ depends on temperature. As shown in [18]. the quasiparticle resistance is $R_{qp} \sim T \cosh^2(E_s/2 k_B T)$, where $\pm E_s$ are the energies of the Andreev bound states inside the normal region. $R_{qp}$ exponentially diverges as $T \to 0$. Thus by working at low temperatures, this source of decoherence is made negligible. This is along the same line of reasoning as the discussion in [17] on decoherence due to quasi-particules tunneling in tunnel junctions although $E_s$ can be much smaller than the gap $\Delta_0$. which is the energy scale that comes into the exponent in tunnel junctions.

Moreover, care must be taken that the ac Josephson voltage generated by the phase fluctuations does not generate inter-Andreev level transitions [19]. This imposes $\omega_0 < E_s$ which therefore requires that $C > 1/LE_s^2$. This constraint on the capacitance does not contradict the condition (20) already imposed in section V to minimize bit flip errors.

Pairs of qubits are also coupled to the electromagnetic environment through the gate voltage used to tune qubit-qubit interactions. When this interaction is turned off, i.e. when the coupling 4-terminal junction of FIG. 16 is depleted, small fluctuations of the voltage should have no effect on qubits as long as the gate voltage is large enough. This is because the fluctuations of voltage introduce fluctuations in phase $\phi'$ (through the parameter k', see appendix B). Since $\phi' << \phi(k' >> \gamma)$, these fluctuation couple very weakly to the state of qubits and therefore do not introduce considerable decoherence. Moreover, these fluctuations can be minimized by working with a low resistance voltage source [4, 20]. When the voltage is turned off, the region is no longer depleted and the qubit-qubit interaction is on. In this case, since the gate voltage is zero, the voltage source can be practically disconnected from the circuit and therefore no decoherence will be introduced.

An additional source of dephasing is the spread in qubit parameters and the errors in gate applications that follows. This is common to all solid state architectures and can be taken into account, for example, by calibration [24].

Decoherence in this design is then limited by fluctuations of transport currents. With the estimated working frequencies, about XX logical operations can be performed within the dephasing time due to this source.

An advantage of this qubit design is that logical operations are not performed by manipulations of externally applied magnetic fluxes. For rf-SQUIDs and for the qubits introduced in [5]. independently controlled fluxes of the order of $\Phi_0/2$ must be applied to two different regions of each qubit. Given the size of those structures this is a technically challenging issue and imperfect shielding will cause dephasing.

Moreover, in the design studied here, since the flux is not used to manipulate qubit's state it can be replaced by $\pi$-phase shifters as discussed in section II. Inclusion of these elements can complicate the fabrication, as this will, for example, necessitate the use of d-wave superconductors. Alternatively, static external magnetic fluxes can be used. In this case however, fluctuations of the fluxes provide yet another coupling to the environment. As long as the spread in loop sizes is not to large, a single magnetic field can be applied to all qubits. In this case, the qubits are coupled to the same electromagnetic environment and, encoding two physical qubits in one logical qubit, the techniques of decoherence-free subspaces can be used [25,26]. These techniques where implemented successfully to protect quantum information from decoherence in situations where the qubit-environment coupling symmetry was the same as the one here [27,28].

Finally, one of the great challenges in the implementation of an useful quantum computing device is that coupling to the environment should be as weak as possible during coherent manipulations (i.e. computations) but should be as strong as possible during initialization. This later requirement comes, in part, from the fact that many error correction techniques requires continuous supply of fresh ancilla qubits. Therefore if initialization is slow (i.e. coupling to the environment is weak), the logical qubits for which error correction is intended will have had the time to decohere before fresh ancilla are prepared [6]. A possible solution is to initialize all the necessary qubits beforehand and distribute them in the quantum register as needed during computation [6]. This will however require very large quantum registers and many manipulations of qubit's state. Another possibility, is to tune the individual qubit's environment as needed either for computation or initialization. A possible way to implement this tunable environment is to use as transport current leads one-dimensional arrays of dc-SQUIDS as was done recently in [23]. By applying an external flux, the array act as a tunable electromagnetic environment where $R_I$ can be changed by many orders of magnitudes. Hence, during coherent manipulations using the asymmetric current configuration, one chooses a high resistance environment while during initialization, a small $R_I$. If this can be done on individual qubit, one can then tune the decoherence time of individual qubits by many orders of magnitude.

IX. Summary and Conclusion

We described in this paper novel superconducting flux qubits. These qubits are built from mesoscopic 4-terminal junctions. The logical states are represented by different orientations of persistent current in a superconducting loop. The corresponding fluxes differ only by a fraction of the flux quantum and therefore only weak coupling to the environment is to be expected. Logical operations are performed, through the phase dragging effect, by applications of transport currents. This compares favorably to other superconducting flux qubits [4,5,24]. where two independent controllable external fluxes must be coupled to each qubits.

Measurement is performed by applying a precisely tuned transport current in the control leads. As opposed to the other flux qubits, there is then no need to couple an additional dc-SQUID to the qubits and consequently simplifies fabrication and manipulations.

Decoherence should be slow in this system allowing for a large number of logical operations to be applied. To help in further reducing the impact of qubit-environment couplings, encoding physical qubits into decoherence free subspaces [25,26] or the use of active error correction techniques [2,29] is possible.

Appendix A: The 4-Terminal Squid

We start from the current-phase relationship (1) to derive the free energy for the four terminal SQUID. The expression (1) is simplified considerably near T=0 and near $T_c$. Near T=0 one finds $$I_i = \frac{\pi \Delta_0}{e} \sum_{j=1}^{4} \gamma_{ij} \sin\left(\frac{\varphi_i - \varphi_j}{2}\right) \text{sign}\left[\cos\left(\frac{\varphi_i - \varphi_j}{2}\right)\right]. \tag{A1}$$

The Josephson coupling energy of the junction, $E_J$. which is related to the supercurrents $I_i$ in Eq. (A1) through the relation $I_i = (2e/\hbar) \partial E_J / \partial \phi_i$ is given by $$E_J = -\frac{\hbar}{2e} \frac{\pi \Delta_0}{e} \sum_{i<j} 2\gamma_{ij} \left|\cos\left(\frac{\varphi_i - \varphi_j}{2}\right)\right| \tag{A2}$$

Near $T_c$ on the other hand, one can write $$I_i = \frac{\pi \Delta_0(T)^2}{4eT_e} \sum_{j=1}^{4} \gamma_{ij} \sin(\varphi_i - \varphi_j). \tag{A3}$$

with the Josephson coupling energy $$E_J = -\frac{\hbar}{2e} \frac{\pi \Delta_0(T)^2}{4eT_c} \sum_{i<j} \gamma_{ij} \cos(\varphi_i - \varphi_j). \tag{A4}$$

In the subsections A and B we derive the free energy of a four terminal SQUID in these two limits. By comparing the results of the two subsections, one can easily see that the main properties are the same in the two extreme cases, $T \approx 0$ and $T \approx T_c$. Therefore one can conclude that similar behavior should be expected at all other temperatures. For simplicity of calculations, in this article more focus on temperatures close to zero, which is the appropriate limit for qubit operation.

Considerable simplification in the calculation will be achieved if $$\gamma_{13} = \gamma_{24}, \; \gamma_{14} = \gamma_{23} \tag{A5}$$

In that case X, as defined in (3), can only take two values X=0 or $\pi$ (see subsections A and B). This condition naturally happens in a mesoscopic 4-terminal junction with square geometry.

1. The Free Energy Near T=0

At T=0 the Josephson energy of the 4-terminal junction will have the form $$E_J = -\sum_{ij} 2\gamma_{ij} \left|\cos\left(\frac{\varphi_i - \varphi_j}{2}\right)\right| \quad (A6)$$

The energy is in units of $E_0 = \hbar I_0/2e$, the Josephson energy of between terminals 1–2, and $I_0 = \pi\Delta_0/2e$ is the Josephson critical current between those terminals at T=0. If we use the definitions of Eq. (3), the coupling part of the Josephson energy becomes $$E_{coup} = -2\left[\gamma_{13}\left|\cos\left(\frac{\phi+\theta}{4} - \frac{\chi}{2}\right)\right| + \gamma_{23}\left|\cos\left(\frac{\phi-\theta}{4} - \frac{\chi}{2}\right)\right| + \gamma_{14}\left|\cos\left(\frac{\phi-\theta}{4} + \frac{\chi}{2}\right)\right| + \gamma_{24}\left|\cos\left(\frac{\phi+\theta}{4} + \frac{\chi}{2}\right)\right|\right]$$

We use the simplifying assumption (A5) to get $$E_{coup} = -4\gamma_{13}\text{Max}\left\{\left|\cos\left(\frac{\phi+\theta}{4}\right)\cos\frac{\chi}{2}\right|, \left|\sin\left(\frac{\phi+\theta}{4}\right)\sin\frac{\chi}{2}\right|\right\} - 4\gamma_{14}\text{Max}\left\{\left|\cos\left(\frac{\phi-\theta}{4}\right)\cos\frac{\chi}{2}\right|, \left|\sin\left(\frac{\phi-\theta}{4}\right)\sin\frac{\chi}{2}\right|\right\}$$

In the presence of a $\pi$-junction or an external flux $\phi_e = \pi$, we substitute $\phi \to \phi = \phi - \pi$ $$E_{coup} = -4\gamma_{13}\text{Max}\left\{\left|\cos\left(\frac{\pi+\varphi+\theta}{4}\right)\cos\frac{\chi}{2}\right|, \left|\sin\left(\frac{\pi+\varphi+\theta}{4}\right)\sin\frac{\chi}{2}\right|\right\} - 4\gamma_{14}\text{Max}\left\{\left|\cos\left(\frac{\pi+\varphi-\theta}{4}\right)\cos\frac{\chi}{2}\right|, \left|\sin\left(\frac{\pi+\varphi-\theta}{4}\right)\sin\frac{\chi}{2}\right|\right\}$$

For small $\phi$ and $\theta$ $$\cos\left(\frac{\pi+\varphi\pm\theta}{4}\right) \approx \sin\left(\frac{\pi+\varphi\pm\theta}{4}\right) \approx \frac{1}{\sqrt{2}} \quad (A7)$$

In that case, the minimum of the energy with respect to $\chi$ happens when $\chi=0$ or $\pi$. Otherwise $\chi$ has to be close to $\pi/2$ and adds an additional undesirable factor of $1/\sqrt{2}$. Therefore we can write $$E_{coup} = -4\text{Max}\left\{\gamma_{13}\left|\cos\left(\frac{\pi+\varphi+\theta}{4}\right)\right| + \gamma_{14}\left|\cos\left(\frac{\pi+\varphi-\theta}{4}\right)\right|, \gamma_{13}\left|\sin\left(\frac{\pi+\varphi+\theta}{4}\right)\right| + \gamma_{14}\left|\sin\left(\frac{\pi+\varphi-\theta}{4}\right)\right|\right\} \quad (A8)$$

Substituting $\gamma = \gamma_{13} + \gamma_{14}$ and $\delta = \gamma_{13} - \gamma_{14}$ after some manipulations $$E_{coup} = -2\text{Max}\left\{(\gamma+\delta)\left|\cos\left(\frac{\pi+\varphi+\theta}{4}\right)\right| + (\gamma-\delta)\left|\cos\left(\frac{\pi+\varphi-\theta}{4}\right)\right|, (\gamma+\delta)\left|\cos\left(\frac{\pi-\varphi-\theta}{4}\right)\right| + (\gamma-\delta)\left|\cos\left(\frac{\pi-\varphi+\theta}{4}\right)\right|\right\} \quad (A9)$$

When $\theta=0$, the first (second) argument of Max is the largest for negative (positive) $\phi$. Changing the sign of $\phi$, the maximum switches from one argument to another. This results in two minima for the energy at two $\phi$'s with opposite signs. At finite $\theta$, the two minima still exist as long as $|\theta| < \theta_{max}$, where $\theta_{max}$ is the value of $\theta$ at which the two terms inside Max become equal. $\theta_{max}$ can be obtained by solving $$\theta_{max} = 4\tan^{-1}\left(\frac{\gamma}{\delta}\tan\frac{\varphi(\theta_{max})}{4}\right) \quad (A10)$$

where $\phi(\theta_{max})$ is the equilibrium value of $\phi$ at $\theta = \theta_{max}$. Using the minimum value for equilibrium $\phi$ we find $$\theta_{max} = 4\tan^{-1}\left(\frac{\gamma}{\delta}\tan\frac{\gamma\mathcal{L}}{8}\right) \approx 4\tan^{-1}\left(\frac{\gamma^2\mathcal{L}}{8\delta}\right) \quad (A11)$$

By making $\delta \ll \gamma$ we can make $\theta_{max}$ large enough so that we have bistability for all $-\pi < \theta < \pi$. We then can write $$E_{coup} = -2\gamma\left[\cos\left(\frac{\pi-|\varphi|-\theta}{4}\right) + \cos\left(\frac{\pi-|\varphi|+\theta}{4}\right)\right] - 2\delta\left[\cos\left(\frac{\pi-|\varphi|-\theta}{4}\right) - \cos\left(\frac{\pi-|\varphi|+\theta}{4}\right)\right]\text{sign}(\varphi) \quad (A12)$$
$$= -4\gamma\cos\frac{\theta}{4}\cos\left(\frac{\pi-|\varphi|}{4}\right) - 4\delta\sin\frac{\theta}{4}\sin\left(\frac{\pi-|\varphi|}{4}\right)\text{sign}(\varphi)$$

Assuming small $\phi_1$ the free energy of a 4-terminal SQUID, can therefore be written as $$U = \frac{\varphi^2}{2\mathcal{L}} - I\theta - 2\cos\frac{\theta}{2} - \kappa|\varphi| - 2\sqrt{2}\,\gamma\left(1 + \frac{|\varphi|}{4}\right)\cos\frac{\theta}{4} - 2\sqrt{2}\,\delta\left(1 - \frac{|\varphi|}{4}\right)\sin\frac{\theta}{4}\text{sign}(\varphi) \quad (A13)$$

We are interested in the limit where $\delta, \kappa \ll \gamma \ll 1$. Minimizing with respect to $\theta$, we will have $$I = \sin\frac{\theta}{2} + \frac{\gamma}{\sqrt{2}}\left(1 + \frac{|\varphi|}{4}\right)\sin\frac{\theta}{4} - \frac{\delta}{\sqrt{2}}\left(1 - \frac{|\varphi|}{4}\right)\cos\frac{\theta}{4}\text{sign}(\varphi) \quad (A14)$$

The second term adds a small correction to the critical current which can be neglected. The last term on the other hand, changes sign from one minimum to another. This is important in the readout of the final state. The current-phase relation therefore can be written approximately as $$I = \sin\frac{\theta}{2} - \frac{\delta}{\sqrt{2}}\cos\frac{\theta}{4}\text{sign}(\varphi) \quad (A15)$$

The last term in (A15) can cause computation error when large number of operations is involved. Thus we want it to be small. Neglecting the last term we find $$\theta = 2\sin^{-1}(I) \quad (A16)$$

The $\phi$-dependent part of the free energy will then be $$U_\varphi = \frac{\varphi^2}{2\mathcal{L}} - \frac{\gamma}{\sqrt{2}}|\varphi|\cos\frac{\theta}{4} - 2\sqrt{2}\,\delta\sin\frac{\theta}{4}\text{sign}(\varphi) \quad (A17)$$

We can write this energy as $$U_\varphi(I) = \frac{1}{2\mathcal{L}}[|\varphi| - \varphi_0(I)]^2 - \varepsilon(I)\text{sign}(\varphi) - U_b(I) \quad (A18)$$

with $$\varphi_0(I) = \frac{\varphi_0(0)}{\sqrt{2}}(1 + \sqrt{1-I^2})^{1/2}, \quad (A19)$$

$$\varepsilon(I) = \varepsilon_0 I(1 + \sqrt{1-I^2})^{-1/2}, \quad U_b(I) = \frac{1}{2}U_b(0)(1 + \sqrt{1-I^2})$$

But now $\phi_0(0) = \gamma \mathcal{L}/\sqrt{2}$, $\epsilon_0 = 2\delta$ and $U_b(0) = \phi_0(0)^2/2\mathcal{L}$.

2. The Free Energy Near $T_c$

Near $T_c$, we simply write the Josephson energy as $$E_J = -\sum_{i<j} \gamma_{ij} \cos(\varphi_i - \varphi_j) \quad (A20)$$

Here the energy is in units of $E_0 = \hbar I_0/2e$, the Josephson energy of between terminals 1–2, with $I_0 = \pi \gamma_{12} \Delta_0^2/4eT_c$ being the Josephson critical current between those terminals. We also normalize all other $\gamma_{ij}$ to $\gamma_{12}$. Introducing the new variables as in Eq.(3), we can write the Josephson energy of the junction in units of $E_0 = \hbar I_0/2e$ as $$E_J = -\cos\theta - \gamma_{34}\cos\phi + E_{coup} \quad (A21)$$

where $$E_{coup} = -\left[\gamma_{13}\cos\left(\frac{\phi+\theta}{4} - \frac{\chi}{2}\right) + \gamma_{23}\cos\left(\frac{\phi-\theta}{4} - \frac{\chi}{2}\right) + \gamma_{14}\cos\left(\frac{\phi-\theta}{4} + \frac{\chi}{2}\right) + \gamma_{24}\cos\left(\frac{\phi+\theta}{4} + \frac{\chi}{2}\right)\right]$$

Assuming the condition (A5), and defining new parameters $\gamma = \gamma_{13} + \gamma_{14}$ and $\delta = \gamma_{13} - \gamma_{14}$ we find $$E_{coup} = -2\left(\gamma\cos\frac{\theta}{2}\cos\frac{\phi}{2} - \delta\sin\frac{\theta}{2}\sin\frac{\phi}{2}\right)\cos\chi \quad (A22)$$

Minimization with respect to $\chi$ leads to $\chi=0$ or $\pi$ depending on the sign of the expression inside the parenthesis. This is directly consequence of (A5). In cases more general than (A5), $\chi$ can take any value (other than 0 and $\pi$) and the expressions become more complicated. We therefore find for the total energy of the 4-terminal junction $$E_J = -\cos\theta - \kappa\cos\phi - 2\left|\gamma\cos\frac{\theta}{2}\cos\frac{\phi}{2} - \delta\sin\frac{\theta}{2}\sin\frac{\phi}{2}\right| \quad (A23)$$

with $\kappa = \gamma_{34}$. The free energy of a SQUID made of this 4-terminal junction is given by $$U = \frac{(\phi-\phi_e)^2}{2\mathcal{L}} - I\theta - \cos\theta - \kappa\cos\phi - 2\left|\gamma\cos\frac{\theta}{2}\cos\frac{\phi}{2} - \delta\sin\frac{\theta}{2}\sin\frac{\phi}{2}\right| \quad (A24)$$

Here, $\mathcal{L} = 2\pi I_0 L/\Phi_0 = 2eI_0 L/\hbar$ is the dimensionless inductance of the ring. Now let's assume that an external magnetic flux $\phi_e = \pi$ is applied to the SQUID loop. Changing the variable $\phi \to \phi = \phi - \pi$, will give $$U = \frac{\varphi^2}{2\mathcal{L}} - I\theta - \cos\theta + \kappa\cos\varphi - 2\left|\gamma\cos\frac{\theta}{2}\sin\frac{\varphi}{2} + \delta\sin\frac{\theta}{2}\cos\frac{\varphi}{2}\right| \quad (A25)$$

Exactly the same equation is obtained if one adds an ideal $\pi$-junction in the SQUID-loop instead of applying the external flux. In that case $\phi$ will correspond to the actual flux treading the loop ($\phi = 2\pi\Phi/\Phi_0$), and $\varphi$ ($= \phi + \pi$) will be the phase across the junction.

The interesting regime for qubit considerations is $\kappa \ll \delta$, $\gamma \ll 1$ and $\gamma\mathcal{L} \ll 1$. In this limit, the effect of the transport current on the qubit is maximal and the effect of the qubit in the current is minimal. The last condition insures that the difference between the flux produced in the two states is small and the qubits are so called "quite"; they do not interact with each other. The $\phi$-dependent part of the free energy can then be written as $$U_\varphi = \frac{\varphi^2}{2\mathcal{L}} - 2\left|\gamma\cos\frac{\theta}{2}\sin\frac{\varphi}{2} + \delta\sin\frac{\theta}{2}\cos\frac{\varphi}{2}\right| \quad (A26)$$

When the first term in the argument of the absolute value is the largest, the free energy remains unchanged when $\varphi \to -\varphi$. In that case, the free energy has two minima at two values of $\varphi = \pm\varphi_0$. Thus in order to achieve bistability the first term inside the absolute value should be the dominant one. This is possible only if $|\theta| < \theta_{max}$ where $$\theta_{max} = 2\tan^{-1}\left(\frac{\gamma}{\delta}\tan\frac{\varphi(\theta_{max})}{2}\right) \quad (A27)$$

Notice the similarity between this equation and (A11). At small $\varphi$ we can write $$U_\varphi = \frac{\varphi^2}{2\mathcal{L}} - \left|\gamma\varphi\cos\frac{\theta}{2} + 2\delta\sin\frac{\theta}{2}\right| \quad (A28)$$

Assuming that the sign of the argument inside the absolute value is determined by the first term, Eq. (A28) can be approximated by $$U_\varphi = \frac{\varphi^2}{2\mathcal{L}} - \gamma|\varphi|\cos\frac{\theta}{2} + 2\delta\text{sign}(\varphi)\sin\frac{\theta}{2} \quad (A29)$$

We find two minima at $\varphi_\pm = \pm\gamma\mathcal{L}\cos(\theta/2)$. The last term breaks the degeneracy between the two minima. The energies of the states become $$E_\pm = -\frac{1}{2}\gamma^2\mathcal{L}\cos^2\frac{\theta}{2} \mp 2\delta\sin\frac{\theta}{2} \quad (A30)$$

The energy difference between the levels will be $2\epsilon(\theta)$, where $$\epsilon(\theta) = 2\delta\sin\frac{\theta}{2} \quad (A31)$$

This term can provide $\sigma_z$ operation for quantum calculations.

The phase $\theta$ is determined by the transport current I. From Eq. (A25), the minimization $\partial U/\partial\theta = 0$ leads to $$I = \sin\theta + \frac{\gamma}{2}|\varphi|\sin\frac{\theta}{2} - \delta\cos\frac{\theta}{2}\text{sign}(\varphi) \qquad (A32)$$

The second term in (A14) is the same at both minima. The third term on the other hand, changes sign from one minimum to the other. This small correction is important in the readout of the qubit state but it causes error in quantum calculations. Since $\gamma, \delta \ll 1$, we can approximately write $$\theta = \sin^{-1}(I) \qquad (A33)$$

In terms of the current I, we can write the energy as $$U_\varphi(I) = \frac{1}{2\mathcal{L}}[|\varphi| - \varphi_0(I)]^2 - \varepsilon(I)\text{sign}(\varphi) - U_b(I) \qquad (A34)$$

$\phi_0$, $\epsilon$ and the barrier height $U_b(I)$ depend on the transport current I through $$\varphi_0(I) = \frac{\varphi_0(0)}{\sqrt{2}}(1 + \sqrt{1-I^2})^{1/2},$$

$$\varepsilon(I) = \varepsilon_0 I(1 + \sqrt{1-I^2})^{-1/2}, \qquad (A35)$$

$$U_b(I) = \frac{1}{2}U_b(0)(1 + \sqrt{1-I^2})$$

where $\phi_0(0) = \gamma\mathcal{L}$, $\epsilon_0 = 2\delta$ and $U_b(0) = \phi_0(0)^2/2\mathcal{L}$. These expressions are exactly the same as what we found near T=0.

Appendix B: Coupling Two Qubits

Let's consider two qubits coupled via a mesoscopic 4-terminal junction. Each qubit has its own control multi-terminal junction for manipulation and readout. The free energy of the coupled qubits is $$U = \frac{(\phi_1 + \phi_1' - \pi)^2}{2\mathcal{L}} + \frac{(\phi_2 + \phi_2' - \pi)^2}{2\mathcal{L}} + \qquad (B1)$$
$$E_{J1}(\phi_1, \theta_1) + E_{J2}(\phi_2, \theta_2) + E_{12}(\phi_1', \phi_2')$$

$E_{J1}$ and $E_{J2}$ are the Josephson energies of qubits 1 and 2 respectively. The qubits have the same parameters $\kappa$, $\gamma$ and $\delta$. $E_{12}$ is the Josephson energy of the coupling 4-terminal junction with parameters $\kappa'$, $\gamma'$ and $\delta'$, and phase differences $\phi_1'$ and $\phi_2'$ on both sides of the junction. Taking $\phi_1', \phi_2' \ll 1$, after simple algebra we find $$E_{12} = -\kappa'\cos\frac{\phi_1'}{2} - \kappa'\cos\frac{\phi_2'}{2} - 8\gamma'\cos\frac{\phi_1'}{4}\cos\frac{\phi_2'}{4} + 8\delta'\sin\frac{\phi_1'}{4}\sin\frac{\phi_2'}{4} \qquad (B2)$$

If $\kappa' \gg \gamma \gg \gamma', \delta'$, then the state of the qubits will be dominantly determined by $\phi_1$ and $\phi_2$. In that case, we can ignore $\phi_i'$ in all the calculations of the qubit states and the results previously obtained will hold. The value of $\phi_i'$ then can be obtained from the equilibrium value of $\phi_t(=\phi_i-\pi)$ by $$\phi_1' \approx 2\sin^{-1}\left(\frac{J_i}{\kappa'}\right) \approx 2\sin^{-1}\left(\frac{\varphi_i}{\kappa'\mathcal{L}}\right) \approx \frac{2\varphi_i}{\kappa'\mathcal{L}} \qquad (B3)$$

where $J_i$ is the current in the SQUID loop of the i-th qubit. The last term in (B2) give a coupling potential $$U_{coup} = \left(\frac{2\delta'}{\kappa'^2\mathcal{L}^2}\right)\varphi_1\varphi_2 \qquad (B4)$$

In quantum regime the total Hamiltonian for the two qubits will therefore be $$H_{tot} = H_1 + H_2 + H_{coup} \qquad (B5)$$

where $$H_i = \Delta(I_i)\hat{\sigma}_{i,x} - \epsilon(I_i)\hat{\sigma}_{2,z},$$

$$H_{coup} = \Omega\hat{\sigma}_{1,z}\hat{\sigma}_{2,z},$$

$$\mathcal{H}_i = \Delta(I_i)\hat{\sigma}_{i,x} - \varepsilon(I_i)\hat{\sigma}_{i,z}, \quad \mathcal{H}_{coup} = \Omega\hat{\sigma}_{1,z}\hat{\sigma}_{2,z}, \quad \Omega = \frac{\delta'\gamma^2}{\kappa'^2} \qquad (B6)$$

are the uncoupled Hamiltonian for the i-th qubit and $H_{coup}$ is the coupling Hamiltonian respectively.

[1] R. P. Feynman, *Feynman Lectures on Computation*. Addison-Wesley, New York, 1996.
[2] M. A. Nielsen and I. L. Chuang, *Quantum Computation and Quantum Information*. Cambridge University Press, Cambridge, 2000.
[3] A. J. Leggett, Prog. Theo. Phys., Suppl. No. 69, 80 (1980).
[4] Y. Makhlin, G. Schön, and A. Shnirman. To appear in Rev. Mod. Phys.; (cond-mat/0011269).
[5] J. E. Mooij, T. P. Orlando, L. Levitov, L. Tian, C. H. van der Wal, and S. Lloyd, Science 285, 1036 (1999).
[6] D. DiVincenzo, Fortschritte der Physik 48, 771 (2000).
[7] R. de Bruyn Ouboter, A. N. Omelyanchouk, Superlatt. & Microstruct., 23. N3–4. (1999) and references
[8] Malek Zareyan and A. N. Omelyanchouk, Low Temp. Phys. 25, 175 (1999); A. N. Omelyanchouk and Malek Zareyan, Phy B 291 (2000).
[9] A. Barone and G. Paternò, *Physics and Application of the Josephson Effect*. John Wiley & Sons, New York, 1982.
[10] B. J. Vleeming, F. J. C. van Bemmelen, M. R. Berends, R. de Bruyn Ouboter and A. N. Omelyanchouk, Physica B 262, 296 (1999).
[11] R. Rouse, S. Han and J. E. Lukens, Phys. Rev. Lett. 75, 1614 (1995).
[12] A. Barenco, C. Bennet, R. Cleve, D. Divincenzo N. Margolus, P. Shor, T. Sleator, J. Smolin and H. Weinfurter, Phys. Rev. A 52, 3457 (1995).
[13] A. Blais and A. M. Zagoskin, Phys. Rev. A 61, 042308 (2000).
[14] R. Fazio, G. M. Palma and J. Siewert, Phys. Rev. Lett. 83, 5385 (1999).
[15] D. Aharonov and M. Ben-Or (quant-ph/9611029).
[16] A. Blais, Phys. Rev. A, accepted for publication.
[17] L. Tian, L. S. Levitov, C. H. van der Wal, J. E. Mooij, T. P. Orlando, S. Lloyd, C. J. P. M. Harmans, and J. J. Mazo, in *Quantum Mesoscopic Phenomena and Mesoscopic Devices in Microelectronics*. edited by I. Kulik, and R. Elliatioglu, NATO-ASI Series E, Kluwer Ac. Publ., Dordrecht, 2000.
[18] A. levy Yeyati, A. Martin-Rodero and J. C. Cuevas, (cond-mat/9505102).
[19] A. M. Zagoskin, (cond-mat/9903170).
[20] U. Weiss, *Quantum Dissipative Systems*. World Scientific, Singapore, 1999.
[21] A. J. Leggett, S. Chakravarty, A. T. Dorsey, M. P. A. Fisher, A. Garg, and W. Zwerger, Rev. Mod. Phys. 59, 1 (1987).

[22] M. Tinkham, *Introduction to Superconductivty*, 2nd end. McGraw-Hill, New York, 1996.
[23] M. Watanabe and D. B. Haviland, (cond-mat/0103502).
[24] T. P. Orlando, J. E. Mooij, L. Tian, C. H. van der Wal, L. S. Levitov, S. Lloyd, and J. J. Mazo, Phys. Rev. B 60, 15398 (1999).
[25] P. Zanardi and M. Rasetti, Phys. Rev. Lett. 79, 3306 (1997).
[26] D. A. Lidar, I. L. Chuang, K. B. Whaley, Phys. Rev. Lett. 81, 2594 (1998).
[27] P. G. Kwiat, A. J. Berglund, J. B. Altepeter and A. G. White, Science 290, 498 (2000).
[28] D. Kielpinski, V. Meyer, M. A. Rowe, C. A. Sackett, W. M. Itano, C. Monroe and D. J. Wineland, Science 291, 1013 (2001).
[29] E. Knill and R. Laflame, Phys. Rev. A 55, 900 (1997).

What is claimed is:

1. A qubit, comprising:

a multi-terminal Josephson junction comprising at least two terminals; and a superconducting loop coupled between two of the at least two terminals;

wherein the superconducting loop provides a phase shift and wherein a portion of the phase shift is provided by a phase shifter that interrupts said superconducting loop at a point outside of said multi-terminal Josephson junction.

2. The qubit of claim 1, wherein the multi-terminal Josephson junction includes at least one constriction junction.

3. The qubit of claim 1, wherein the multi-terminal Josephson junction includes at least one tunnel junction.

4. The qubit of claim 3, wherein the tunnel junction is formed by an insulating layer separating two of the at least two terminals.

5. The qubit of claim 4, wherein the two of the at least two terminals are made from an s-wave superconducting material.

6. The qubit of claim 1, wherein the multi-terminal Josephson junction includes at least one two-dimensional electron gas structure.

7. The qubit of claim 6, wherein a two-dimensional electron gas structure in the at least one two-dimensional electron gas structure is an InAs layer deposited on an AlSb substrate.

8. The qubit of claim 1, wherein the superconducting loop includes a first portion of an s-wave superconducting material and a second portion of an s-wave superconducting material, and a portion of the phase shift is produced by a d-wave superconducting material, wherein said d-wave superconducting material is coupled to the first portion through a first normal metal interface and said d-wave superconducting material is coupled to the second portion through a second normal metal interface, and wherein a portion of the phase shift is determined by an angle between the first normal metal and the second normal metal interface and crystallographic directions in the d-wave superconducting material.

9. The qubit of claim 1, wherein the superconducting loop includes a first portion of an s-wave superconducting material and a second portion of an s-wave superconducting material, and wherein a portion of the phase shift is determined by a difference in (i) a crystallographic direction of a first d-wave superconducting material and (ii) a crystallographic direction of a second d-wave superconducting material across a grain boundary interface between said first d-wave superconducting material and said second d-wave superconducting material, wherein said first d-wave superconducting material is coupled through a normal metal to the first portion of said s-wave superconducting material and said second d-wave superconducting material is coupled through a second normal metal to the second portion of said s-wave superconducting material.

10. The qubit of claim 9, wherein the first d-wave superconducting material is formed on a first portion of a bi-crystal substrate and the second d-wave superconducting material is formed on a second portion of said bi-crystal substrate.

11. The qubit of claim 9, wherein the s-wave superconducting material is chosen from the group consisting of aluminum, niobium, lead, mercury, and tin.

12. The qubit of claim 9, wherein the d-wave superconducting material is $YBa_2Cu_3O_{7-x}$.

13. The qubit of claim 9, wherein the qubit is formed on a substrate that is made of a material selected from the group consisting of strontium titanate, sapphire, cerium oxide, and magnesium oxide.

14. The qubit of claim 1, wherein the phase shifter is a ferromagnetic junction.

15. The qubit of claim 14, wherein the superconducting loop includes a first portion and a second portion, the first portion and the second portion being coupled by the ferromagnetic junction.

16. The qubit of claim 15, wherein the first portion and the second portion are each made of an s-wave superconducting material.

17. The qubit of claim 16, wherein the s-wave superconducting material is chosen from the group consisting of aluminum, niobium, lead, mercury, and tin.

18. The qubit of claim 16, wherein the ferromagnetic junction is formed by copper or nickel sandwiched between the first portion and the second portion.

19. The qubit of claim 16, wherein the ferromagnetic junction is formed by implanting a ferromagnetic material into the s-wave superconducting material between the first portion and the second portion.

20. The qubit of claim 1, wherein the superconducting loop is formed from a d-wave superconducting material having at least one grain boundary and wherein a portion of the phase shift is formed by said at least one grain boundary.

21. The qubit of claim 1, wherein the at least two terminals includes four terminals and the multi-terminal Josephson junction includes a four-terminal constriction junction which couples each of the four terminals.

22. The qubit of claim 1, wherein the at least two terminals includes four terminals and the multi-terminal Josephson junction includes a constriction junction coupling two of the four terminals, a first tunneling junction coupling a third of the four terminals to one of the two terminals coupled by the constriction junction, and a second tunneling junction coupling a fourth of the four terminals to one of the two terminals coupled by the constriction junction.

23. The qubit of claim 22 wherein each of the first tunneling junction and the second tunneling junction is arranged substantially parallel with one of the two terminals coupled together by the constriction junction.

24. The qubit of claim 1, wherein the at least two terminals includes four terminals and the multi-terminal Josephson junction includes a tunneling junction coupling a first of the four terminals with a second of the four terminals, a first constriction junction coupling the second of the four terminals with a third of the four terminals, and a second constriction junction coupling the third of the four terminals with a fourth of the four terminals.

25. The qubit of claim 24 wherein the tunneling junction is substantially parallel with the second of the four terminals.

26. The qubit of claim 1, wherein the at least two terminals includes four terminals coupled by a two-dimensional electron gas structure.

27. The qubit of claim 1, wherein the at least two terminals includes four terminals, three of which are coupled by a two-dimensional electron gas structure and the fourth of which is coupled to one of the three with a constriction junction.

28. The qubit of claim 1, wherein the at least two terminals includes four terminals, three of which are coupled by a two-dimensional electron gas structure and the fourth of which is coupled to one of the three with a tunneling junction.

29. The qubit of claim 1, wherein the multi-terminal Josephson junction includes a constriction junction coupling each of the at least two terminals.

30. The qubit of claim 1, wherein the multi-terminal Josephson junction includes a constriction junction coupling a first terminal with a second terminal and at least one tunneling junction coupling at least one other terminal to the first terminal and the second terminal.

31. The qubit of claim 1, wherein the multi-terminal Josephson junction includes an electron gas structure coupling each of the at least two terminals.

32. The qubit of claim 1, wherein the multi-terminal Josephson junction is a three-terminal junction.

33. The qubit of claim 1, wherein the multi-terminal Josephson junction is a four-terminal junction.

34. The qubit of claim 1, wherein the multi-terminal Josephson junction is a five-terminal junction.

35. The qubit of claim 1, wherein the multi-terminal Josephson junction is a six-terminal junction.

36. The qubit of claim 1, wherein the multi-terminal Josephson junction includes more than six terminals.

37. The qubit of claim 1, wherein the multi-terminal Josephson junction is configured to symmetrically transport current.

38. The qubit of claim 1, wherein the multi-terminal Josephson junction is configured to asymmetrically transport current.

39. A qubit, comprising:
  means for coupling a plurality of terminals;
  means for forming a superconducting loop between two of the plurality of terminals;
  means for providing a phase shift in the superconducting loop, wherein a portion of the phase shift is provided by a phase shifter that interrupts said superconducting loop at a point in said superconducting loop other than the coupling of said two of the plurality of terminals.

40. The qubit of claim 39, wherein the means for coupling the plurality of terminals includes a two-dimensional electron gas junction.

41. The qubit of claim 39, wherein the means for coupling the plurality of terminals includes a tunnel junction.

42. The qubit of claim 39, wherein the means for coupling the plurality of terminals includes a constriction junction.

43. The qubit of claim 39, wherein the means for providing the phase shift includes providing a d-wave superconductor material coupled into the superconducting loop.

44. The qubit of claim 39, wherein the means for providing the phase shift includes a grain boundary between two lattice-mismatched d-wave superconducting materials.

45. The qubit of claim 39, wherein the means for providing the phase shift includes a ferromagnetic junction.

46. A qubit array, comprising: a plurality of qubits, at least one qubit in the plurality of qubits comprising:
  a multi-terminal Josephson junction comprising at least two terminals;
  a superconducting loop coupled between two of the at least two terminals, the superconducting loop providing a phase shift and wherein a portion of the phase shift is provided by a phase shifter that interrupts said superconducting loop at a point outside of said multi-terminal Josephson junction.

47. The qubit array of claim 46, wherein the multi-terminal Josephson junction includes at least one constriction junction.

48. The qubit array of claim 46, wherein the multi-terminal Josephson junction includes at least one tunnel junction.

49. The qubit array of claim 48, wherein the tunnel junction is formed by an insulating layer separating two of the at least two terminals.

50. The qubit array of claim 49, wherein the two of the at least four terminals are made of an s-wave superconducting material.

51. The qubit array of claim 46, wherein the multi-terminal Josephson junction includes at least one two-dimensional electron gas structure.

52. The qubit array of claim 51, wherein the at least one two-dimensional electron gas structure is an InAs layer deposited on an AlSb substrate.

53. The qubit array of claim 46, wherein the superconducting loop includes a first portion of an s-wave superconducting material and a second portion of an s-wave superconducting material and wherein a portion of the phase shift is produced by a d-wave superconducting material coupled to the first portion and the second portion through normal metal interfaces, the portion of the phase shift being determined by the angle between the normal metal interface and a crystallographic direction in the d-wave superconducting material.

54. The qubit array of claim 46, wherein the superconducting loop includes a first portion of a s-wave superconducting material and a second portion of a s-wave superconducting material and wherein a portion of the phase shift is produced by a first d-wave superconducting material coupled through a normal metal to the first portion and a second d-wave superconducting material coupled through a second normal metal to the second portion, the portion of the phase shift being determined by the difference in crystallographic directions in a grain boundary interface between the first d-wave superconducting material and the second d-wave superconducting material.

55. The qubit array of claim 54, wherein the first d-wave superconducting material and the second d-wave superconducting material are formed on respective insulating crystals.

56. The qubit array of claim 54, wherein the s-wave superconducting material is chosen from the group consisting of aluminum, niobium, lead, mercury, and tin.

57. The qubit array of claim 54, wherein the d-wave superconducting material is $YBa_2Cu_3O_{7-x}$.

58. The qubit array of claim 55, wherein the insulating crystals are chosen from the group consisting of strontium titanate, sapphire, cerium oxide, and magnesium oxide.

59. The qubit array of claim 46, wherein the phase shifter in the superconducting loop of said at least one of the plurality of qubits is a ferromagnetic junction.

60. The qubit array of claim 59, wherein the superconducting loop includes a first portion and a second portion, the first portion and the second portion being coupled by the ferromagnetic junction.

61. The qubit array of claim 60, wherein the first portion and the second portion are each made of an s-wave superconducting material.

62. The qubit array of claim 61, wherein the s-wave superconducting material is chosen from the group consisting of aluminum, niobium, lead, mercury, and tin.

63. The qubit array of claim 61, wherein the ferromagnetic junction is formed by copper or nickel sandwiched between the first portion and the second portion.

64. The qubit array of claim 61, wherein the ferromagnetic junction is provided by implanting a ferromagnetic material into the s-wave superconducting material between the first portion and the second portion.

65. The qubit array of claim 46, wherein the superconducting loop is formed from a d-wave superconducting material and wherein a portion of the phase shift is formed by grain boundaries in the d-wave superconducting material of the superconducting loop.

66. The qubit array of claim 46, wherein the multi-terminal Josephson junction couples at least four terminals, two of the at least four terminals being coupled to the superconducting loop, at least one of the remaining two terminals being coupled to a multi-terminal Josephson junction of another of the plurality of qubits to form a series connection.

67. The qubit array of claim 46, wherein the multi-terminal Josephson junction of said at least qubit in said plurality of qubits couples at least six terminals and wherein a first superconducting loop is coupled to a first pair of the six terminals and a second superconducting loop is coupled to a second pair of the six terminals.

68. The qubit array of claim 67, wherein a third pair of the six terminals is coupled to a current source.

69. The qubit array of claim 67, wherein the second superconducting loop is further coupled to a first pair of terminals from a a multi-terminal junction of a different qubit in said plurality of qubits.

70. The qubit array of claim 67, wherein at least one of the six terminals is coupled to a coupling junction, the coupling junction being coupled to a junction which is coupled to at least one superconducting loop.

71. The qubit array of claim 46, wherein at least two of the plurality of qubits share a shared multi-terminal junction.

72. The qubit array of claim 71, wherein the shared multi-terminal Josephson junction is a six-terminal junction.

73. The qubit array of claim 46, wherein at least two of the plurality of qubits include a superconducting loop and at least two of the superconducting loops are switchably coupled with an entanglement junction.

74. The qubit array of claim 73, wherein the entanglement junction includes a plate which can capacitively couple a voltage to a coupling junction joining the at least two superconducting loops.

75. The qubit array of claim 74, wherein the plate is a structure that allows capacitive coupling of a voltage to the coupling junction.

76. The qubit array of claim 74, wherein the voltage determines whether the coupling junction is open or closed.

77. The qubit array of claim 76, wherein the coupling junction is a two dimensional electron gas.

78. The qubit array of claim 77, wherein the entanglement junction further controls the coupling of at least one of the at least two superconducting loops with the multi-terminal Josephson junction.

79. The qubit array of claim 77, wherein the coupling junction includes a tunnel junction.

80. An array of qubits, comprising:
a plurality of qubits, each qubit of the plurality of qubits including:
a multi-terminal Josephson junction comprising at least two terminals;
a superconducting loop coupled between two of the at least two terminals, the superconducting loop providing a phase shift and wherein a portion of the phase shift is provided by a phase shifter that interrupts said superconducting loop at a point outside of said multi-terminal Josephson junction; and
an entanglement junction that couples a superconducting loop of a first qubit in said plurality of qubits to a superconducting loop of a second qubit in said plurality of qubits.

81. The array of qubits of claim 80, wherein the multi-terminal Josephson junction of at least one of the qubits in the plurality of qubits includes at least one constriction junction.

82. The array of qubits of claim 80, wherein the multi-terminal Josephson junction of at least one of the qubits in the plurality of qubits includes at least one tunnel junction.

83. The array of qubits of claim 80, wherein the multi-terminal Josephson junction of at least one of the qubits in the plurality of qubits includes at least one two-dimensional electron gas structure.

84. The array of qubits of claim 80, wherein
the superconducting loop of at least one of the qubits in the plurality of qubits includes a first portion of an s-wave superconducting material and a second portion of an s-wave superconducting material and wherein a portion of a phase shift is produced by a d-wave superconducting material coupled to the first portion and the second portion through normal metal interfaces, the portion of the phase shift being determined by the angle between the normal metal interface and a crystallographic directions in the d-wave superconducting material.

85. The array of qubits of claim 80, wherein the superconducting loop of at least one of the qubits in the plurality of qubits includes a first portion of an s-wave superconducting material and a second portion of an s-wave superconducting material and wherein a portion of a phase shift is produced by a first d-wave superconducting material coupled through a normal metal to the first portion and a second d-wave superconducting material coupled through a second normal metal to the second portion, the portion of the phase shift being determined by the difference in crystallographic directions in a grain boundary interface between the first d-wave superconducting material and the second d-wave superconducting material.

86. The array of qubits of claim 80, wherein a portion of the phase shift in a qubit in the plurality of qubits is produced by a ferromagnetic junction.

87. The array of qubits of claim 80, wherein the superconducting loop of at least one of the qubits in the plurality of qubits is formed from a d-wave superconducting material and wherein a portion of the phase shift is formed by grain boundaries in the d-wave superconducting material of the superconducting loop.

88. The array of qubits of claim 80, wherein the entanglement junction comprises:
a multi-terminal Josephson junction coupled between the superconducting loop of said first qubit and the superconducting loop of said second qubit; and a plate proximate the multi-terminal Josephson junction.

89. The array of qubits of claim 88, wherein the plate is a structure that allows a voltage to be capacitively coupled to the multi-terminal Josephson junction coupled between the superconducting loop of said first qubit and the superconducting loop of said second qubit.

90. The array of qubits of claim 88, wherein the multi-terminal Josephson junction of the entanglement junction includes a two-dimensional electron gas.

91. The array of qubits of claim 88, wherein the multi-terminal Josephson junction of the entanglement junction is separated from, and not part of, the superconducting loop of said first qubit and the superconducting loop of said second qubit.

92. The array of qubits of claim 91, wherein quantum states on the first qubit and second qubit are entangled or not entangled in response to voltages applied to the plate of the entanglement junction.

93. The array of qubits of claim 92, wherein the quantum states are entangled when no voltage is applied to the plate and not entangled when a voltage is applied to the plate.

* * * * *